United States Patent [19]

Uekita et al.

[11] Patent Number: 4,839,219
[45] Date of Patent: Jun. 13, 1989

[54] THIN FILM AND DEVICE HAVING THE SAME

[75] Inventors: Masakazu Uekita; Hiroshi Awaji, both of Kobe, Japan

[73] Assignee: Kanegafuchi Kagaku Kogyo Kabushiki Kaisha, Osaka, Japan

[21] Appl. No.: 51,350

[22] Filed: May 19, 1987

[30] Foreign Application Priority Data

May 20, 1986 [JP] Japan ................ 61-116390
May 20, 1986 [JP] Japan ................ 61-116391

[51] Int. Cl.$^4$ .................. B32B 27/00; B32B 27/34
[52] U.S. Cl. ................. 428/220; 428/411.1;
428/473.5; 528/183; 528/186; 528/188;
528/331; 528/342; 528/348; 528/350; 528/353
[58] Field of Search .......... 428/473.5, 411.1, 220;
528/183, 186, 188, 350, 353, 331, 342, 348

[56] References Cited

FOREIGN PATENT DOCUMENTS 54-145794 11/1979 Japan .
55-30207 8/1980 Japan .

OTHER PUBLICATIONS

Chemical Abstracts, vol. 100, No. 10, 5th Mar. 1984, p. 10, abstract No. 68897m, Columbus, Ohio, U.S.; A. I. Volozhin et al.
Chemical Abstracts, vol. 102, No. 26, 1st Jul. 1985, p. 6, abstract No. 221283w, Columbus, Ohio, U.S.; L. Minnema et al.
Alan K. Engel, Tomoko Yoden, Kohei Sanui, and Naoya Ogata, J. Am. Chem. Soc., (1985), 107, 8308-8310.
M. Suzuki, M. Kakimoto, T. Konishi, Y. Imai, M. Iwamoto and T. Hino, Chemistry Letters, (1986), 395-398.
M. Kakimoto, M. Suzuki, T. Konishi, Y. Imai, M. Iwamoto and T. Hino, Chemistry Letters, (1986), 823-826.
Alan K. Engel, Tomoko Yoden, Kohei Sanui and Naoya Ogata, Polymeric Materials Science and Engineering, 54, (1986), 119-123.
P. S. Vincett and G. G. Roberts, Thin Solid Films, 68, (1980), 135-171.

*Primary Examiner*—Thomas J. Herbert
*Attorney, Agent, or Firm*—Armstrong, Nikaido, Marmelstein & Kubovcik

[57] ABSTRACT

A thin film comprising a polymer having linear recurring units wherein an organic group $R^1$ is combined alternately with an organic group $R^2$ through a bivalent bonding group, wherein each of said group $R^1$ and said group $R^2$ has a valence of at least 2 and has at least 2 carbon atoms; each of said linear recurring units having at least one hydrocarbon-containing group $R^3$ having 10 to 30 carbon atoms bonded with covalent bond, and a device having the thin film. The thin film of the invention is formed by building-up layers of the above polymer by LB technique, and the obtained film can be subjected to ring closure and to elimination of a known LB compound added as occasion demand by heat treatment to provide a thin film having a thickness of not more than 10,000 Å and excellent heat resistance, chemical resistance and mechanical properties, and the device having the thin film is useful particularly as electric and electronic devices.

64 Claims, 29 Drawing Sheets

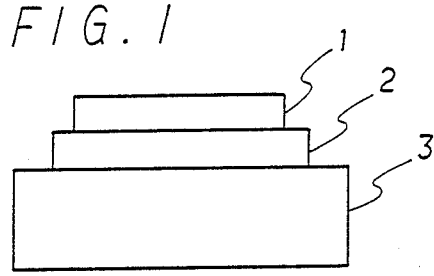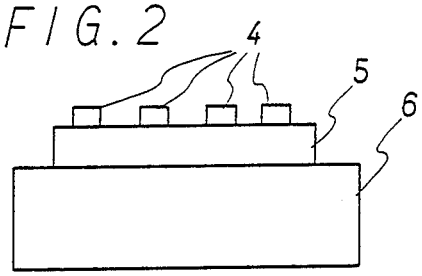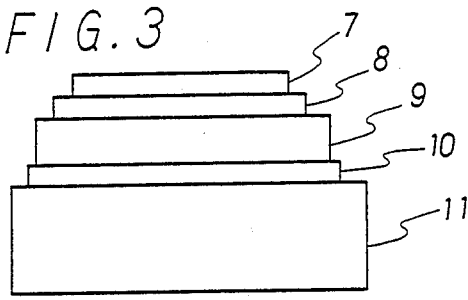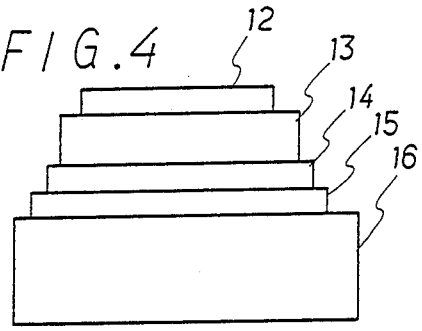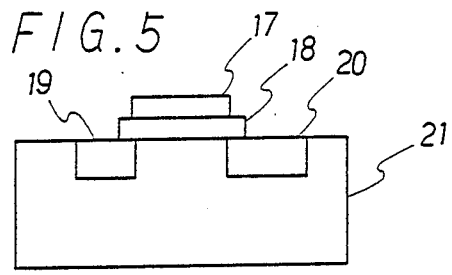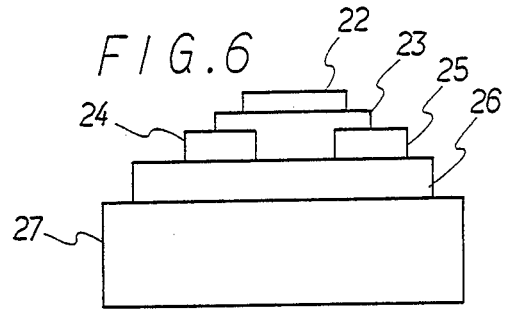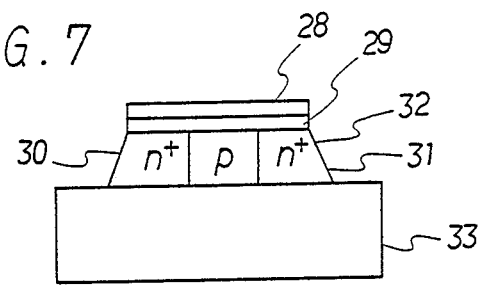

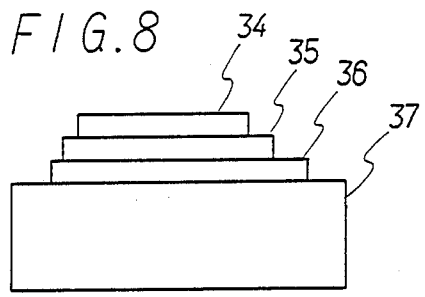
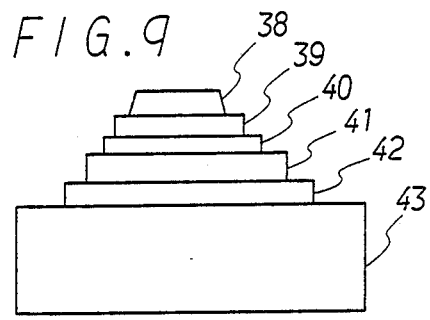
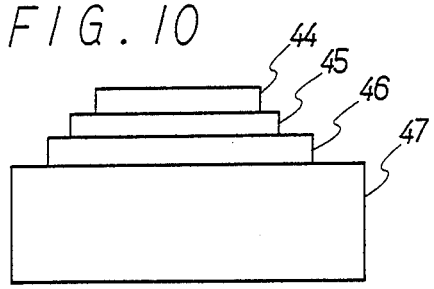
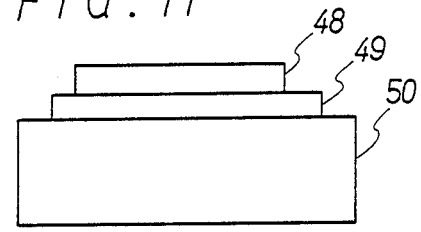
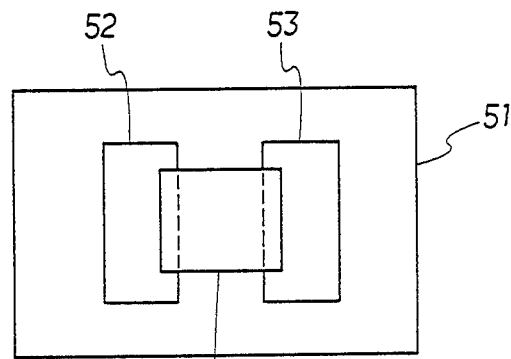
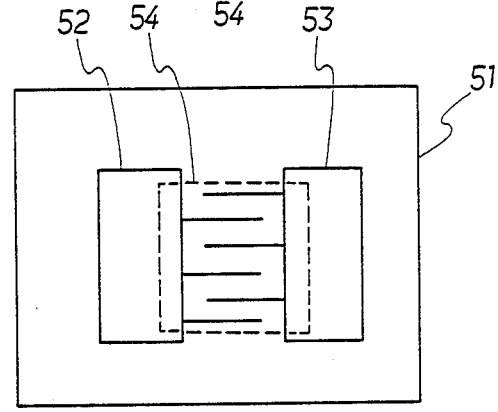

F I G. 25
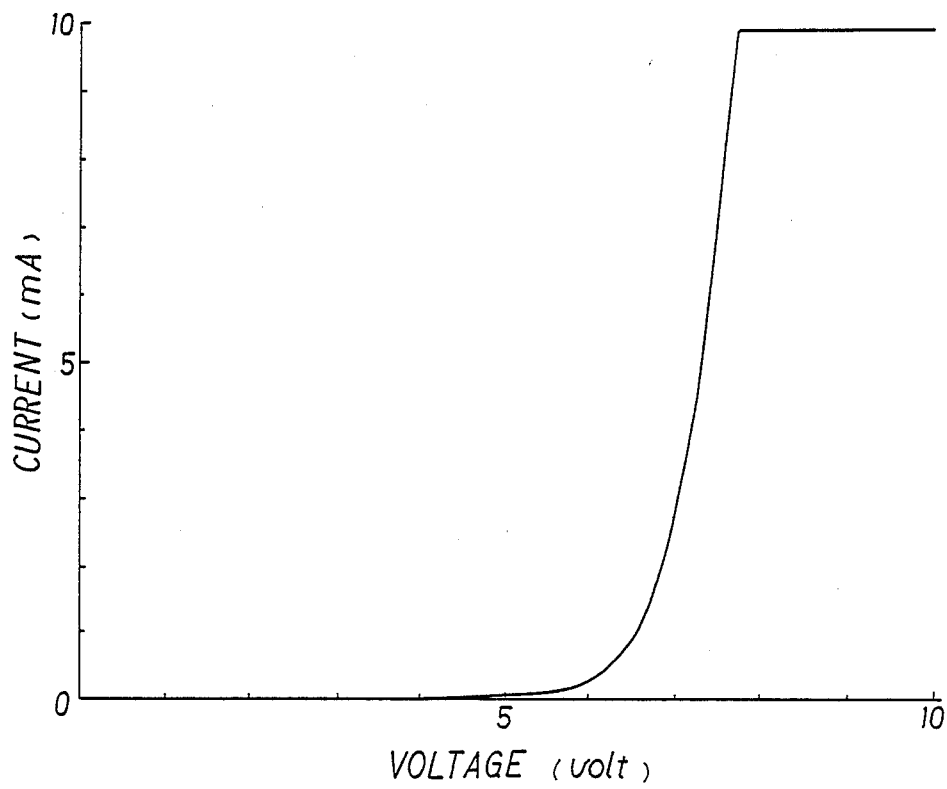

55  56

57

THIN FILM AND DEVICE HAVING THE SAME

BACKGROUND OF THE INVENTION

The present invention relates to a thin film of a polymer and a device having the thin film, and more particularly to a thin film formed from a modified polymer by the Langmuir-Blodgett technique and a device having the thin film.

In the 1930s, it was found by Langmuir and Blodgett that a fatty acid having 16 to 22 carbon atoms could form a monolayer (monomolecular film) on the surface of water and the monolayers could be built up on a substance to form a multilayer film. In recent years, various studies have been made on the applications of the built-up films, namely Langmuir-Blodgett films (hereinafter referred to as "LB film"). Various studies made already are disclosed in, for instance, Kotaibutsuri 17, No. 12, 45(1982), Thin Solid Films, 68, No. 1 (1980), Thin Solid Films, 99, No. 1.2.3 (1983), Insoluble monolayers at liquid-gas interfaces (G. L. Gains, Interscience Publishers, New York, 1966), and the like.

The LB films of the straight-chain saturated fatty acids are poor in heat resistance and mechanical strength and are not suitable for practical uses. In order to address the above problem, there are proposed, for instance, polymerizing films formed from unsaturated fatty acids such as ω-tricosenoic acid, ω-heptadecenoic acid and α-octadecylacrylic acid, unsaturated fatty acid esters such as vinyl stearate and octadecyl acrylate, or diacetylene derivatives. However, these films are insufficient in heat resistance, electric property and other properties. It is also known that some hydrophilic group-containing polymers, such as polyacrylic acids, polyvinyl alcohols, polyethyl acrylates and polypeptides, also have film-forming properties. However, none of them are suited as a material for LB films, and no investigations have been made on modification of polymers to be used, in particular, as a material for LB films. Also, composite articles having the above-mentioned film are poor in heat resistance and mechanical strength, and are not suitable for practical use.

On the other hand, it is well known that films of polyimide have excellent heat resistance. The thickness of the films prepared, for instance, by spin coating is at least 1,000 Å, usually 1 μm or more. It is very difficult to form a heat resistance polyimide film with a thickness of less than 1,000 Å and with no pin-hole, and it is impossible to prepare devices having such thin polyimide films.

It is an object of the present invention to provide a polymer thin film having improved heat resistance, chemical resistance and mechanical properties such as adhesion, and having a thickness hardly attainable by conventional process.

A further object of the present invention is to provide a device having the above polymer thin film.

These and other objects of the present invention will become apparent from the description hereafter.

SUMMARY OF THE INVENTION

It has now been found that when substituent groups for imparting the hydrophobic property to a polymer are introduced into recurring units of a polymer to modify the polymer so as to be able to form a film by the LB technique, ultrathin films can be produced from the so modified polymer or if desired, a mixture of the modified polymer and a known LB film compound.

In accordance with the present invention, there is provided a thin film comprising a polymer having linear recurring units wherein an organic group $R^1$ is combined alternately with an organic group $R^2$ through a bivalent bonding group, wherein each of said group $R^1$ and said group $R^2$ has a valence of at least 2 and has at least 2 carbon atoms; each of said linear recurring units having at least one hydrocarbon-containing group $R^3$ having 10 to 30 carbon atoms bonded with colvanet bond; and a device having the same.

Also, in accordance with the present invention, there is provided a thin film comprising a polymer having a structure of a 5-membered or a 6-membered hetero ring; and a device having the above thin film.

BRIEF DESCRIPTION OF THE DRAWINGS

FIGS. 1 to 7 are schematic illustrations of typical devices having metal/insulation film/semiconductor (MIS) structure;

FIGS. 8 to 10 are schematic illustrations of typical devices having metal/insulation film/metal (MIM) structure;

FIGS. 11 to 13 are schematic illustrations of typical devices having insulation film/metal (IM) structure;

FIGS. 24 and 25 are graphs showing the electric current-voltage characteristic of the device having the polyimide thin film of the present invention, obtained in Example 9 described after;

DETAILED DESCRIPTION

Figure 14:
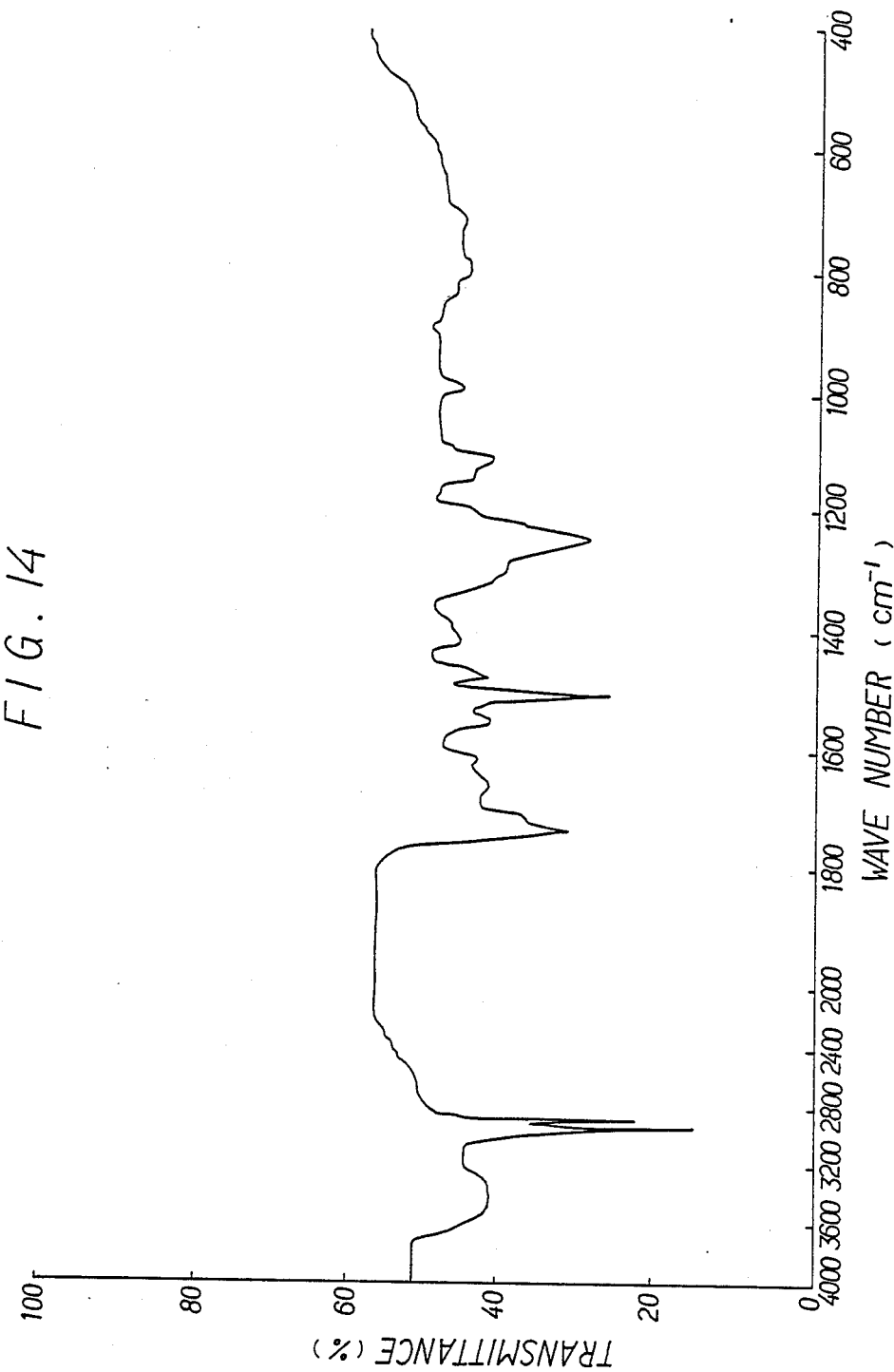
FIG. 14 is an infrared absorption spectrum of the polymer of the present invention obtained in Example 1 described after.

In the present invention, one of materials for forming the LB film is the polymer having the linear recurring unit wherein the organic group $R^1$ is bonded alternately with the organic group $R^2$ through the bivalent bonding group, wherein each of the group $R^1$ and the group $R^2$ has a valence of at least 2 and has at least 2 carbon atoms; each of the linear recurring units having at least one hydrocarbon-containing group $R^3$ having 10 to 30 carbon atoms, which may have a substituent group, with covalent bond.

The polymer used in the invention has the linear recurring units of the formula (1) (2) or (3) as the basic skeleton of the polymer.

 (1)

 (2)

 (3)

In the formulas (1) to (3), $R^1$ is the organic group having the valence of at least 2 and having at least 2 carbon atoms, and $R^2$ is the organic group having the valence of at least 2 and having at least 2 carbon atoms. It is preferable that at least one $R^1$ and $R^2$ is a group characterized by benzenoid unsaturation having at least 6 carbon atoms. Each of AB and BA in the above formulas is a bivalent group produced by reacting an acid group A having a hetero atom such as O, N, S, P or B with a basic atom B having a hetero group such as O, N, S, P or B, and more particularly, is a group produced by reacting the acid group A such as —COOR wherein R is an alkyl group or hydrogen atom, hereinafter the same, —COX wherein X is Cl or Br, hereinafter the same, —NCO, —NCS, —CN or —CONHR with the basic group B such as —NHR, —OR, —SR or —X. Examples of the group AB are, for instance,

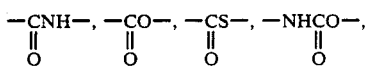

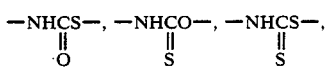

and the like. Examples of the group BA are, for instance,

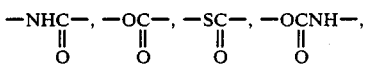

and the like. The groups AB and BA are not limited thereto.

The polymer used in the present invention is a polymer in which at least one, preferably two hydrocarbon-containing group $R^3$ is combined with the linear recurring units of the formula (1), (2) or (3) as the backbone of the polymer with covalent bond, the group $R^3$ having optionally a substituent group and having 10 to 30 carbon atoms, preferably 16 to 22 carbon atoms, and the so modified polymer can be formed into a film by the LB technique.

There are three methods for introducing the group $R^3$ into the linear recurring units.

[I] A method in which the group $R^3$ is substituted for the atom of the group AB or BA in the linear recurring unit of the formula (1), (2) or (3)

[II] A method in which the group $R^3$ is substituted for the atom of the group $R^1$ or $R^2$ in the recurring units

[III] A method in which the group $R^3$ is substituted for the atom of the substituent group in the group $R^1$ and/or $R^2$, the substituent group being not used for forming the linear recurring units.

The three methods [I] to [III] may be carried out alone or in admixture thereof. When each of the recurring units has more than 2 groups $R^3$, the groups $R^3$ may be same or different.

According to the method [I], the group $R^3$ is substituted as follows:

In case of substituting the group $R^3$ for the atom of the group AB

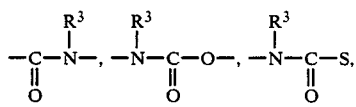

-continued

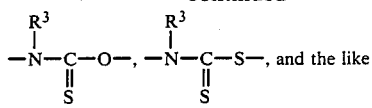

In case of substituting the group $R^3$ for the atom of the group BA

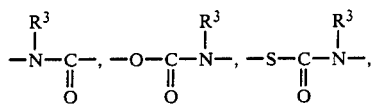

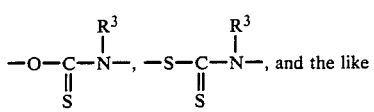

The groups AB and BA in which the group $R^3$ is substituted are not limited thereto. As shown above, according to the method [I], the group $R^3$ is substituted for hydrogen atom attached to nitrogen atom of the group AB or the group BA.

Examples of the recurring units in which the group $R^3$ is substituted according to the method [II] are for instance, recurring units having the formula:

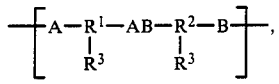

recurring units having the formula:

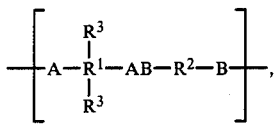

recurring unit having the formula:

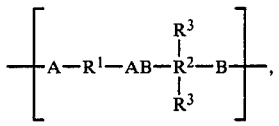

and the like. The recurring units are not limited thereto.

The above-described modification method [III] comprises much more possibilities. To be more specific, in the case of [III], at least one of the groups $R^1$ and $R^2$ must be an organic group having a valency of at least three, and one or more substitutional groups $R^3$ are introduced into group $R^1$ or $R^2$ through the substituent which is not involved for the formation of the recurring structure. As examples of combinations of $R^1$ and $R^2$ where $R^1$ has a valency equal to, or greater than, that of $R^2$, and both of them have a valency not greater than 6, mention may be made of the followings:

| Valence of the group $R^1$ | Valence of the group $R^2$ |
|---|---|
| 3 | 2 |
| 4 | 2 |
| 5 | 2 |
| 6 | 2 |
| 3 | 3 |
| 4 | 3 |
| 5 | 3 |
| 6 | 3 |
| 4 | 4 |
| 5 | 4 |
| 6 | 4 |
| 5 | 5 |
| 6 | 5 |
| 6 | 6 |

The valences of the groups $R^1$ and $R^2$ are not limited thereto, but the group $R^1$ and the group $R^2$ having the valence of up to 4 are preferred.

When the group $R^1$ is a trivalent group and the group $R^2$ is a bivalent group, the recurring units before substituting the group $R^3$ are represented by the following formulas (4) to (9):

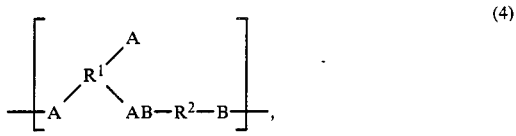 (4)

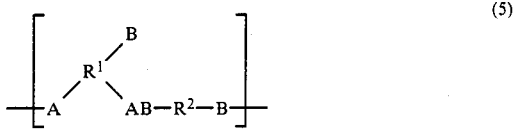 (5)

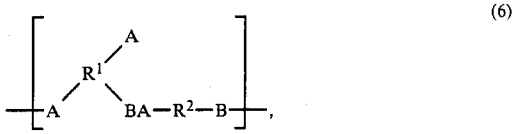 (6)

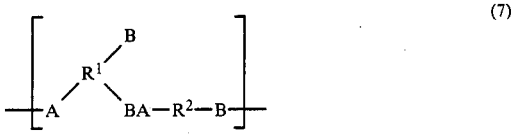 (7)

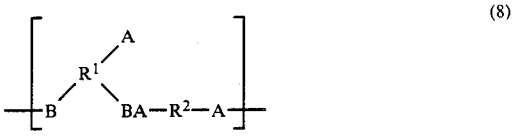 (8)

and

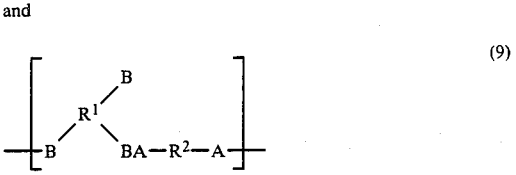 (9)

When the group $R^1$ is a tetravalent group and the group $R^2$ is a bivalent group, the recurring units before substituting the group $R^3$ are represented by the following formulas (10) to (18):

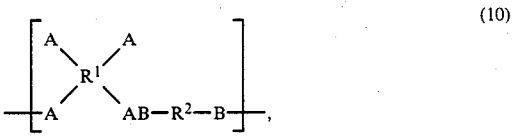 (10)

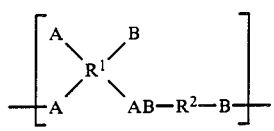
(11)
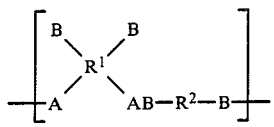
(12)
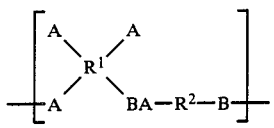
(13)
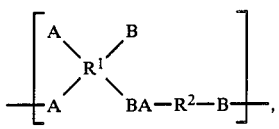
(14)
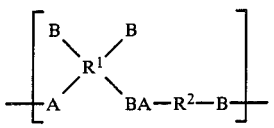
(15)
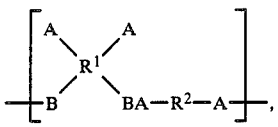
(16)
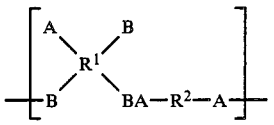
(17)
and
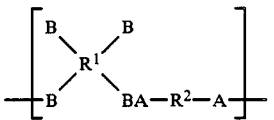
(18)
When both the group $R^1$ and the group $R^2$ are trivalent groups, the recurring units before substituting the group $R^3$ are represented by the following formulas (19) to (30):
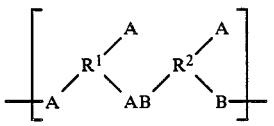
(19)
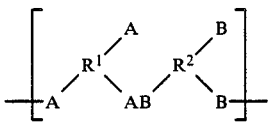
(20)
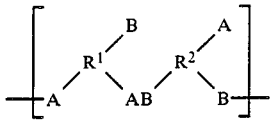
(21)
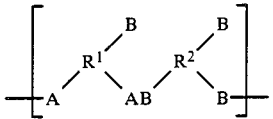
(22)
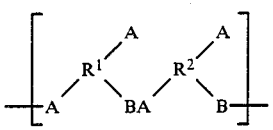
(23)
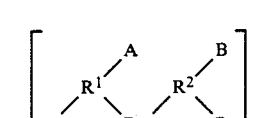
(24)
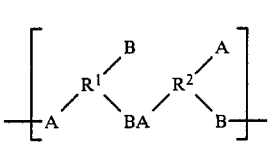
(25)
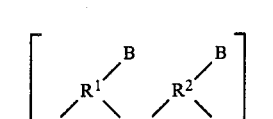
(26)
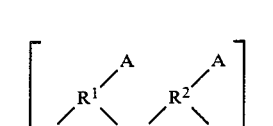
(27)
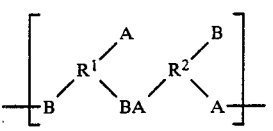
(28)
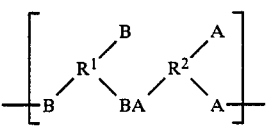
(29)
and
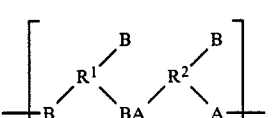
(30)
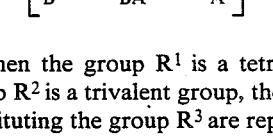
When the group $R^1$ is a tetravalent group and the group $R^2$ is a trivalent group, the recurring units before substituting the group $R^3$ are represented by the formulas (31) to (48):

(31) 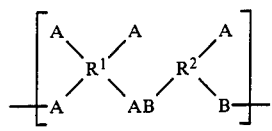
(32) 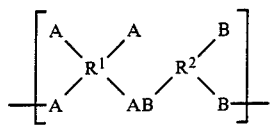
(33) 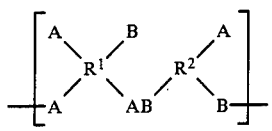
(34) 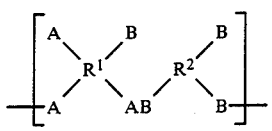
(35) 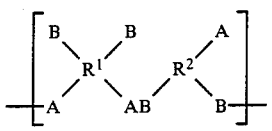
(36) 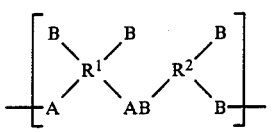
(37) 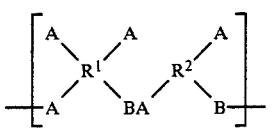
(38) 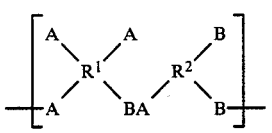
(39) 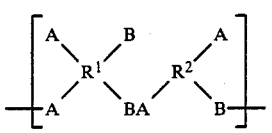
(40) 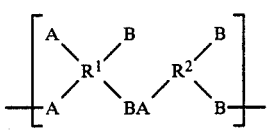
(41) 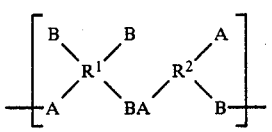
(42) 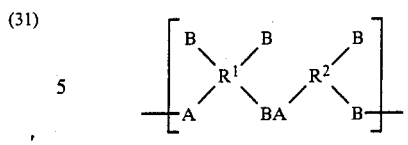
(43) 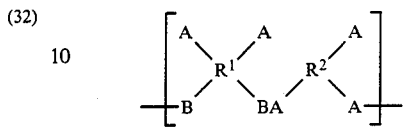
(44) 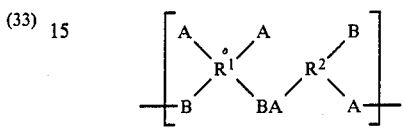
(45) 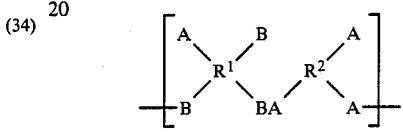
(46) 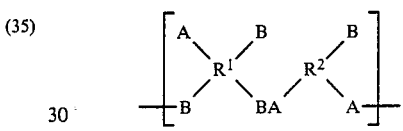
(47) 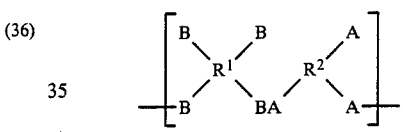
and
(48) 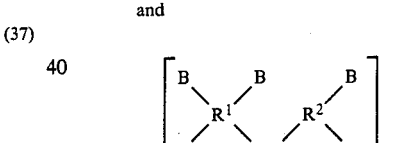
When both the group $R^1$ and the group $R^2$ are tetravalent groups, the recurring units before substituting the group $R^3$ are represented by the formulas (49) to (75):
(49) 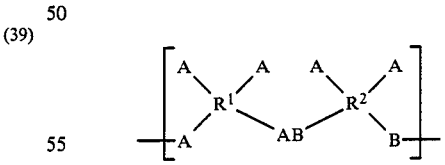
(50) 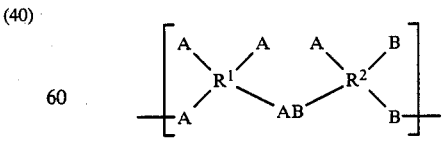
(51) 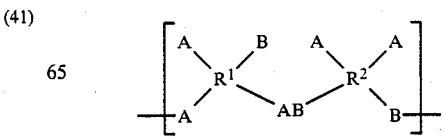

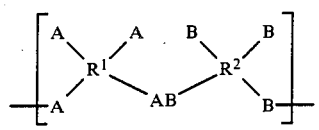 (52)
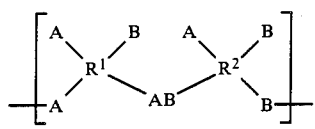 (53)
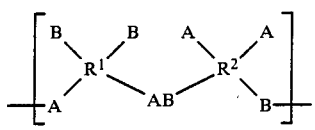 (54)
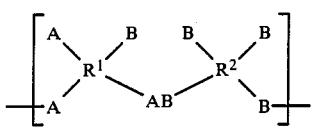 (55)
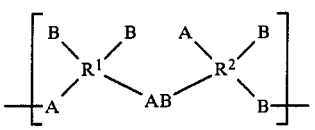 (56)
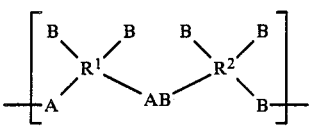 (57)
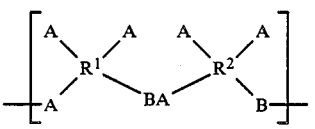 (58)
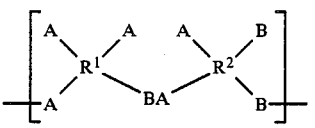 (59)
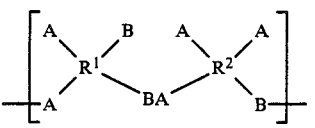 (60)
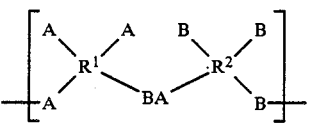 (61)
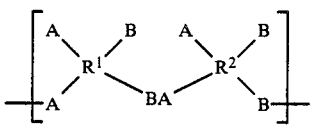 (62)
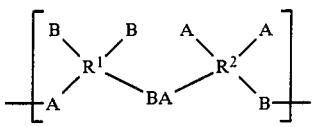 (63)
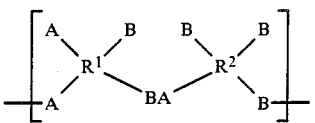 (64)
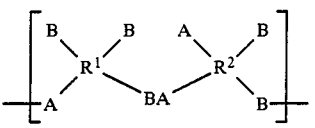 (65)
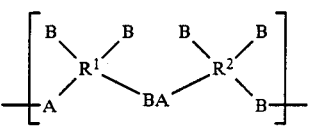 (66)
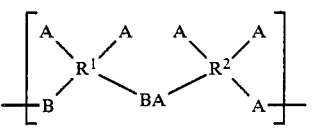 (67)
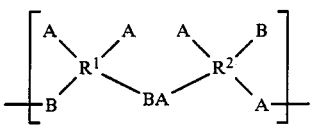 (68)
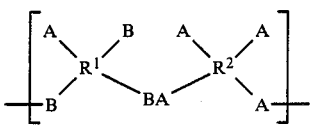 (69)
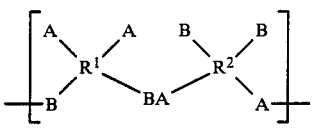 (70)
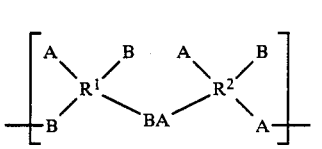 (71)
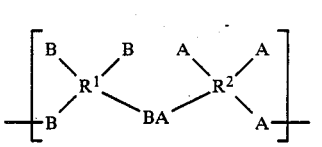 (72)
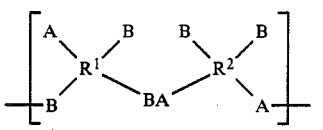 (73)

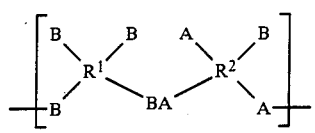
(74)

and

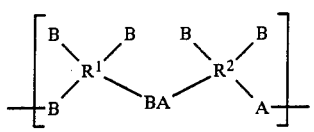
(75)

In the recurring units of the formulas (4) to (75), there are a group A and/or a group B which are not used for forming the linear recurring units. According to the method [III], the group $R^3$ is substituted for the atom of the group A and/or the group B which are not used for forming the recurring unit. For instance, in the formulas (4) to (75), when the group $R^3$ is substituted for the atom of the group A, there are exemplified, for instance, —COOR$^3$, —CONHR$^3$, —NHCOOR$^3$, —NHCSOR$^3$, and the like as the substituted group A, and when the group $R^3$ is substituted for the atom of the group B, there are exemplified, for instance, —NHR$^3$, —OR$^3$, —SR$^3$, and the like as the substituted group B.

In the recurring units, each of the group $R^1$ and the group $R^2$ is an at least bivalent group having at least two carbon atoms, preferably 5 to 20 carbon atoms. It may be an aromatic group; an alicyclic group; an aliphatic group; a group wherein an aromatic group and an aliphatic group are combined; a group wherein each of the above-mentioned groups is substituted by a monovalent group having 1 to 30 carbon atoms selected from the group, consisting of an aliphatic group, an alicyclic group, an aromatic group, and a group in which an aliphatic group is combined with an alicyclic group or an aromatic group; or a group wherein each of the preceding groups is substituted by a monovalent group such as a halogen atom, nitro group, amino group, cyano group, methoxyl group or acetoxyl group, or by a group in which the above monovalent group bonds to —O—, —COO—, —NHCO—, —CO—, —S—, —CSS—, —NHCS—, —CS—, or the like. Groups characterized by benzenoid unsaturation having at least 6 carbon atoms are preferred as $R^1$ and $R^2$ in points of heat resistance, chemical resistance and mechanical properties.

The term "benzenoid unsaturation" as used herein is a technical term used in contradistinction to the quinoid structure, as shown below, and means structures identical to those of carbon rings included in usual aromatic compounds.

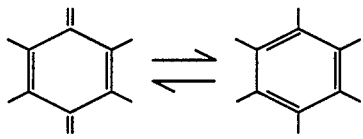

p-quinoid     benzenoid unsaturation

Representative examples of each of the group $R^1$ and the group $R^2$ are, for instance,

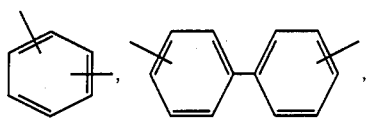

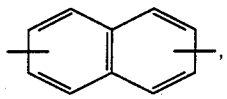

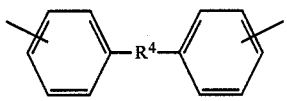

[wherein $R^4$ is $-(CH_2)_{1-3}-$, $-\underset{CH_3}{\overset{CH_3}{C}}-$, $-\underset{CF_3}{\overset{CF_3}{C}}-$, —O—,

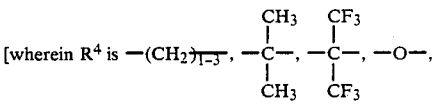

$R^5$ is an alkyl or aryl group],

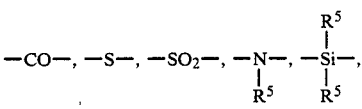

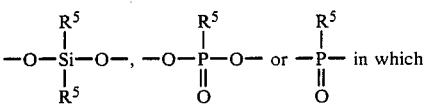

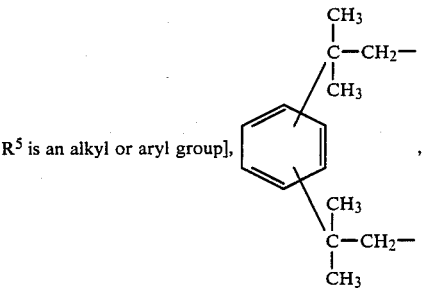

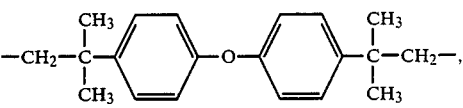

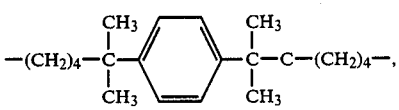

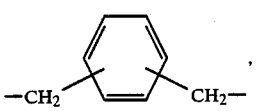

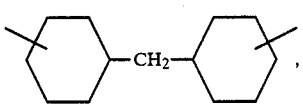

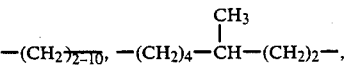

-continued
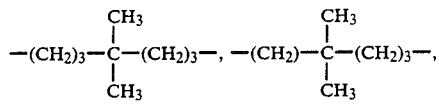
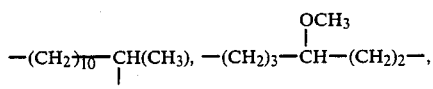
—(CH₂)₃—O—(CH₂)₂—O—(CH₂)₃—,
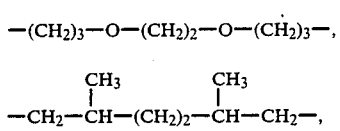
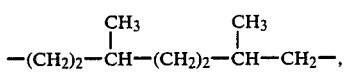
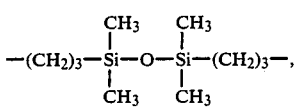
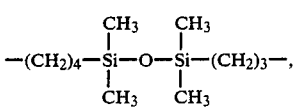
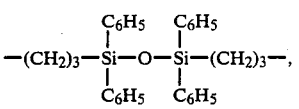
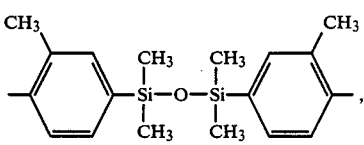
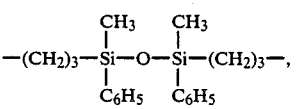
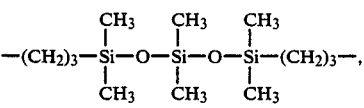
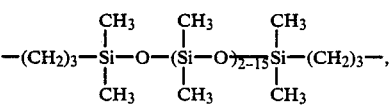
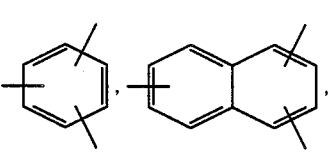
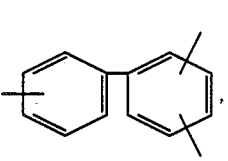
-continued
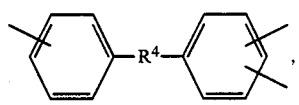
[wherein $R^4$ is as defined above]
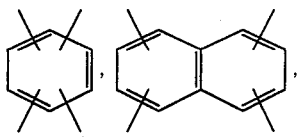
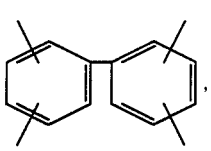
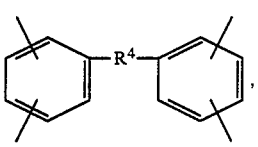
[wherein $R^4$ is as defined above]
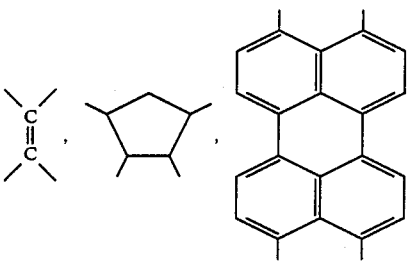
and the like.
Preferable examples of the group $R^1$ and the group $R^2$ as mentioned above are, for instance,
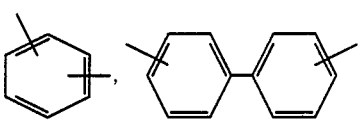
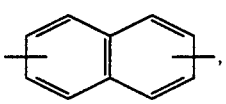
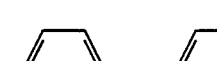
[wherein $R^4$ is as defined above]
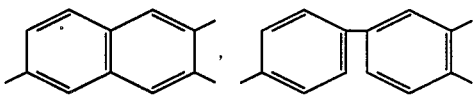

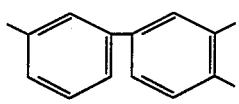

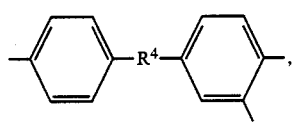

[wherein R⁴ is as defined above]

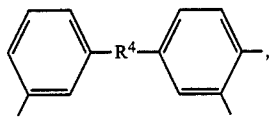

[wherein R⁴ is as defined above]

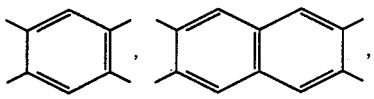

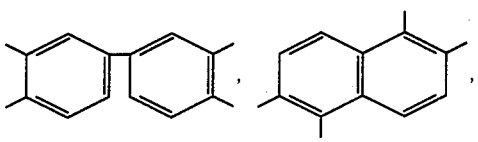

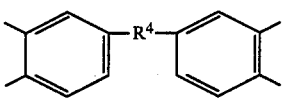

[wherein R⁴ is as defined above]

In the recurring units, the group R³ is a hydrocarbon-containing group having 10 to 30 carbon atoms, preferably from 16 to 22 carbon atoms. There are preferred a monovalent aliphatic group, a monovalent group wherein an alicyclic group is combined with an aliphatic group, a monovalent group wherein an aromatic group is combined with an aliphatic group, or their substituted groups. Preferable examples of the group R³ are, for instance,

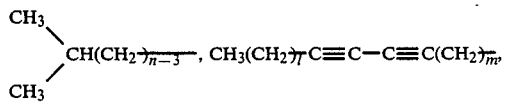

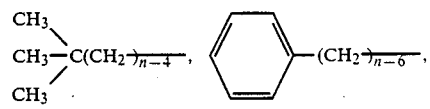

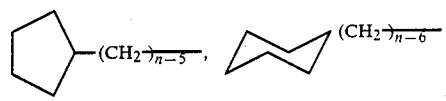

wherein n is an integer of 10 to 30, preferably from 16 to 22, and $l+m=n-5$. Among them, a straight-chain aliphatic hydrocarbon group is the most preferable.

The group R³ is bonded with each of the recurring units with covalent bond, and may have a substituent. Examples of the substituents are, for instance, a halogen atom, nitro group, amino group, cyano group, methoxy group, acetoxy group, and the like. It is not essential that the above-mentioned substituent is included in the group R³, but it is preferable that fluorine atoms are included in the group R³, because fluorine atoms improve the hydrophobic property as compared with hydrogen atoms. That is to say, the alkyl group as the substituent can be shortened by including fluorine atoms in the substituent of the group R³. For instance, when the group of the formula: $C_8F_{17}(CH_2)_k$ is used as the group R³, by using the group wherein k is 2, that is the group having 10 carbon atoms, it is satisfactory possible to form a film.

Representative examples of the polymer capable of applying the method for forming the films of the invention are understood by substituting the examples of the groups R¹, R², R³, A, B, AB, BA and R³ as well as the modes of each of the substitution of R³, to formulas (1) to (75). The polymers having the recurring units (1) to (75) used in the present invention may include a homopolymer comprising a single kind of recurring units, a copolymer comprising different kinds of recurring units which is considered from the formulas (1) to (75), and a mixture thereof.

Further, the polymer used in the invention may be substituted with a hydrocarbon-containing group having 1 to 9 carbon atoms according to the method [I], [II] or [III], although it may be dispensable.

The molecular weight of the polymer used in the present invention is not particularly limited, but it is preferably that the number average molecular weight of the polymer is from about 2,000 to about 300,000 preferably about 10,000 to 150,000. When the number average molecular weight is less than 2,000, though the film can be formed according to the LB technique, there cannot be obtained the film having the excellent heat resistance, mechanical strength, and chemical resistance. On the other hand, when the molecular weight is more than 300,000, the viscosity of the polymer is too high to form a film.

Representative example of the polymer used in the invention are, for instance,

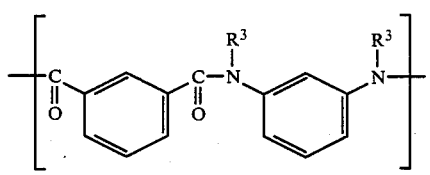

(76)

-continued
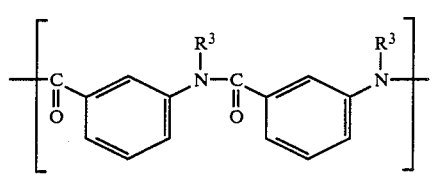
(77)
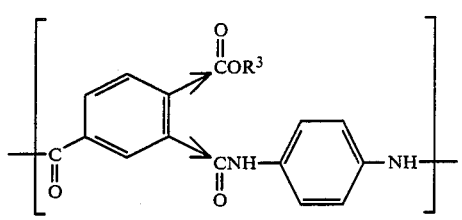
(78)
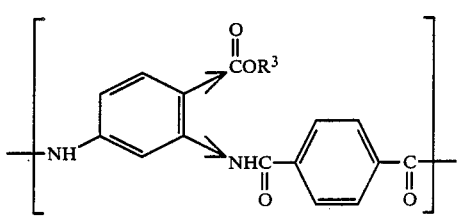
(79)
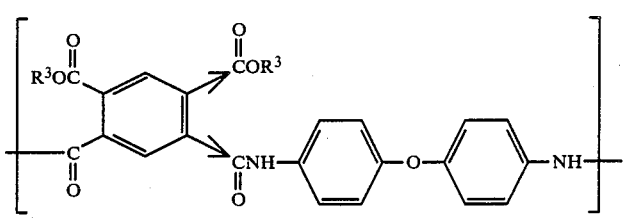
(80)
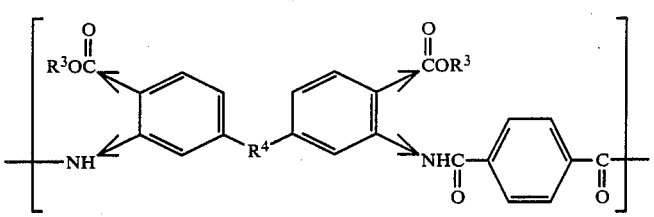
(81)
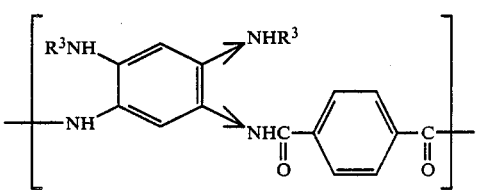
(82)
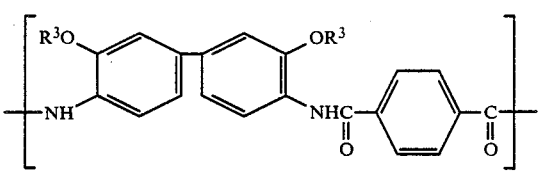
(83)

-continued
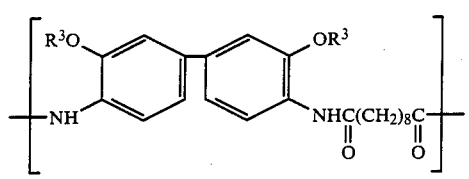
(84)
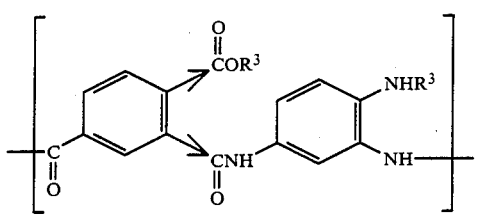
(85)
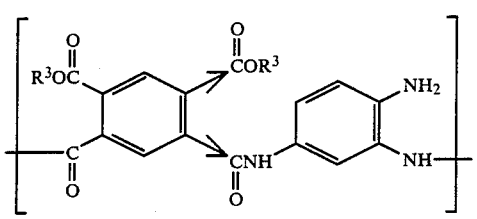
(86)
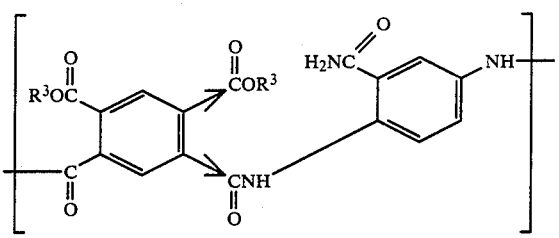
(87)
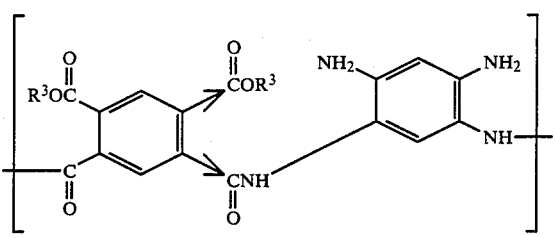
(88)
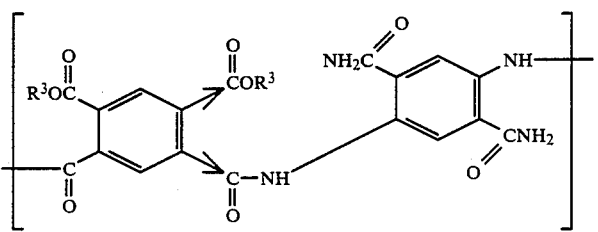
(89)
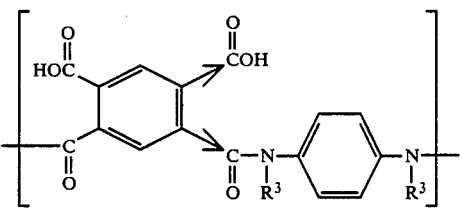
(90)

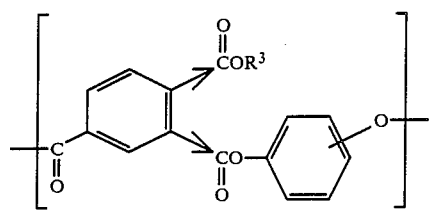
(91)
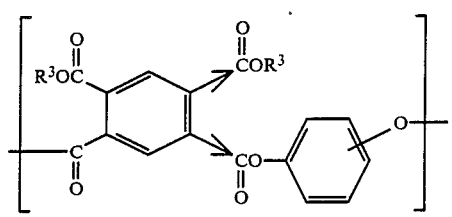
(92)
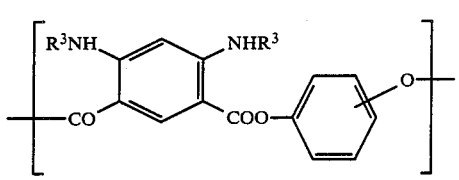
(93)
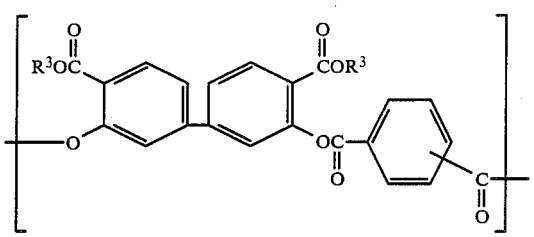
(94)
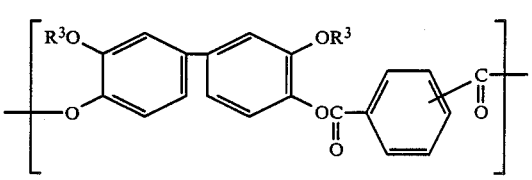
(95)
In the above formulas (86) to (95), the symbol "→" means isomerism. Explaining the isomerism with reference to the recurring unit of the formula (78):
(78)
the above formula represents both the recurring unit of the formula (78-1):
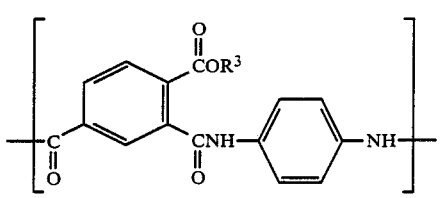
(78-1)
and the recurring unit of the formula (78-2):
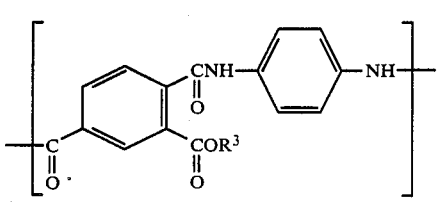
(78-2)
and in such a case, the symbol "→" indicating the isomerism is used.

In the present specification, the term "isomerism" or the symbol "→" refers to both cases, one being the case where either one of the recurring units as shown by the formulas (78-1) and (78-2) is present alone, and the other being the case where the recurring units as shown by the formulas (78-1) and (78-2) are present together.

Examples other than the above-mentioned are described in, for instance, Kobunshi no Tainetsusei (Heat resistance of Polymers) edited by Hirotaro Kanbe and published by Kabushiki Kaisha Baifukan on Mar. 5, 1970, Kobunshi no Netsubunkai to Tainetsusei (Heat decomposition and Heat resistance of Poylmers) editated by Hirotaro Kanbe and published by Kabushiki Kaisha Baifukan on Mar. 15, 1974, and the like.

In order to explain the process for preparing the modified polymer used in the present invention, the process for preparing the polymer having the recurring units of the formula (80) wherein $R^3$ is $CH_3(CH_2)_{17}$ is explained as follows:

A compound having the formula:

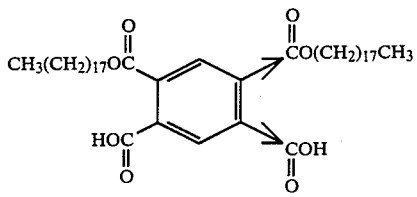

which can be obtained by alcoholysis of pyromellitic acid dianhydride, is acylated with thionyl chloride at a temperature not lower than $-10°$ C., preferably from about $0°$ to $40°$ C., in an organic polar solvent under a substantially moisture free condition, and then the resulting product is reacted with diaminodiphenyl ether at a temperature no lower than $-10°$ C., preferably from about $0°$ to $+10°$ C. to produce the desired product. The post reaction may be completed at a temperature not lower than $20°$ C. Acylation and amidation are usually carried out at a temperature lower than $0°$ C. and usually about $-10°$ C. It can, however, be preferable in this invention to carry out the acylation and the amidation at a temperature in the temperature range described above since the substituent groups, such as long chain alkyl groups, of the high polymer have a tendency to be frozen and solidified. It is a matter of course that, in the above production, starting materials having different substitutional groups can be used in combination, so as to produce a copolymer. Tetracarboxylic acid dianhydrides and diamines, which may have no substituent groups or may have substituent groups containing not more than 10 carbon atoms, can also be used in an amount up to about 30%.

The thus obtained polymer may be separated from the reaction mixture and purified to give a material for preparing films, or to the reaction mixture may be added chloroform, benzene, or the like, after completing the reaction, if necessary, to directly make a spreading solution for preparing films.

Films can be formed from the above polymer by any methods such as the solvent cast method, the spin coat method and the LB method. Among the above-mentioned methods, the LB method is preferable since the LB method can provide oriented thin films having fewer pin holes and can control the thickness of the films in several tens of angstroms.

According to the solvent cast method and the spin coat method, the modified polymer or the mixture thereof is dissolved in a solvent such as benzene, chloroform, ethyl ether, ethyl acetate, tetrahydrofuran, dimethyl formamide, or N,N-dimethylacetoamide, and the obtained solution is coated on a substrate. In the obtained films, molecules cannnot be oriented, but the films having no pin holes can be obtained if the thickness is more than about 10000 Å.

LB films of the invention can be formed from the above polymer by any of the so-called LB technique without restriction, e.g. the vertical dipping method (LB method), the horizontal dipping method, the revolving cylindrical method and so on (as described in Shin Jikken Kagaku Koza, Vol. 18, "Interface and Colloid", pages 498–508). The LB technique is a method in which a LB material is spread onto the surface of water and compressed at a constant surface pressure to form monomolecular layer film and the monomolecular layer is transferred onto a substrate.

According to the LB technique, there is provided the oriented films and the thickness of the films can be controlled in several tens of angstroms. The LB technique is excellent since there can be obtained thin films having a thickness of not more than 2000 Å, not more than 1000 Å, not more than several hundreds angstroms or several tens angstroms. Of course, the films having the thickness of 10,000 Å or over 10,000 Å can be obtained according to the LB technique.

The thin film can be formed from the above modified polymer alone, but when the above modified polymer is mixed with a known compound capable of forming LB films (hereinafter referred to as "known LB compound"), the film forming properties can be improved. As the known LB compounds, a compound containing a hydrocarbon group having from about 16 to about 22 carbon atoms and a hydrophilic group is preferred. Examples of the preferable known LB compounds are, for instance, $CH_3(CH_2)_{o-1}Z$, $CH_2=CH(CH_2)_{o-2}Z$, $CH_3(CH_2)_qC\equiv C-C\equiv C(CH_2)_pZ$ wherein Z is OH, $NH_2$, COOH, $CONH_2$ or $COOR'$ in which $R'$ is a lower fatty hydrocarbon group, o is an integer of 16 to 22, and $q+p=o-5$, and the like. The compound having the formula: $CH_3(CH_2)_{o-1}Z$ wherein Z and o are as defined above is preferable for improving the film forming properties and from the point of the cost. The compound having unsaturated bonds have a characteristic that the polymerization is conducted by irradiating light or radiation. The mixing ratio of the above modified polymer to the known LB compound is not particularly limited. It is preferable that the ratio of the modified polymer to the known LB compound is from 0.2 to 2.

In general, a solvent such as benzene or chloroform which evaporates into a gas phase without dissolving in water, is used for spreading an LB film forming material onto the water surface. In case of the modified polymer, it is preferable to use such a usual solvent in combination with an organic polar solvent for increasing the solubility. Examples of the organic polar solvent are, for instance, N,N-dimethylformamide, N,N-dimethylacetamide, N,N-diethylformamide, N,N-diethylacetamide, N,N-dimethylmethoxyacetoamide, dimethylsulfoxide, N-methyl-2-pyrrolidone, pyridine, dimethylsulfone, hexamethylphosphoramide, tetramethylenesulfone, dimethyltetramethylenesulfone, and the like.

When the mixture of the polymer and the known LB compound is spread onto the water surface, it is preferable to use the solvent such as benzene or chloroform in combination with the organic polar solvent.

In case of using benzene, chloroform or the like in combination with the organic polar solvent, it is considered that when the solution for forming LB films is spread onto the water surface, benzene, chloroform or the like evaporates into the gas phase and the organic polar solvent dissolves into a large quantity of water.

The concentration of the precursor solution to be spread onto the water surface is not particularly limited, but is usually selected from $2 \times 10^{-3}$ to $5 \times 10^{-3}$ M.

The substrates used for forming LB films of the invention thereon are not particularly limited, and are selected according to the uses of the formed LB film. Examples of the substrates used in forming the LB films are, for instance, an inorganic substrate such as glass, alumina or quartz, a metal substrate, a plastic substrate, a substrate of a semiconductor of Groups IV, III-V, II-VI of the Periodic Table such as Si, GaAs or ZnS, a substrate of a ferroelectric substance such as $PbTiO_3$, $BaTiO_3$, $LiNbO_3$ or $LiTaO_3$, a substrate of a magnetic substance, and the like. The substrates may be surface-treated in a usual manner. It is preferable to surface-treat the substrate with a silane coupling agent, especially a silane coupling agent having amino group or epoxy group, or with a chelate compound of aluminum, and to heat the treated substrate, because of improving the adhesion between the thin film of the invention and the substrate.

In the invention, the modified polymer can provide thin films having no or a little defect and having a good heat resistance by the LB method, and can provide thin films having a further improved heat resistance by partially or completely converting the polymer thin film into a polyimide.

In the polymers having the recurring units (78) to (90), a five-membered ring or a six-membered ring having a hetero atom can be partially or completely ring-closed. Examples of the polymers completely ring-closed are as follows:

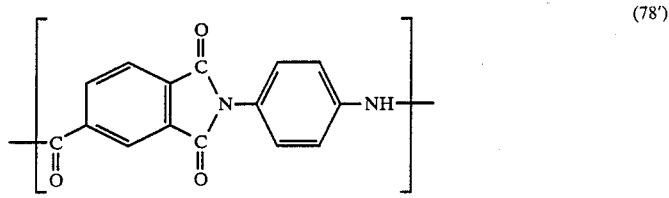
(78')

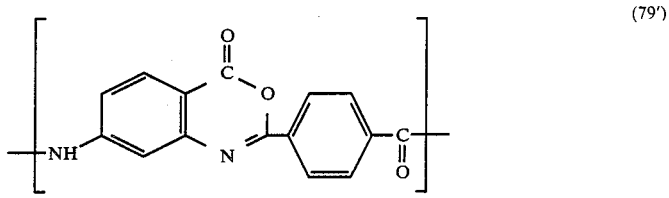
(79')

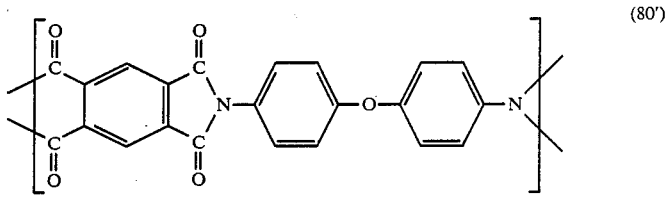
(80')

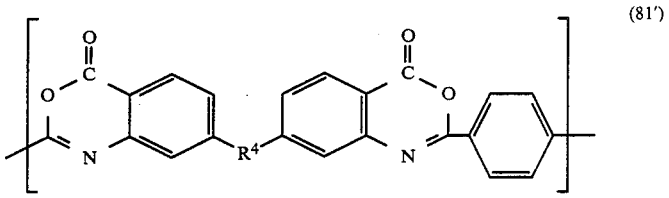
(81')

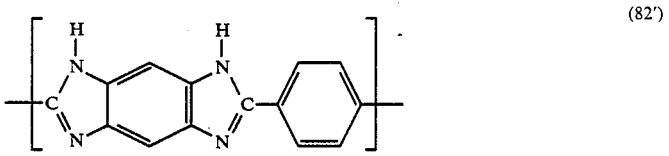
(82')

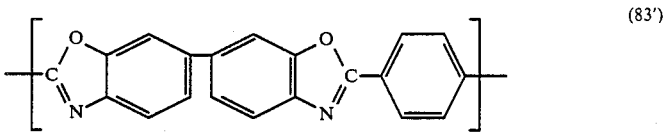
(83')

-continued
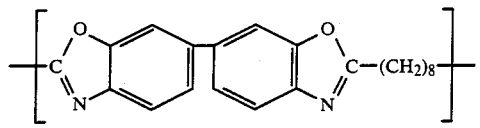 (84')
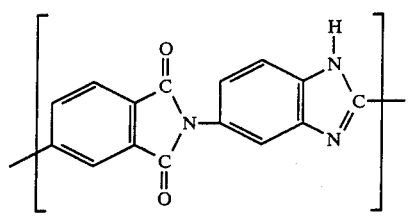 (85')
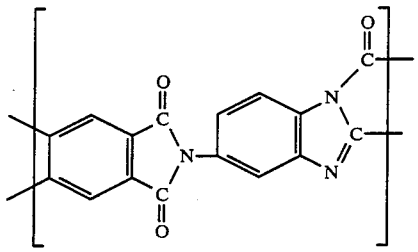 (86')
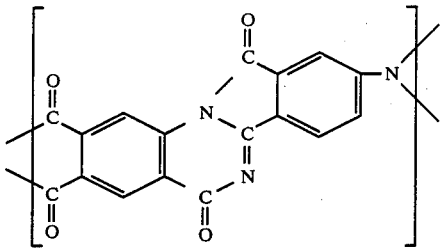 (87')
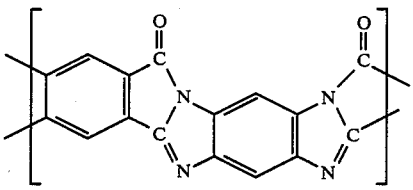 (88')
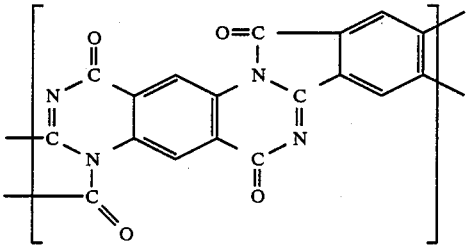 (89')
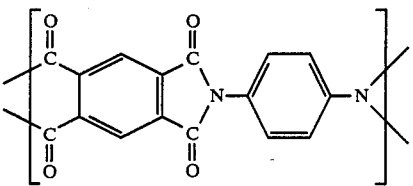 (90')
Methods for ring-closure are not particularly limited, and, for instance, the polyimide is produced from the polymer having the recurring units (80) by heating it at a temperature of 200° to 400° C., according to the following reaction scheme.

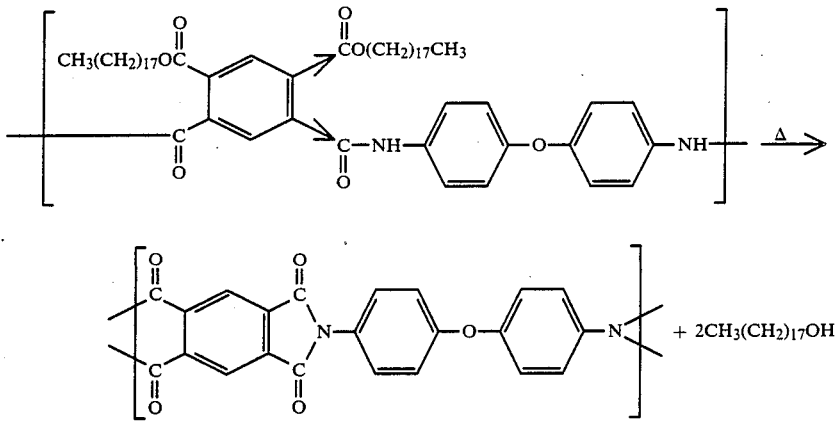

When the polymer converts into polyimide, the groups introduced for imparting the hydrophobic property to a polyamide acid is eliminated in the form of an alcohol. Since the eliminated alcohol can be removed away or scattered away, for instance, by conducting the conversion into polyimide in a gas stream or under vacuum at a temperature of about 200° to about 400° C., polyimide films having excellent heat resistance and electric insulation property can be obtained.

In order to obtain the thin film having the excellent heat resistance by conducting the ring-closure, it is desirable to select a known LB compound from the above-mentioned examples which is able to be removed under the condition of a ring closure reaction. Of course, chemical curing agents such as acetic anhydride, pyridine and isoquinoline which have been conventionally used in converting polyamide acids into polyimides, may be used in the invention, and such means may be used in combination with thermal reaction.

As aforementioned, the films of the invention, which are obtained by forming the built-up film from the polymer on the substrate according to the LB technique, and then, if necessary, conducting the ring-closure, have excellent heat resistance, for instance, not less than 300° C., mechanical strength, chemical resistance, electric insulation properties, and the thickness of not more than 10,000 Å, e.g. 5000 Å, 2000 Å or 10 to 1000 Å.

In particular, the thin films of the invention have excellent properties such as a high dielectric strength of not less than $1 \times 10^6$ V/cm even if the film thickness is less than 1000 Å, several hundreds of angstroms, or 50 to 100 Å. If selecting polymers having certain molecular structures, thin films having a heat resistance of not less than 300° C., preferably not less than 400° C., more preferably not less than 500° C. can be obtained. For instance, precursors wherein $R^1$ has a valence of 3, having structures capable of forming a 5-membered hetero ring or a 6-membered hetero ring can provide polymers having excellent heat resistance, e.g. polyamide-imide, polyimide-isoindroquinazolinedione, polyimidazopyrolone, polyoxadinone, and the like, and thin films of these heat resistant polymer have an excellent heat resistance as well as an excellent electric insulation property. Therefore, the thin films of the invention can be used in various devices such as electric or electronic devices. Particularly, in the thin film having a thickness of about 50 Å to several hundreds angstroms, the unique effects produced by the film thickness, e.g. the tunnel effect, are expected, and many attractive applications utilizing them become possible.

It is difficult, hitherto, to obtain thin films having a thickness of about 50 Å to several hundreds angstroms as well as a dielectric strength of not less than $1 \times 10^6$ V/cm, but according to the present invention, there can be obtained heat resistant thin films having a dielectric strength of not less than $1 \times 10^6$ V/cm as well as such a thickness, which can be satisfactorily utilized in field of electronics. Hitherto, though as methods for forming polyimide thin films there are spin coating method, vacuum evaporation method, and the like, a highly specified technique is required for obtaining the films having a dielectric strength of not less than $1 \times 10^6$ V/cm even if the thickness thereof is more than 1 μm. Accordingly, it is very difficult to prepare polyimide thin films having a dielectric strength of not less than $1 \times 10^6$ V/cm as well as a thickness of not more than 1000 Å according to conventional techniques.

The term "heat resistance" used herein is defined that when the dielectric property and the insulation property of a thin film are not almost changed after heating the thin film at a definite temperature for 1 hour in nitrogen stream, the thin film has a heat resistance of more than the definite temperature. Also, it is defined that when a change of an inverse capacitance of a thin film after heating the film at a definite temperature for 1 hour in nitrogen stream is within 10%, the film has a heat resistance of more than the definite temperature. Although it is hard to measure a weight change of a thin film before and after heating since the weight is a very small amount, when the weight change of the heat resistant polymer having a hetero ring prepared from a precursor after heating at a definite temperature for 1 hour in nitrogen stream is below 10% by weight, it is expected that the thin film prepared from the polymer has a heat resistance of more than the definite temperature. Also, the heat resistance of thin films can be easily estimated by infrared absorption spectra of polymer films before and after heating (that is, when there is no change between the spectrum of the polymer film before heating and that of the polymer film after heating at a definite temperature, the polymer has a heat resistance of more than the definite temperature).

Next, the devices having the thin film of the invention are explained as follows:

By utilizing the above-mentioned excellent properties, e.g. heat resistance, chemical resistance, mechanical characteristics and electric insulation properties, and the very thin film thickness, the thin films of the present invention can be used in various fields of art such as electronics, energy conversion and material separation.

For instance, by utilizing electric conductivity, photo-conductivity, optical property, insulating property, thermal property and chemical reactivity, the thin films of the present invention are usable as electric and electronic devices in the field of electronics.

In the invention, as the important electric and electronic devices having the thin film, there are devices having MIS structure wherein various semiconductors and metals are combined with insulation films, (hereinafter referred to as "MIS device") and the MIS devices are the fundamental structural in plane electronics devices or integrated circuits.

FIGS. 1 to 7 are schematic view showing typical embodiments of the MIS devices of the invention.

FIG. 1 is a schematic view showing an MIS device wherein the thin film of the present invention is formed as an insulation film 2 on a substrate of a semiconductor 3, on which a metal 1 is provided as an electrode. When as the substrate, a semiconductor of Group IV of the Periodic Table such as Si or Ge, a semiconductor of Group III-V such as GaAs or GaP, or a semiconductor of Group II-VI such as CdTe, CdS, ZnS, ZnSe or CdHgTe is used, there are provided, for instance, various transducer, e.g. photoelectric conversion element such as solar cell, light emitting element such as LED (light emitting diode), EL (electroluminescence) or photodiode, light receiving element, light detecting element, gas sensor, temperature sensor, and the like. As the semiconductor used in the invention, any of single-crystalline semiconductors, polycrystalline semiconductors and amorphous semiconductors can be used.

FIG. 2 is a schematic view showing an MIS device wherein 4 shows metals, 5 shows an insulation film, and 6 shows a semiconductor, having the same structure as the MIS device shown in FIG. 1 except that a plurality of metal electrodes 4 are placed on the insolution film 5. In case of forming two or more elements on the substrate, a plurality of metal electrodes are provided. By utilizing such a structure, charge-transfer devices such as CCD (charge-coupled device) can be prepared, which are interesting applications.

FIG. 3 is a schematic view showing an MIS device wherein a semiconductor 9 is formed mostly in the state of a thin film on an electrode 10 which may be transparent and, of course, may be patterned, which is provided on an insulation substrate 11, insulation film 8 of the thin film of the invention is formed on the semiconductor 9, and an electrode 7 is placed on the insulation film 8.

FIG. 4 is a schematic view showing an MIS device having the same structure as the device shown in FIG. 3 except that the thin film 14 of the invention is placed between the electrode 15 provided on the insulation substrate 16 and the thin film of the semiconductor 13. In FIG. 4, 12 shows an electrode.

The thin film of the semiconductor used in the invention can be prepared according to usual manners for preparing semiconductor thin films such as molecular beam epitaxy (MBE), metal organic chemical vapor deposition (MOCVD) or atomic layer epitaxy (ALE) deposition method, spatter method, spray pyrolysis method, or coating method. In the MIS devices shown in FIGS. 3 and 4, the same semiconductors as used in the MIS devices shown in FIGS. 1 and 2 can be used and the obtained devices have the same application as in the devices shown in FIGS. 1 and 2. In the MIS device shown in FIG. 4, it is not preferable that the preparation temperature of the MIS device is over the heat resistance of the thin film 14 of the invention since the thin film of the semiconductor 13 is formed on the thin film 14 of the invention, but it is possible to built-up amorphous silicon on the thin film conducted the ring-closure and another semiconductors will able to be formed on the thin film with developing the film forming technique at low temperature.

FIGS. 5 and 6 are schematic views showing typical embodiments of an MIS devices having a field effect transistor (FET) structure (hereinafter referred to as "MISFET device"), which are drived by controlling channel current with gate electrodes and which are the most important device among MIS devices.

FIG. 5 is the schematic view showing the MISFET device wherein a thin film of the invention as an insulation film 18 is formed on a substate of semiconductor 21 having a source 19 and a drain 20, on which a gate electrode 17 is formed.

FIG. 6 is the schematic view showing the MISFET device having the same structure as shown in FIG. 5 except that a semiconductor 26 is formed mostly in the form of a thin film on a insulation substrate 27. In FIG. 6, 22 shows a gate electrode, 23 shows a thin film of the invention used as an insulation film, 24 shows a source and 25 shows a drain.

Various electric and electronic devices can be prepared from the MISFET device, and it is one of the fundamentals. For instance, a thin film transistor capable of driving liquid crystal display can be prepared by using a substrate having large area, or an integrated circuit (IC) can be obtained by increasing the element number.

In the MISFET devices shown in FIGS. 5 and 6, as interesting applications other than the above-mentioned, there are devices of a structure having no gate electrode, for instance, ion-sensitive FET (ISFET), gas-sensitive FET (Chem FET), immune FET (IMFET), enzyme FET (ENFET). These devices can be obtained by providing an insulation film, if necessary, with a film capable of responding ion, gas or active substances. The devices act due to electric field effect caused by acting the ion, gas or active substances with the surface of the gate insulation film. The thin film of the invention is more advantageous than conventional inorganic thin films upon further modifying the thin film with various oragnic substances. Particularly, in the thin film having long chain alkyl groups of the invention, the interaction between the hydrophobic property of alkyl group and the hydrophobic part of proteins can be utilized.

FIG. 7 is a schematic view showing the ISFET wherein the semiconductor film 32 is formed on a quartz substrate 33 as an insulation substrate, on which the ion-sensitive film 28 and the thin film of the invention 29 as an insulation film are formed. In FIG. 7, 30 shows a source and 31 shows a drain.

In case that the compound of Group III-V or II-VI from which it is usually difficult to form the insulation films having good properties by oxidation or the like is used as the semiconductor in the MIS devices, the effect of the present invention can be exhibited. For instance, in case of using GaAs as the semiconductor on preparation of the devices having the FET structure, the obtained devices have a metal-semiconductor FET (MESFET) structure from the point that insulation films having good properties cannot be obtained. However, by using the thin film of the invention, the devices having MIS structure can be obtained and the improvement of the properties of the devices can be expected by utilizing MIS structure. On the other hand, when the MIS integrated circuits are prepared by using GaAs, not only the effect of lowering the driving voltage is obtained but also there can be easily obtained integrated circuits capable of driving at high speed (HEMT) which utilize large carrier mobility in the GaAs semiconductor.

In the present invention, as the important electric and electronic devices other than the above-mentioned, there are devices having MIM structure wherein various metals are combined with insulation films.

Figure 34:
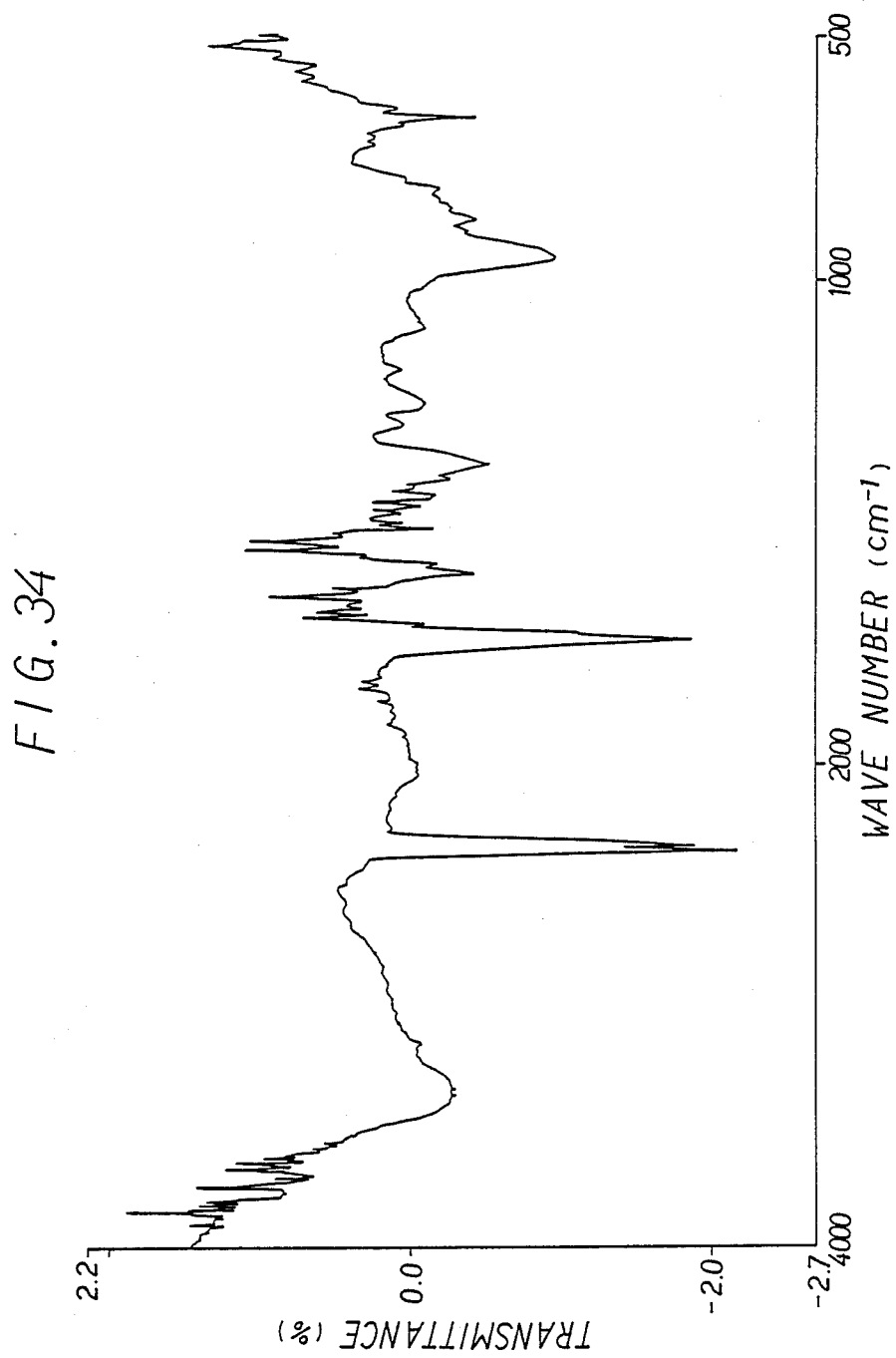
Figure 35:
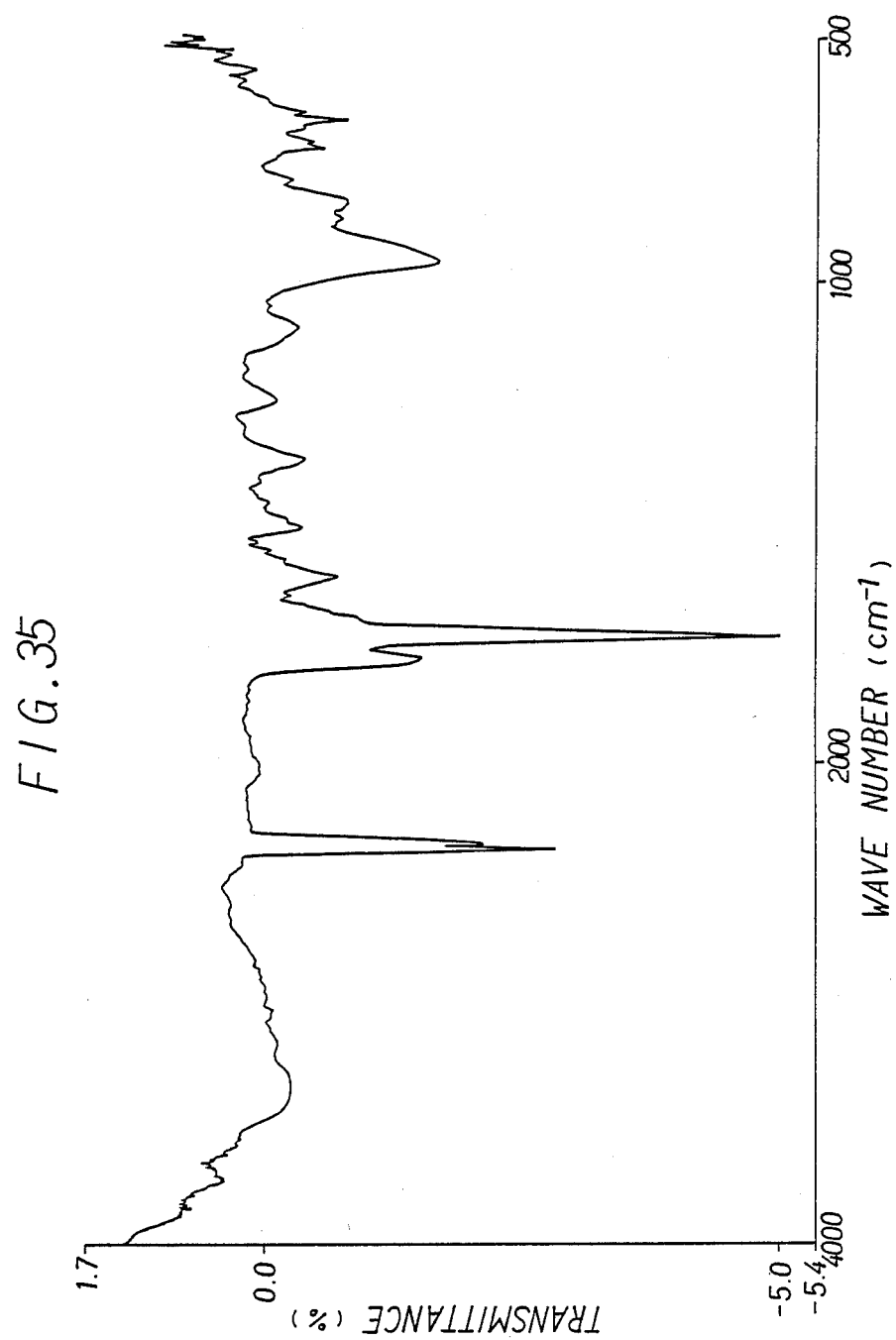

FIGS. 8 to 10 are schematic view showing typical embodiments of the devices having the MIM structure wherein a metal, an insulation film and a metal are formed in order on an insulation substrate or a semiconductor substrate. In FIG. 8, 34 and 36 show metals, 35 shows an insulation film and 37 shows an insulation substrate, in FIG. 9, 38, 40 and 42 show metals, 39 and 41 shows insulation films and 43 shows an insulation substrate, and in FIG. 10, 44 and 46 show metals, 45 shows an insulation film and 47 shows a semiconductor.

FIG. 8 is a schematic view of a capacitor. There is provided a moisture sensor in case that the change of capacitance due to moisture is tracked and also there is provided a transistor having the MIM structure by utilizing the structure shown in FIG. 8.

There is provided a hot electron transistor by utilizing a structure shown in FIG. 9.

The MIM device is used as a capacitor of a memory cell in VLSI by forming the capacitor on a semiconductor or a semiconductor device, as shown in FIG. 10. In the MIM structure shown in FIG. 10, there are provided devices wherein hot electrons are injected into the semiconductor, and Josephson Junction (JJ) devices can be obtained by using a superconductor such as Nb instead of the metal.

FIG. 11 is a schematic view showing a device having an IM structure wherein the thin film 48 of the invention is formed on the metal 49 as the insulation film, which is placed on an insulation substrate. The IM device is applied to liquid cyrstal orientation film obtained by forming the thin film of the present invention on a patterned electrode, usually a transparent electrode such as ITO. Also, the IM device is used as a moisture sensor or gas senstor by forming the thin film 54 of the invention on or under two electrodes 52 and 53 shown in FIGS. 12 and 13 wherein 51 shows an insulation substrate.

Other applications of the electric and electronic devices having the thin film of the invention are described in the above-mentioned literatures, particularly in Thin Solid Films, 68, 135 to 171 (1980) P. S. Vincett and G. G. Roberts. Also, other applications of the semiconductor devices or compound semiconductor devices are described in Fundamentals of Semiconductor Devices MaGraw-Hill, E. S. Yang, 1978, or Kagobutsu Handotai Device [1] or [II], 1984, written and edited by Imai et al, Kogyo Chosakai.

Devices other than the electric and electronic devices are explained as follows:

There has been attempted a recording method in which thin films including pigments or inorganic thin films such as TeOx are subjected to bit-forming or phase change and the changes are optically shown as O or 1. The thin film of the present invention is reacted with light, heat or laser light which is usually used in optical recording to change the film thickness, thus resulting in formation of bits. Also, as a result of the above-mentioned reaction, the index of refraction of the thin films is changed. Accordingly optical recording can be done by utilizing the formation of bits or the change of the index of refraction.

Since the thin films of the invention have the reactivity to heat, the films can be patterned by utilizing the reactivity to heat, that is, by obtaining the thin film partially ring-closed with heating and removing a part of the thin film which is not ring-closed with a solvent. The remainder can be used as a resist film, since the remainder is excellent in heat resistance, mechanical strength, and chemical resistance. It is possible that the thin film of the invention become have the reactivity to light by using the polymer having a double bond or triple bond in the alkyl chain.

In addition, it is also possible to utilize the films of the invention as a cladding material for waveguide and a component for optical circuit. Also, the optical circuits can be prepared by patterning the film in the same manner as above. When the thin film of the invention is used, the film thickness can be exactly controlled and the index of refraction can be controlled by changing the compound used in the thin film of the invention, which are very important factors in the optical circuits.

Further, the thin films of the invention are suitable as protective coating materials in various fields. By utilizing the techniques for mixed films or assembled films of functional LB materials and fatty acids generally used in the field of LB films so as to use the thin films of the present invention instead of the fatty acids, various functionalities can be revealed and the uses utilizing them are considered. For instance, photoelectric devices and biosensors can be fabricated by forming films containing pigments or enzymes.

Also, the thin films of the invention are applied to a material separation. Recently, there have been many attempts utilizing thin films for material separation, the thin films having fine holes and being formed on a substrate of porous film. The thin films of the invention are prepared in the presence of the known LB compounds and then the ring-closure is conducted to give thin films having fine holes. For instance, a polyimide precursor is formed into a film in the presence of excess stearic alcohol on a porous polyimide film and then the conversion of the precursor into polyimide is conducted at a temperature of 300° to 400° C. to give a polyimide thin film having fine holes, formed on porous polyimide film.

The present invention is more specifically described and explained by means of the following Examples. It is to be understood that the present invnetion is not limited to the Examples, and various changes and modifications may be made in the invention without departing from the spirit and scope thereof.

EXAMPLE 1

A flask was charged with 2.18 g (0.01 mole) of pyromellitic dianhydride and 5.40 g (0.02 mole) of stearyl alcohol, and they were reacted at about 100° C. for 3 hours in a dry nitrogen stream.

The resulting reaction product was dissolved in 40 ml of hexamethylphosphoramide and cooled to 0° to 5° C. To the solution was added dropwise 2.38 g of thionyl chloride at about 5° C. After the completion of the addition, the solution was maintained at about 5° C. for 1 hour to complete the reaction.

To the reaction mixture was then added dropwise 2 g (0.01 mole) of diaminodiphenyl ether dissolved in 50 ml of dimethylacetamide at a temperature of 0° to 5° C., and after the completion of the addition, the reaction was further continued for 1 hour. The reaction mixture was poured into 600 ml of distilled water to precipitate the reaction product. The precipitate was filtered and dried under reduced pressure at about 40° C. to give about 9 g of a light yellow powder.

IR absorption analysis, thermal analysis (TGA and DTA), and measurement of molecular weight by gel permeation chromatography (GPC) were made.

(IR Absorption Analysis)

IR spectrum of the product measured by KBr disk method is shown in FIG. 14. Characteristic absorptions of ester, amido I, II and III absorption bands, alkyl chain and ether are observed in the spectrum.

(Thermal Analysis)

Figure 15:
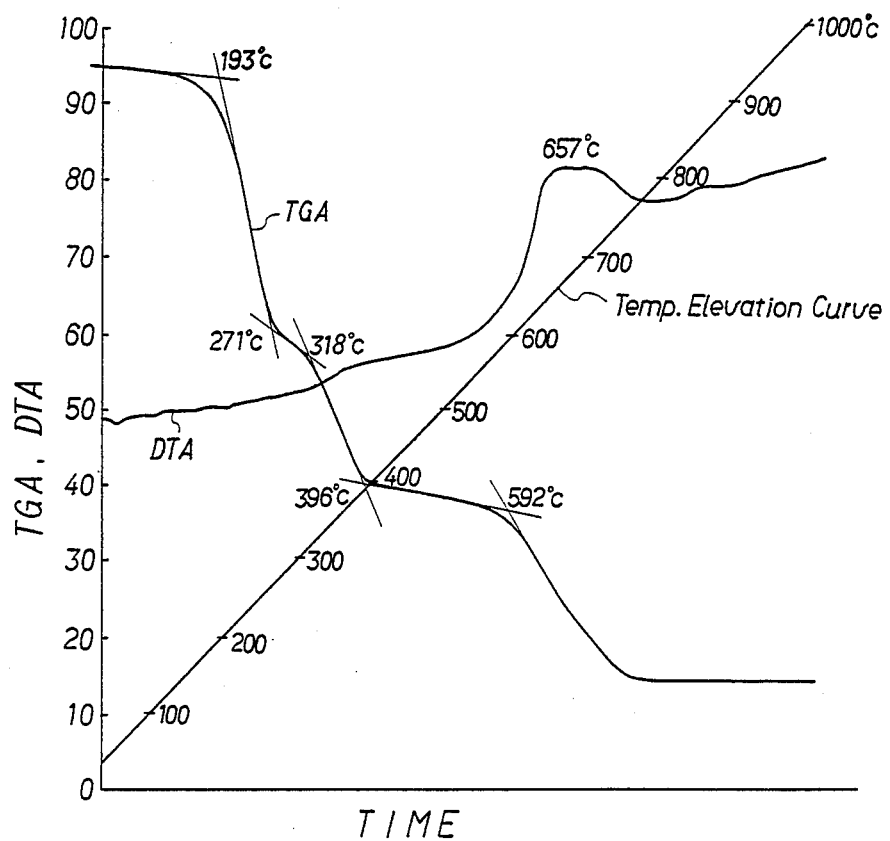
FIG. 15 is a graph showing the results of thermal analysis (thermogravimetric analysis-differential thermal analysis) of the polymer obtained in Example 1.

The results of thermal analysis measured by a RTG-DTA(H) type analyzer made by Rigaku Denki Kabushiki Kaisha with full scale 10 mg for TGA (thermogravimetric analysis) and 100 $\mu$V for DTA (differential thermal analysis) by elevating the temperature at a rate of 10° C./minute to 1,000° C. in a nitrogen stream (30 ml/minute) are shown in FIG. 15.

In the TGA curve, inflection points are observed at 193° C., 271° C., 318° C., 396° C. and 592° C. In the DTA curve, a characteristic peak is observed in the neighborhood of 657° C.

The thermal analysis of the product was also conducted by raising the temperature to 400° C. at a rate of 10° C./minute, maintaining the temperature at 400° C. for 1 hour, dropping the temperature to room temperature and raising the temperature again to 1,000° C. at a rate of 10° C./minute. The results are shown in FIG. 16.

Figure 16:
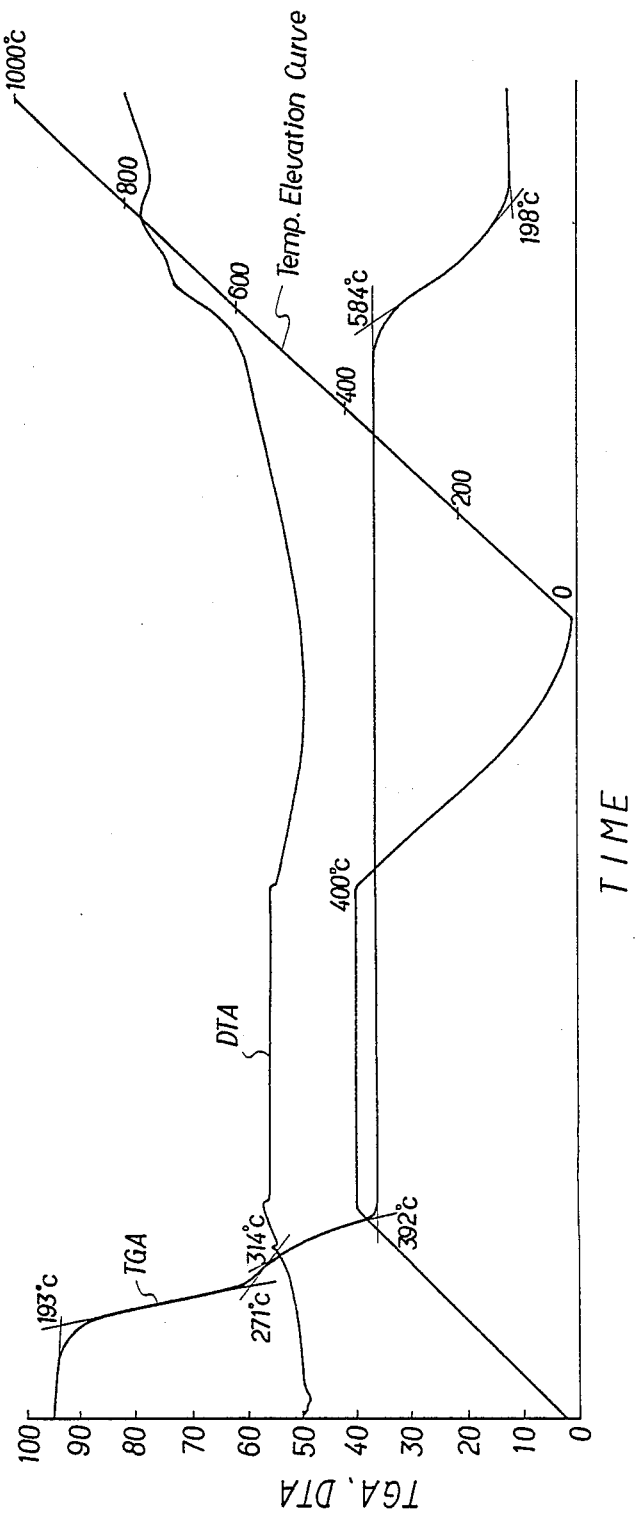
FIG. 16 is a graph showing the results of thermal analysis (TGA-DTA) of the polymer obtained in Example 1 when the temperature is raised from room temperature to 400° C., maintained at 400° C. for 1 hour, dropped to room temperature and is further raised to 1,000° C.

It is observed in FIG. 16 that by keeping the temperature at 400° C. for 1 hour, the weight of the product reaches approximately a constant weight, thus the conversion into polyimide is completed, and that there is no weight change until exceeding 450° C. even if the so heat-treated sample is cooled to room temperature and again heated, and thermal decomposition starts at 584° C. These characteristics are the same as the thermal decomposition temperature of polyimide films like Kapton (trade mark). So, similar heat stability can be expected on the polyimide of the present invention.

(Measurement of Molecular Weight by GPC)

The number average molecular weight of the product measured by using N,N-dimethylacetamide as a solvent was about 50,000 (calculated in terms of polystyrene).

EXAMPLE 2

A solution of a polymer to be spread onto the surface of water for forming a monomolecular film was prepared by dissolving 55.1 mg of the product obtained in Example 1 in a mixed solvent of distilled chloroform and dimethylacetamide in a ratio of 8:2 by volume so that the total volume was 25 ml.

Figure 17:
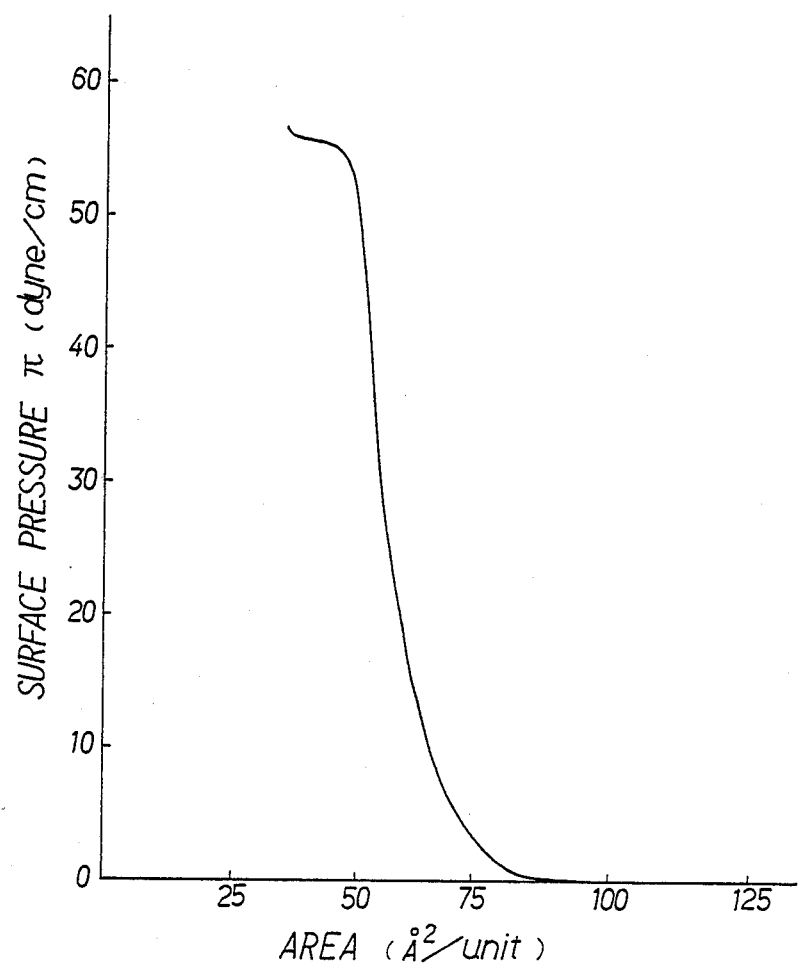
FIG. 17 is a graph showing the relationship between the surface pressure and the area per recurring unit of the polymer obtained in Example 1 when the polymer is spread onto the surface of water according to Example 2 described after.

The obtained solution was spread onto the surface of bidistilled water, and the relationship between the surface pressure ($\pi$) and the area per recurring unit (unit) was measured at 20° C. The result is shown in FIG. 17. The surface pressure suddenly increased from about 75 Å$^2$/unit and a good condensed film was formed. The limiting area was 60 Å$^2$/unit, and the collapse pressure was 55 dyne/cm which was very high for a polymer film. Also, the monolayer on the water surface was so stable that even if it was maintained on the water surface with keeping the surface pressure at 25 dyne/cm, no decrease in area was observed over 2 hours.

A built-up film of 60 layers was formed on a glass substrate or a CaF$_2$ plate substrate according to the LB method by raising and lowering the substrate through the water surface at a speed of 10 mm/minute, while maintaining the surface pressure of the monolayer on the water surface at 25 dyne/cm at 20° C.

Figure 18:
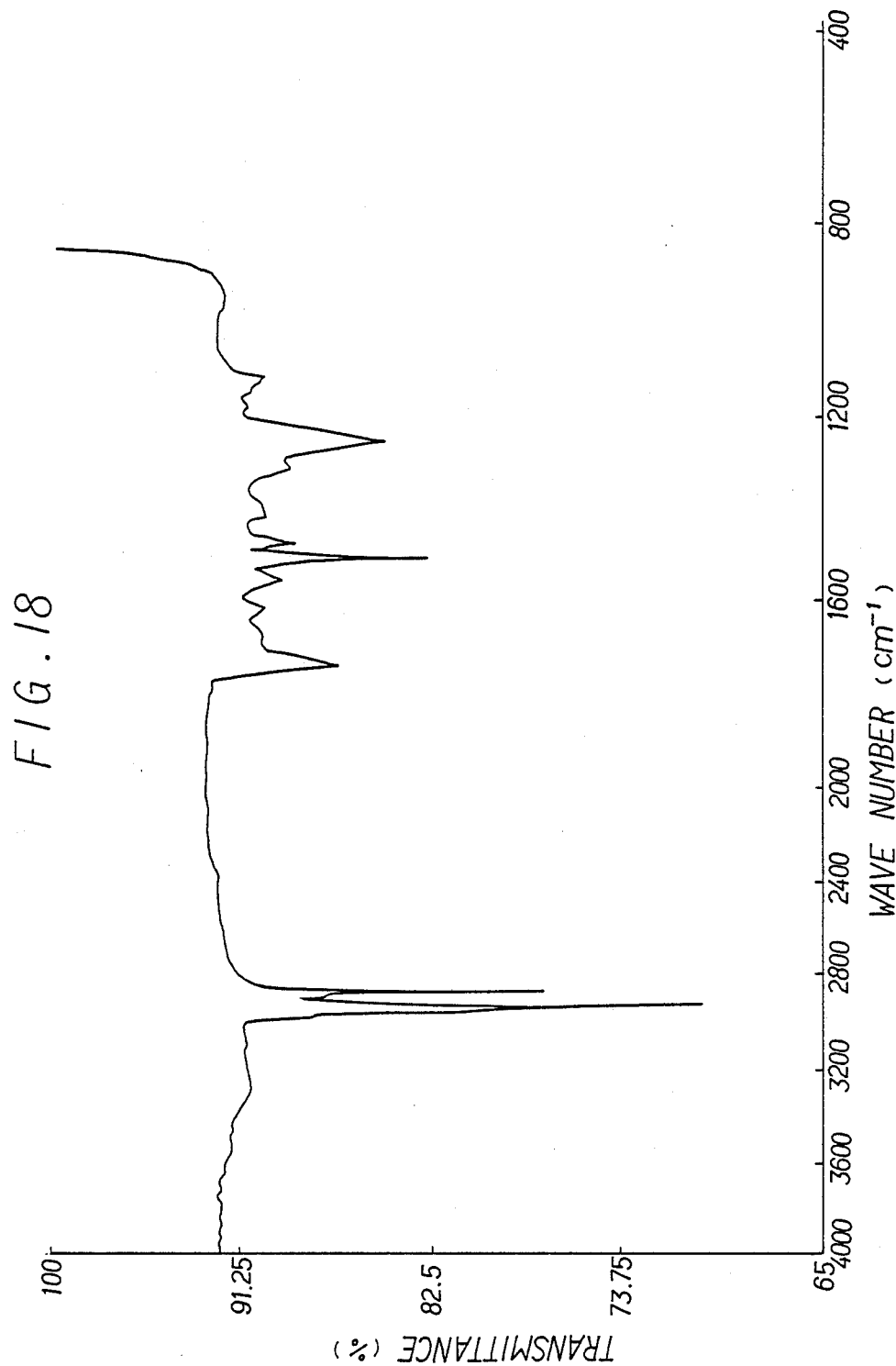
FIG. 18 is an FT-IR spectrum of films built-up on a $CaF_2$ plate by LB method.

The film formed on the CaF$_2$ plate was analyzed by FT-IR analysis. The obtained IR absorption spectrum is shown in FIG. 18. From the IR spectrum, it was confirmed that the built-up film was a film of the compound obtained in Example 1. Also, from the area-time curve, it was confirmed that the built-up film was a Y-type film. Further, in the X-ray diffraction of the built-up film of 90 layers, one peak was observed at $2\theta = 4.65°$ despite that no Cd$^{++}$ ion was included in water used in this Example.

The Bragg's formula (the formula explaining a diffraction condition): $n\lambda = 2d \sin \theta$ wherein n is a positive integer, $\lambda$ is a wave length, d is a lattice spacing and $\theta$ is Bragg angle. When n is 3 and $\lambda$ of X-ray is 1.5418 Å, d, that is, the thickness of the monomolecular layer is calculated as 28.5 Å. The calculated value almost agrees to an value calculated supposing that a long chain alkyl group in an amphiphilic precursor of polyimide is perpendicularly standed.

The built-up film was heated at 400° C. for 1 hour, and subjected to FT-IR analysis. From the presence of peaks at 1,790 and 1,710 cm$^{-1}$ in the IR spectrum, it was confirmed that imide with $\alpha,\beta$-unsaturated 5-membered ring was produced.

With respect to the product of Example 1, it is also confirmed by IR absorption analysis, etc. that weight loss of 58% occurs by heating at 400° C. for 1 hour, thus it converts into imide. This weight loss well agrees to the value calculated supposing that 2 molecules of stearyl alcohol are eliminated from each recurring unit of the precursor. The calculated value is 58.7%.

COMPARATIVE EXAMPLE 1

A polymer was prepared in the same manner as in Example 1 except that n-decyl alcohol (n-C$_{10}$H$_{21}$OH) was used instead of stearyl alcohol.

Figure 19:
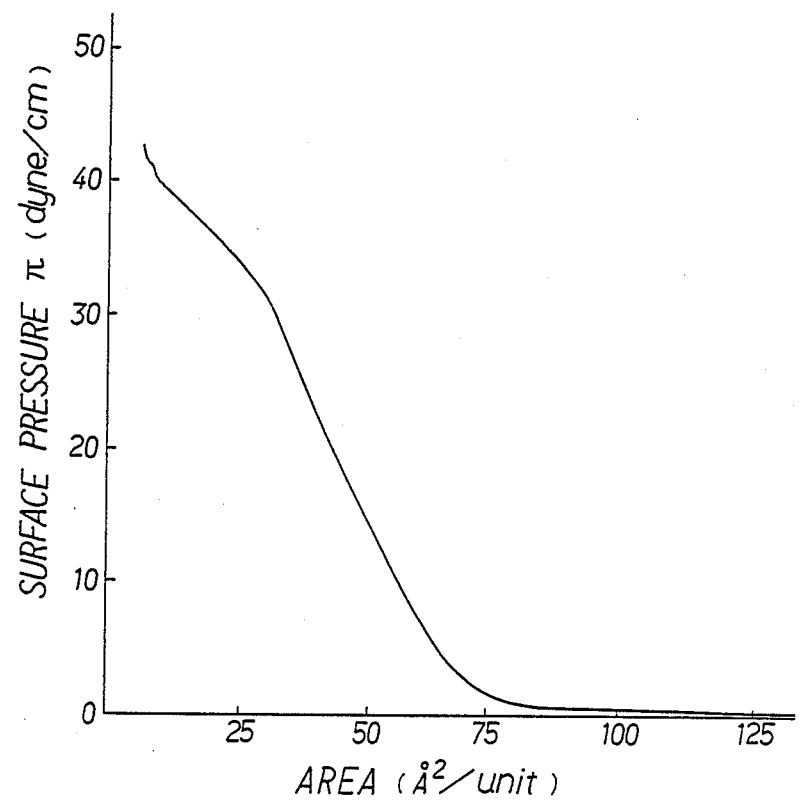
FIG. 19 is a graph showing the relationship between the surface pressure and the area per recurring unit of the polymer obtained in Comparative Example 1 described after.

The results of IR analysis, thermal analysis and measurement of molecular weight by GPC of the obtained polymer showed approximately the same characteristics as those of the product obtained in Example 1, but the surface pressure-area curve thereof was different. The surface pressure-area curve is shown in FIG. 19. The obtained polymer showed only a liquid expansion phase, and did not show the presence of a condensed monomolecular layer. From this result, it is understood that the introduction of an alkyl group having 10 carbon atom into a polyamide acid is too short in chain length to obtain a stable monomolecular layer. For instance, the film maintained at 20 dyne/cm in surface pressure on the water surface was unstable, thus the polymer obtained in this example did not give a good built-up film.

EXAMPLES 3 TO 5

Polymers were prepared in the same manner as in Example 1 except that lauryl alcohol (C$_{12}$), myristyl alcohol ($C_{14}$) or cetyl alcohol ($C_{16}$) was used instead of stearyl alcohol.

The obtained polymer by using the $C_{12}$ or $C_{14}$ alcohol showed behaviors intermediate between those for $C_{10}$ and $C_{18}$, and formed a sufficiently stable monolayer and could form a built-up film.

The polymer obtained by using the $C_{16}$ alcohol formed a very stable monolayer on the water surface and could form a good built-up film as well as the polymer obtained by using the $C_{18}$ alcohol.

EXAMPLE 6

The reaction of 10.91 g of pyromellitic dianhydride and 27.05 g of stearyl alcohol was carried out at 120° C. for 3 hours. The reaction product was recrystallized from 200 ml of ethanol to give distearyl pyromellitate having a melting point of 133° to 137° C.

In 60 ml of hexamethylphosphoramide was dissolved 3.79 g of distearyl pyromellitate, and 1.19 g of thionyl chloride was added dropwise to the resulting solution at about 5° C. After the completion of the addition, the mixture was maintained for 1 hour to complete the reaction. To the reaction mixture was added dropwise at 10° C. 1.2 g of diaminodiphenyl ether dissolved in 30 ml of dimethylacetamide, the temperature was then raised to about 20° C. and the reaction was further continued for 2 hours. The reaction mixture was then poured into 400 ml of ethanol to precipitate the product. The precipitate was filtered and dried at 40° C. to give about 3.4 g of a light yellow powder.

The results of the IR analysis, thermal analysis and GPC of the powder conducted in the same manner as in Example 1 are as follows:

(IR Analysis)

Figure 20:
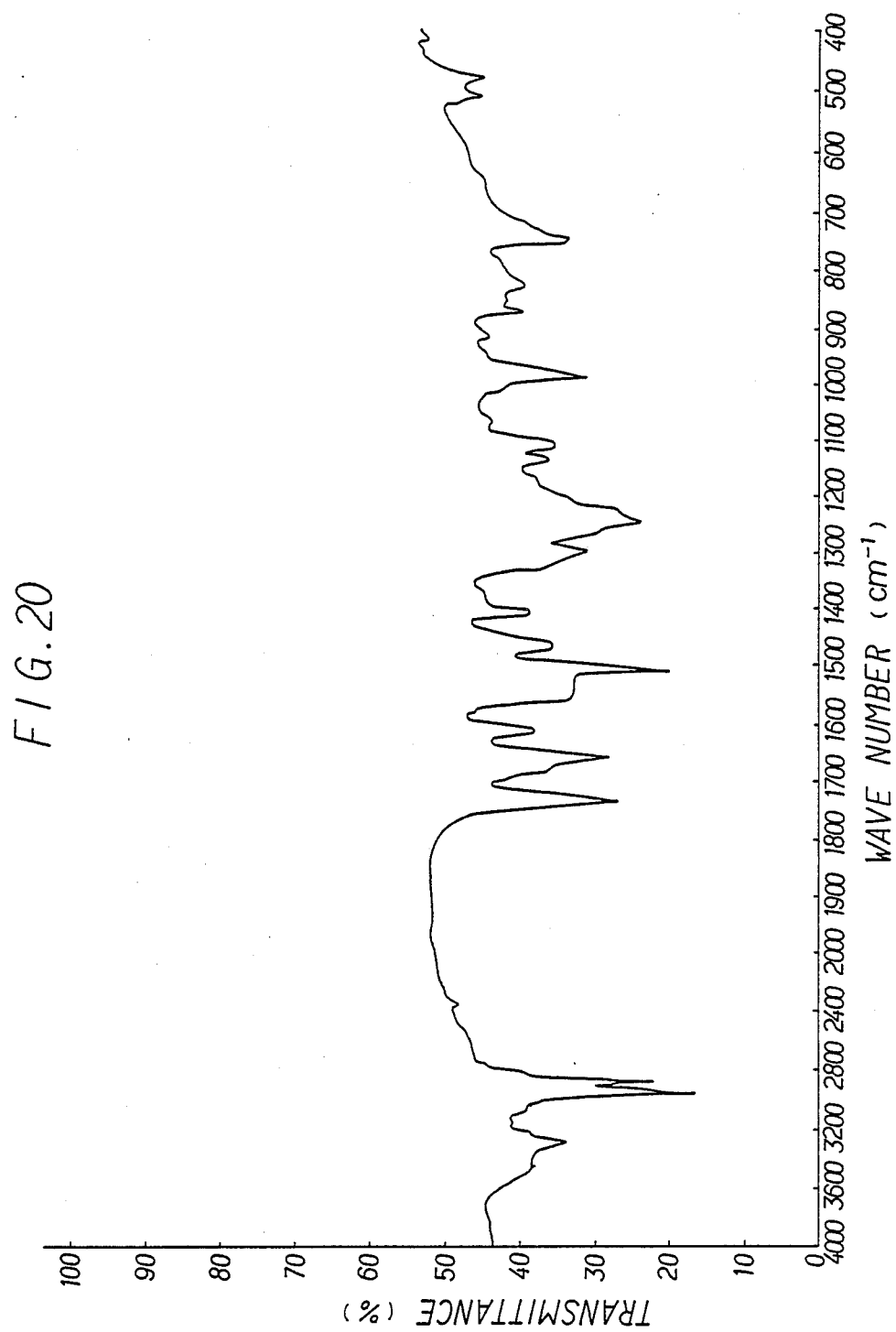
FIG. 20 is an infrared absorption spectrum of the polymer of the present invention obtained in Example 6 described after.

The IR spectrum is shown in FIG. 20.

Characteristic absorptions of ester, amido I, II and III absorption bands, alkyl chain and ether are observed in the spectrum.

(Thermal Analysis)

Figure 21:
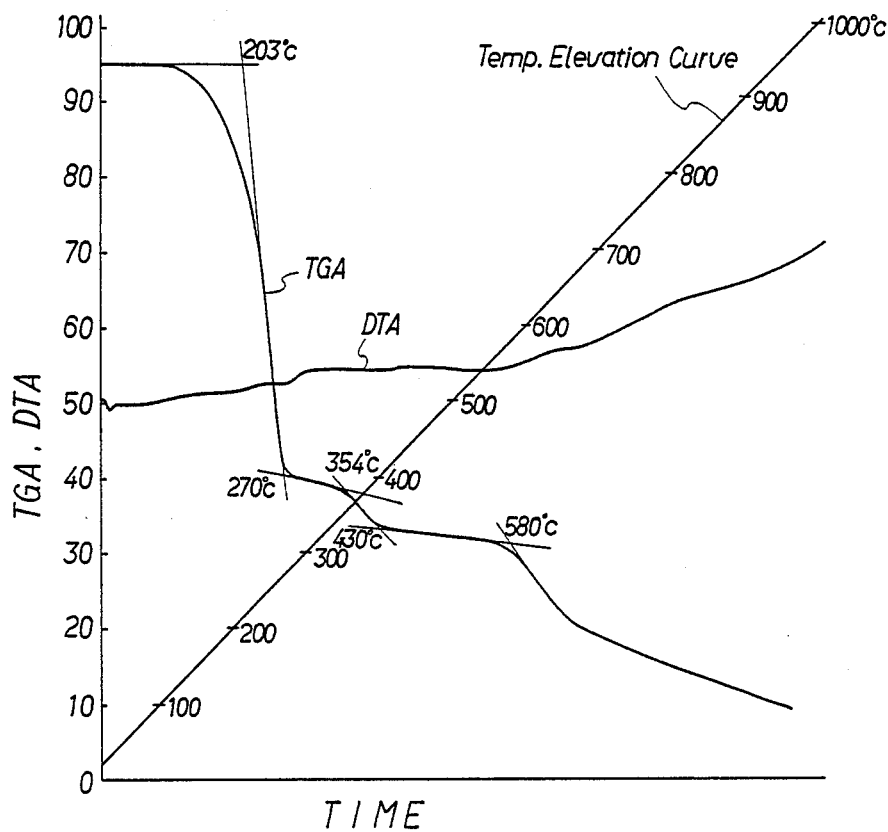
FIG. 21 is a graph showing the results of thermal analysis of the polymer obtained in Example 6.

The results are shown in FIG. 21.

In the TGA curve, inflection points are observed at 203° C., 270° C., 354° C., 403° C. and 580° C. No characteristic peak is observed in the DTA curve.

(Measurement of Molecular Weight by GPC)

The number average molecular weight measured using a chloroform/N,N-dimethylacetamide mixed solvent in a volume ratio of 8/2 was about 15,000 (calculated in terms of polystyrene).

EXAMPLE 7

In a distilled chloroform/dimethylacetamide mixed solvent in a volume ratio of 8/2 was dissolved 55.1 mg of the product obtained in Example 6 to give 25 ml of a solution of the polymer to be used for forming the LB film.

Figure 22:
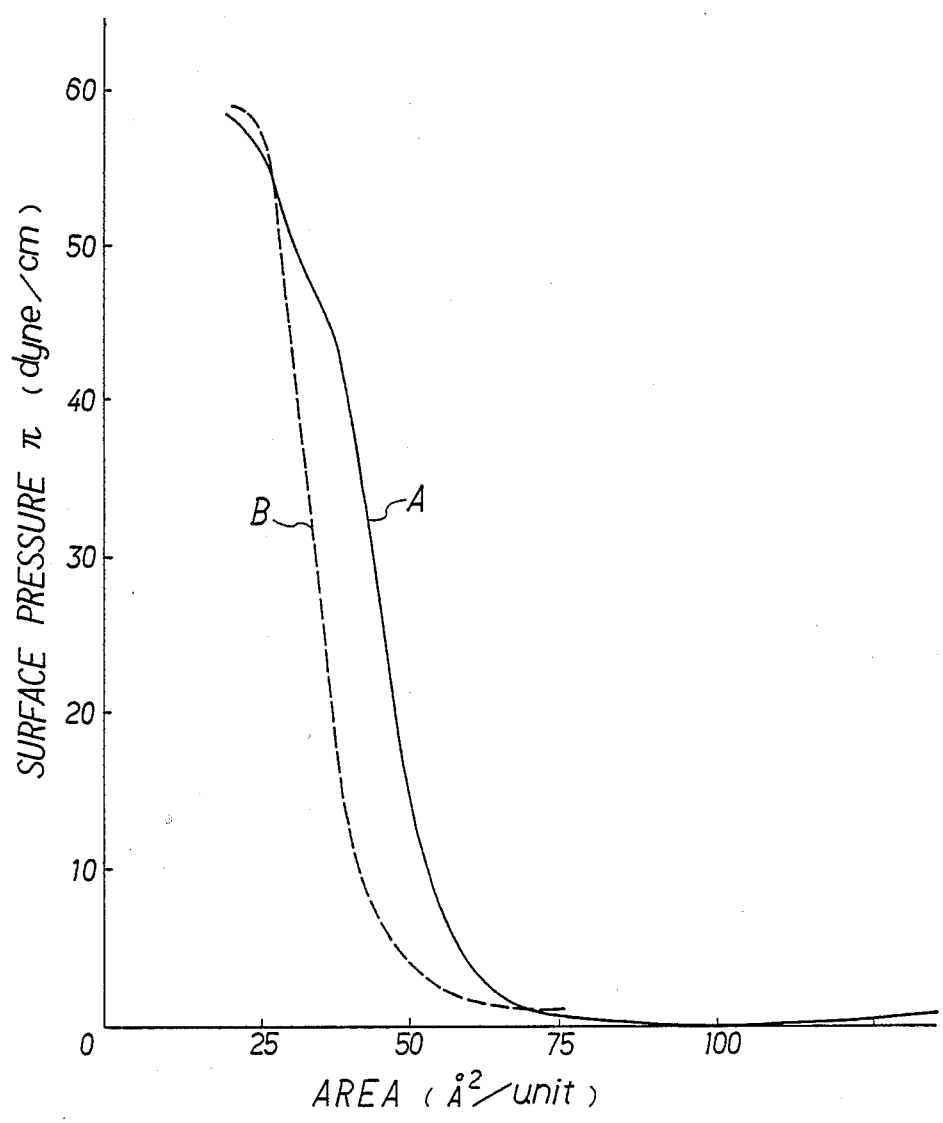
FIG. 22 is a graph showing the relationships between the surface pressure and the area per recurring unit, wherein the curve A shows the relationship of the polymer obtained in Example 6 and the curve B shows the relationship of the mixture of the polymer obtained in Example 6 and stearyl alcohol in a molar ratio of 1:1.

The obtained solution was spread onto the surface of bidistilled water, and the relationship between the surface pressure and the area per recurring unit was measured at 20° C. The result is shown in FIG. 22. The surface pressure suddenly increased from about 65 Å$^2$/unit and a good condensed monolayer was formed. The limiting area was about 55 Å/unit and the collapse pressure was 45 dyne/cm (FIG. 22-A).

A solution of stearyl alcohol having the same molar concentration as the above polymer solution was mixed with the polymer solution in an amount of an equal volume to the polymer solution, and relationship between the surface pressure and the area per recurring unit was measured under the condition that the total amount of the number of the recurring units of the product obtained in Example 6 and the number of the molecules of stearyl alcohol is equalized to the number of the recurring units of the product obtained in Example 6 using no stearyl alcohol (FIG. 22-A). The result is shown in FIG. 22-B. It is understood that by adding stearyl alcohol to the solution of the polymer, the film is stabilized, since the surface pressure more suddenly increases and the collapse pressure rises to about 60 dyne/cm.

When multilayer films were formed on an aluminum deposited glass substrate and glass substrates being treated with a silane coupling agent A-1100 or A-187 commercially available from Union Carbide Corp. by using the solution of the polymer or the mixture of the polymer and stearyl alcohol, both the obtained films were good Y-type and good built-up films.

A multilayer film was formed on a germanium substrate from a mixture of the product in Example 6 and stearyl alcohol in a molar ratio of 1:1, and the built-up film was heated in a nitrogen stream at 400° C. for 1 hour. It was observed by FT-IR method that the stearyl group disappeared and the absorptions of 5-membered ring imide appeared at 1,790 cm$^{-1}$ and 1,710 cm$^{-1}$.

EXAMPLE 8

The relationship between the surface pressure and the area per recurring unit were measured in the same manner as in Example 7 except that, instead of stearyl alcohol, stearic acid, ω-heptadecene acid or octadecane was used. In all of the above cases, the surface pressure more suddenly increased than the solution having the polymer alone and the collapse pressure rised, similarly to the case using stearyl alcohol. The values of the collapse pressures of the film prepared from the mixture of the polymer and stearic acid or the mixture of the polymer and ω-heptadecenoic acid are similar to the value of the film prepared from the mixture of the polymer and stearyl alcohol, and are more excellent than the value of the film prepared from the mixture of the polymer and octadecane.

When a multilayer film was formed on an aluminum deposited glass substrate from each of the mixture of the polymer and stearic acid, ω-heptadecene acid and octadecane, the obtained film was a good Y-type and a good built-up film.

EXAMPLE 9

Figure 23:
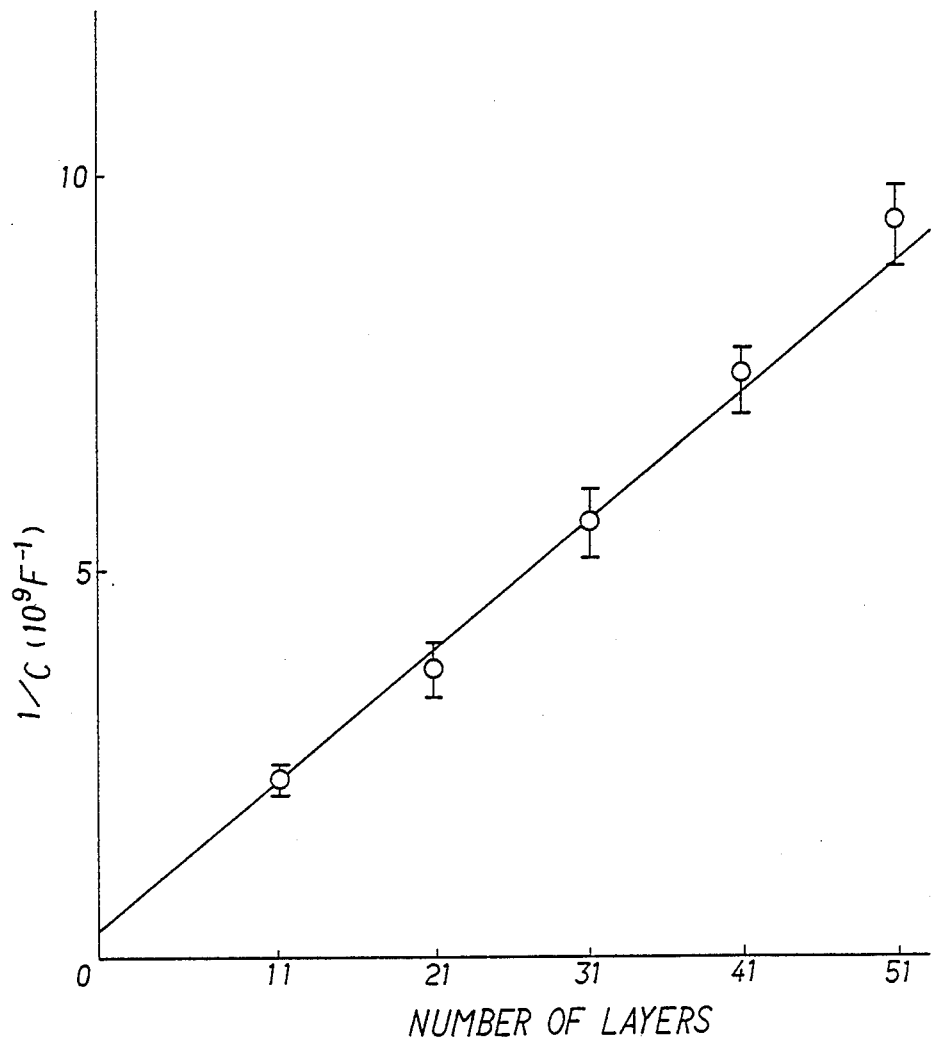
FIG. 23 is a graph showing the relationship between the inverse capacitance of a polyimide thin film prepared from a built-up film of the polymer obtained in Example 6 and the number of layers in the built-up film.

Built-up films of 11, 21, 31, 41 and 51 layers were formed on substrates in the same manner as in Example 2 except that a mixture of the polymer obtained in Example 6 and stearyl alcohol in a molar ratio of 1:1 was used. As the substrates, there were used glass substrates treated with a 1% solution of silane coupling agent A-1100, on which an aluminum was deposited in a width of 0.5 mm. After drying overnight, the films were treated in a nitrogen stream at 400° C. for 1 hour. Aluminum was then deposited on the films to form an electrode having a width of 0.1 mm and crossing at right angle with respect to the lower Al electrode, and an MIM device shown in FIG. 8 was obtained. The capacitance was measured at room temperature and at a frequency of 1 KHz. The inverse capacitance values were plotted with respect to the number of layers. The result is shown in FIG. 23 wherein bars indicate the distribution of 10 data. The loss factors of the all films were about 0.02. Also, Al/heat resistance polyimide thin film/Al devices having a device area of 0.18 cm² were prepared by forming built-up films of 11, 21, 31, 41, 51, 101 and 151 layers on an aluminum electrode, heating the films in a nitrogen stream at 400° C. for 1 hour. The thicknesses of the respective polyimide films were about 50, 100, 150, 200, 250, 500 and 750 angstroms.

With respect to 10 samples of each device, there were applied electric fields of $1 \times 10^6$ V/cm, $2 \times 10^6$ V/cm, $3 \times 10^6$ V/cm, $4 \times 10^6$ V/cm and $5 \times 10^6$ V/cm, but no dielectric breakdown ocurred. The results reveal that the polyimide thin films prepared according to the present invention have dielectric strengths of not less than $1 \times 10^6$ V/cm. Even if heating the films at 150° C. for 30 minutes, the dielectric strength was not changed.

Figure 24:
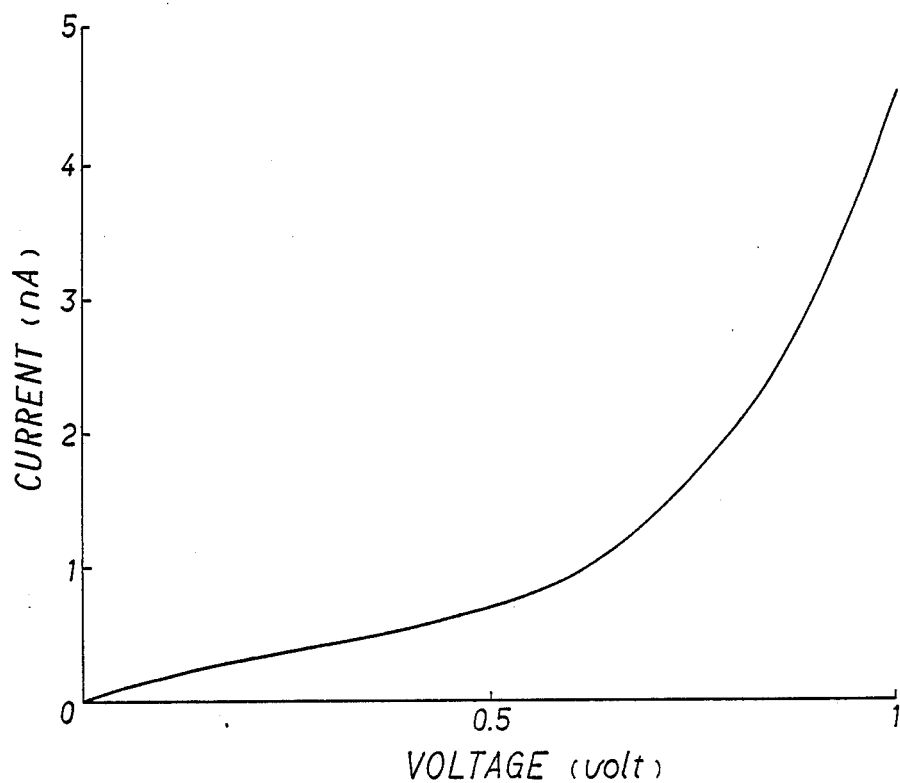

The current-voltage curve of the device having the heat resistant polyimide film of about 100 Å in thick are shown in FIGS. 24 and 25. As shown in FIGS. 24 and 25, it was obvious that the Ohmic conductance was shown until the electric field is $0.5 \times 10^6$ V/cm and the conductance according to In I $\propto$ V$^{\frac{1}{2}}$ was shown over the above range. Also, as shown in FIG. 25, the thin film having the thickness of about 100 Å can withstand 10 V, that is, the electric field of $1 \times 10^7$ V/cm.

Accordingly, the thin film of the present invention can used as the insulating film in various electric and electronic elements.

EXAMPLE 10

There was formed ZnS(Mn) layers on a patterned ITO glass having a sheet resistance of 15Ω/□ and a visible light transmittance of about 80%, using ZnS having 0.7% of Mn as a target, according to electron beam deposition under the conditions of about $1 \times 10^{-6}$ torr in pressure, about 170° C. in a substrate temperature and about 10 Å/sec in film forming speed. The obtained ZnS(Mn) thin film had a thickness of 0.1 μm and was a polycrystalline film having a preferential orientation of (111) direction. The thin film was treated in nitrogen stream at 600° C. for 1 hour.

Then, the built-up film of 21 layers were formed on the above film by using a mixture of the polymer obtained in Example 6 and stearyl alcohol in a molar ratio of 1:1 in the same conditions as in Example 9. A Y-type film was formed on ZnS(Mn) layer in a nearly ideal state. After drying overnight, the sample was heated in nitrogen stream at 400° C. for 1 hour to convert the polymer into polyimide and aluminum electrode was formed by deposition on the surface of the obtained polyimide film so as to cross at a right angle with respect to the ITO electrode to give an EL device of MIS structure.

Figure 26:
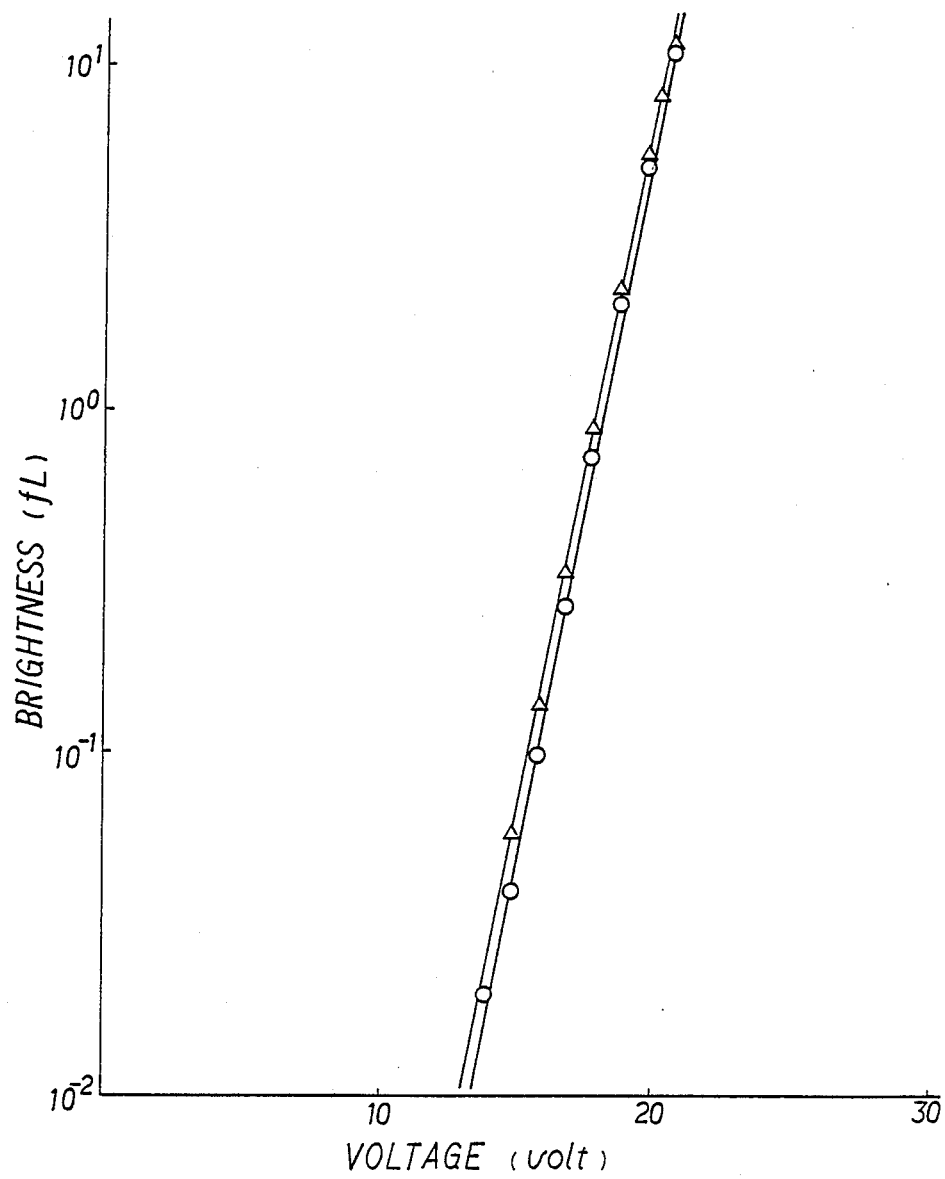
FIG. 26 is a graph showing the relationships between the brightness and voltage of the d.c. driven EL device having the MIS structure obtained in Example 10 described after.

The brightness-voltage curve as to two devices were plotted in case of applying direct current voltage (d.c. voltage) to ITO at plus and aluminum at minus. The results of the two typical devices are shown in FIG. 26. When the threshold voltage was 13 V and the maximum brightness was 11 fL (at 21 V), with emission of a yellowish orange light. Also, even if the device was heated at 150° C. for 30 minutes, the initial performance was not changed.

On the other hand, dielectric breakdown occured at 9 V in an MS structure device having no polyimide thin film, and no emission was observed. The reason why the high brightness can be obtained at low voltage in the device of the invention is not made clear, but would be considered that (1) hot electron is injected into ZnS(Mn) due to electric field of the insulation film, (2) the dielectric breakdown strength of the device can be improved due to the presence of the insulation film having high dielectric breakdown strength, and (3) reduction in interfacial states between ZnS-Mn and aluminum and the like.

As described above, it was obvious that the heat resistance polyimide thin film of the invention was effectively used as an insulation film in MIS structure device.

EXAMPLE 11

Built-up films of 11, 21, 31, 41 and 51 layers were formed on glass substrates treated with 1% solution of the silane coupling agent A-1100, on which aluminum was deposited to form an electrode, in the same manner as in Example 9. After drying overnight, the films were treated in nitrogen stream at 400° C. for 1 hour to convert the polymer into polyimide.

Then, 5 samples of each film were heat treated in nitrogen stream for 1 hour at 200° C., 250° C., 300° C., 350° C. and 400° C., respectively. Al/heat resistant polyimide thin film heat treated/Al devices were produced by depositing an aluminum on the heat treated films to form an electrode.

The dielectric properties and insulation properties such as specific resistivity and dielectric breakdown strength of the above device having the heat treated thin film were similar to those of the device having the thin film which was not heat treated, and accordingly, it was obvious that the heat resistant thin film of the invention had a heat resistance of more than 400° C.

EXAMPLE 12

In 12 ml of hexamethylphosphoramide dried was dissolved 2.47 g of distearyl pyromellitate obtained in the same manner as in Example 6, and 0.744 g of thionyl chloride was added dropwise to the resulting solution while cooling the reaction system at 0° to 5° C. The reaction mixture was added dropwise with stirring to an aqueous solution which was beforehand prepared from 0.358 g of resorcinol and 0.26 g of sodium hydroxide at room temperature. The precipitate was separated from the reaction mixture and purified by reprecipitation to give 0.92 g of white powder.

The obtained powder was subjected to IR analysis, thermal analysis and the measurement of molecular weight by GPC.

(IR Analysis)

Figure 27:
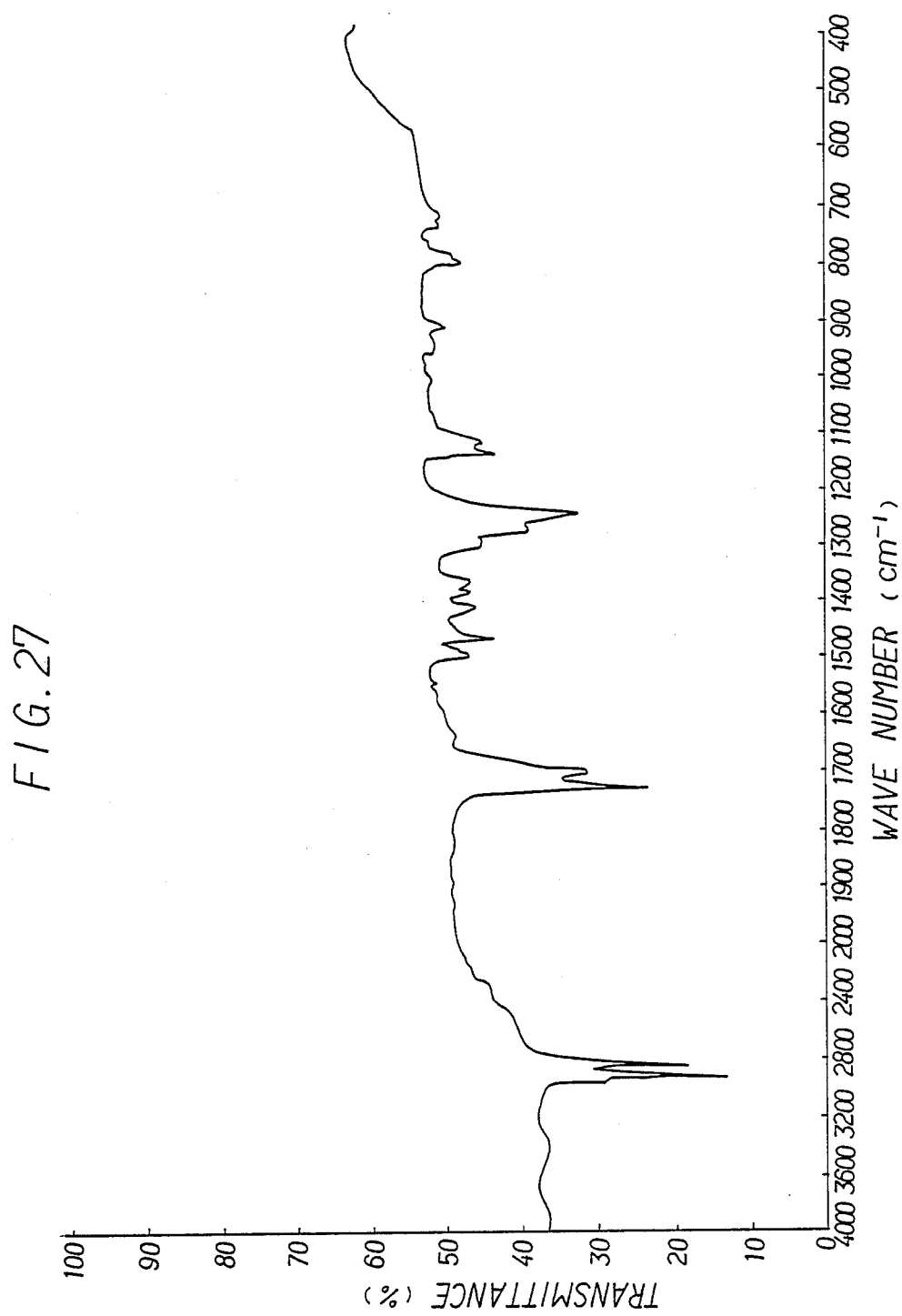
FIG. 27 is an infrared absorption spectrum of the polymer of the present invention obtained in Example 12 described after.

The IR spectrum measured in the same manner as in Example 6 is shown in FIG. 27.

Characteristic absorptions of ester and alkyl chain are observed.

(Thermal Analysis)

Figure 28:
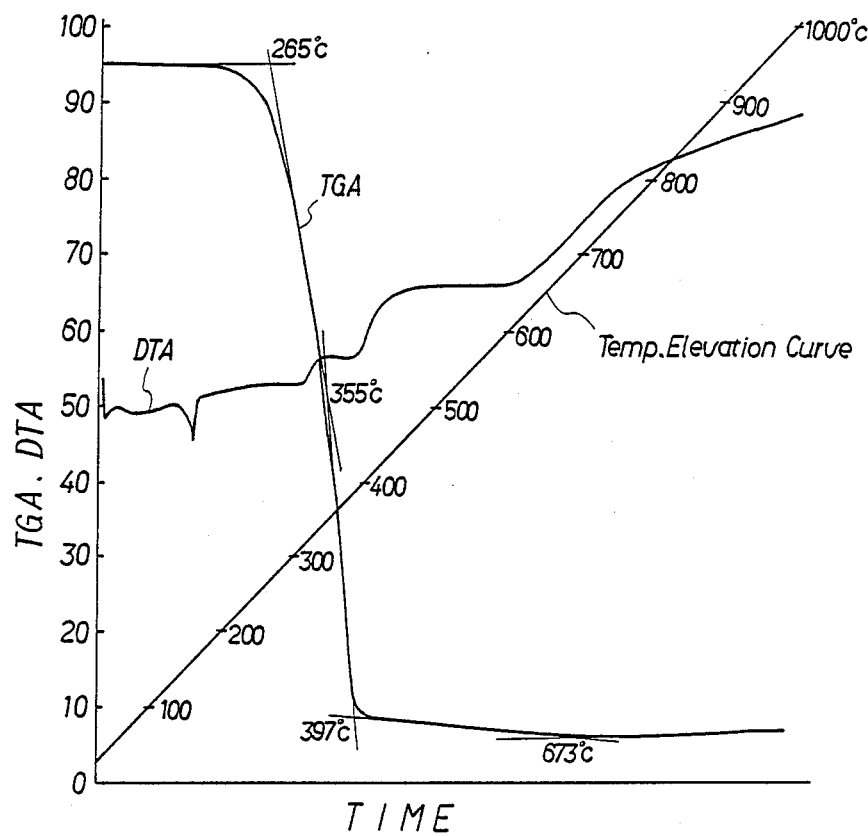
FIG. 28 is a graph showing the result of thermal analysis (TGA-DTA) of the polymer obtained in Example 12.

The analysis was conducted in the same manner as in Example 6. The results are shown in FIG. 28.

In the TGA curve, inflection points are observed at 265° C., 355° C. and 397° C., whereby it was confirmed that the thermal decomposition started suddenly at more than 265° C. but the obtained polymer was thermally stable until a temperature of about 200° C. In the DTA curve, sharp endothermic peak at 160° C. and borad exothermic peak due to thermal decomposition are observed.

(Measurement of Molecular Weight by GPC)

The number average molecular weight measured in the same manner as in Example 6 was about 7,000 (calculated in terms of polystyrene).

EXAMPLE 13

In a chloroform/dimethylacetamide mixed solvent in a volume ratio of 19/1 was dissolved 17.3 mg of the product obtained in Example 12 to give 10 ml of a solution to be used for forming the LB film.

Figure 29:
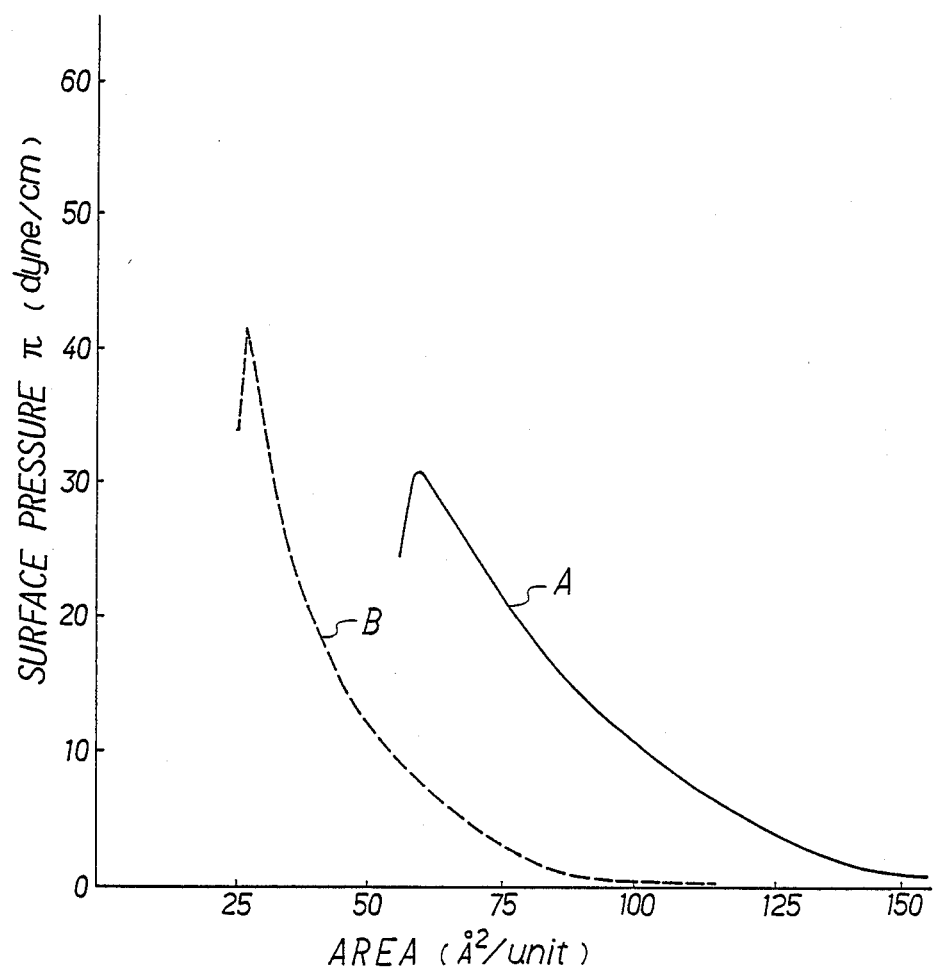
FIG. 29 is a graph showing the relationship between the surface pressure and the area per recurring unit of the polymer of the present invention obtained in Example 12 when the polymer is spread onto the surface of water according to Example 13 described after.

The obtained solution was spread onto the surface of bidistilled water, and the relationship between the surface pressure and the area per recurring unit was measured at 22° C. The result is shown in FIG. 29 (as the curve A). As shown in FIG. 29, the curve A is expansive and the film was collapsed at the surface pressure of about 30 dyne/cm. When a built-up film was formed on a substrate under conditions of 20 dyne/cm in surface pressure and 10 mm/minute in a dipping speed, the built-up film could be formed only when the substrate was being taken out.

On the other hand, as to a mixture of the product obtained in Example 12 and stearyl alcohol, the relationship between the surface pressure and the area per recurring unit was measured. The result is shown in FIG. 29 (as the curve of B). As shown in FIG. 29, the surface pressure suddenly increased in the curve B. From the area-time curve, it was confirmed that a Y-type film could be formed on the glass substrate by mixing stearyl alcohol with the polymer in a molar ratio of 1/1.

EXAMPLES 14 TO 22

Polymers were prepared by reacting a compound of group A with a compound of group B shown in the following Table 1 in the same manner as in Example 1, 6 or 12.

TABLE 1

| Ex. No. | Group A | Group B |
|---|---|---|
| Ex. 14 | isophthaloyl chloride (1,3-benzenedicarbonyl dichloride) | $R^3$—NH—C$_6$H$_4$—NHR$^3$ (para) |
| Ex. 15 | terephthaloyl chloride (1,4-benzenedicarbonyl dichloride) | $R^3$—NH—C$_6$H$_4$—NHR$^3$ (para) |
| Ex. 16 | benzene substituted with two ClC(O)— and one —C(O)OR$^3$ | $NH_2$—C$_6$H$_4$—$NH_2$ |
| Ex. 17 | benzene substituted with two ClC(O)— and one —C(O)OR$^3$ | $NH_2$—C$_6$H$_4$—O—C$_6$H$_4$—$NH_2$ |
| Ex. 18 | benzene-1,2,4,5-tetrasubstituted with two ClC(O)— and two —C(O)OR$^3$ | $NHR^3$—C$_6$H$_4$—$NHR^3$ |
| Ex. 19 | benzene-1,2,4,5-tetrasubstituted with two ClC(O)— and two —C(O)OR$^3$ | 3,3',4,4'-tetraaminobiphenyl |

TABLE 1-continued

| Ex. No. | Group A | Group B |
|---|---|---|
| Ex. 20 | 1,2-bis(chlorocarbonyl)-4,5-bis(R³OC(O))benzene | 2,5-diamino-benzamide |
| Ex. 21 | 1,2-bis(chlorocarbonyl)-4,5-bis(R³OC(O))benzene | 4,4'-oxydianiline and 2,5-diamino-benzamide |
| Ex. 22 | 2-chlorocarbonyl-4-chlorocarbonyl-benzoate (R³O ester) | 2,5-diamino-benzamide |

(Note)
R³: CH₃(CH₂)₁₇

The obtained polymers had structures shown in Table 2.

TABLE 2

Ex. 14: poly(m-phenylene-carbonyl–N(R³)–p-phenylene–N(R³)–)

Ex. 15: poly(p-phenylene-carbonyl–N(R³)–p-phenylene–N(R³)–)

Ex. 16: poly[(4,5-bis(COR³))-1,2-phenylene-dicarbonyl–NH–p-phenylene–NH–]

Ex. 17: poly[(4,5-bis(COR³))-1,2-phenylene-dicarbonyl–NH–p-phenylene–O–p-phenylene–NH–]

TABLE 2-continued

Ex. 18
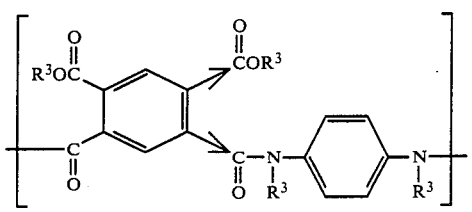

Ex. 19
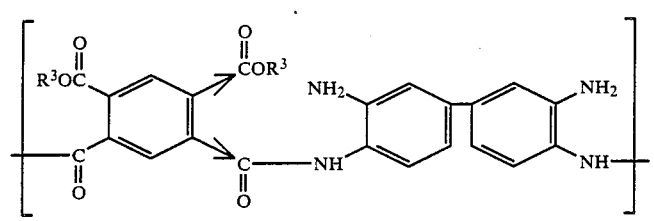

Ex. 20
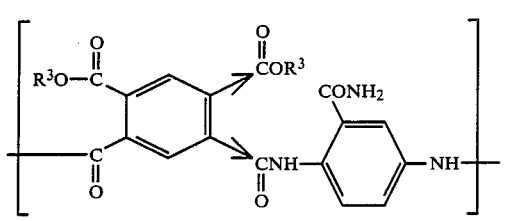

Ex. 21
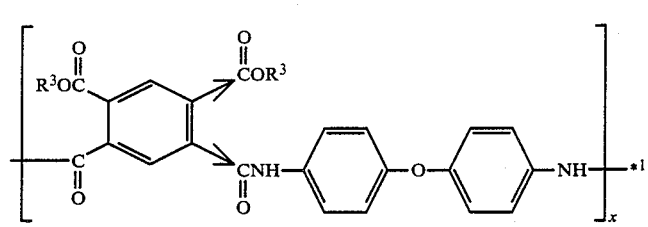

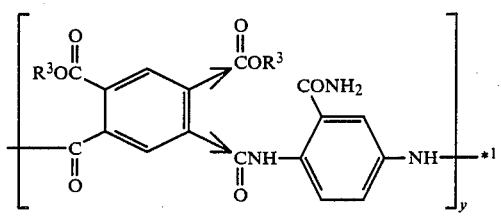

Ex. 22
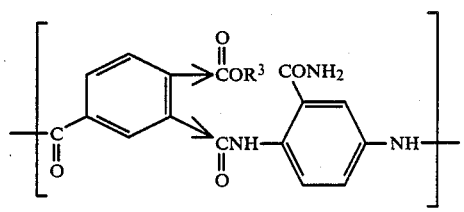

(Notes)
*1: $0 < x < 1, 0 < y < 1,$ and $x + y = 1$
$R^3$: $CH_3(CH_2)_{17}$

The identification of the obtained polymers were carried out according to IR spectrum analysis and $^1$H-NMR analysis. Also, the polymers had the same results of the thermal analysis and the measurement of molecular weight by GPC as those of the polylmers obtained in Example 1, 6 or 12. Particularly, it was confirmed that in each of the polymers obtained in Examples 16 to 22, the ring-closure and the elimination of stearyl alcohol (in case of the polymer obtained in Example 18, distearyl ether probably was eliminated) occured by heating the polymer at 300° to 400° C. to form the heat resistant ring structure. Further, it was confirmed that a stable monolayer could be formed on the surface of water from each of the polymers obtained in Examples 14 to 22 and the film could be transferred to a substrate according to LB method in the same manner as in Example 2, 7 or 13.

According to the present invention, the polymers modified so as to form films according to the LB method provide further stable films on the surface of water, and good built-up films are formed on substrates. Also, by heating the films to ring-close partially or completely and to eliminate the known LB compound from the films, there can be obtained the ultrathin films having good heat resistance, chemical resistance and mechanical properties, and having a thickness of not more than 10,000 Å, and if desired, a thickness of 10 to 1000 Å, which is hard to prepare usually.

Further, various devices utilizing the thin films of the present invention can be prepared. Particularly, the thin films having a thickness of not more than 1000 Å and good insulation properties are important as the insulation film for electric and electronic elements, that is, the thin films of the invention have effects that the driving voltage of the device is lowered and that the dielectric breakdown strength of the device is improved. Particularly, from the thin films of the present invention, there can be prepared devices utilizing the unique effects such as hot electrons produced in insulation films having high electric field and the tunnelling effect.

EXAMPLES 23 TO 25

A built-up film of 61 layers was formed on an aluminum deposited substrate according to LB method by using a mixture of the polymer obtained in Example 17 and stearyl alcohol in a molar ratio of 1:1 (Example 23), a mixture of the polymer obtained in Example 19 and stearyl alcohol in a molar ratio of 1:1 (Example 24), or the polymer obtained in Example 20. The obtained films were good Y-types and good built-up films with a deposition ratio of about 1.

Figure 30:
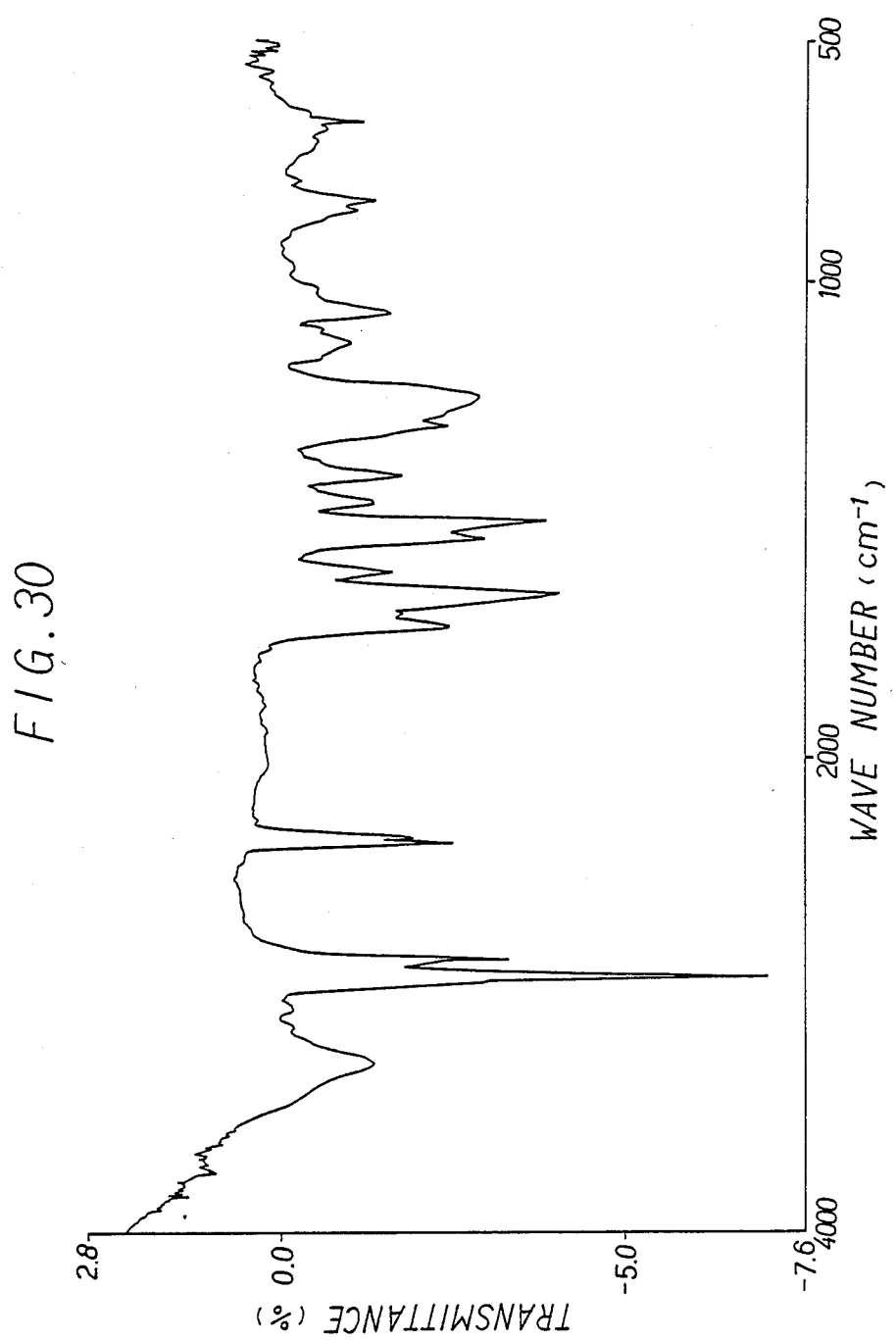
FIG. 30 and FIG. 33 are FT-IR spectra of the built-up film and the built-up film treated with heat obtained in Example 23 described after.
Figure 31:
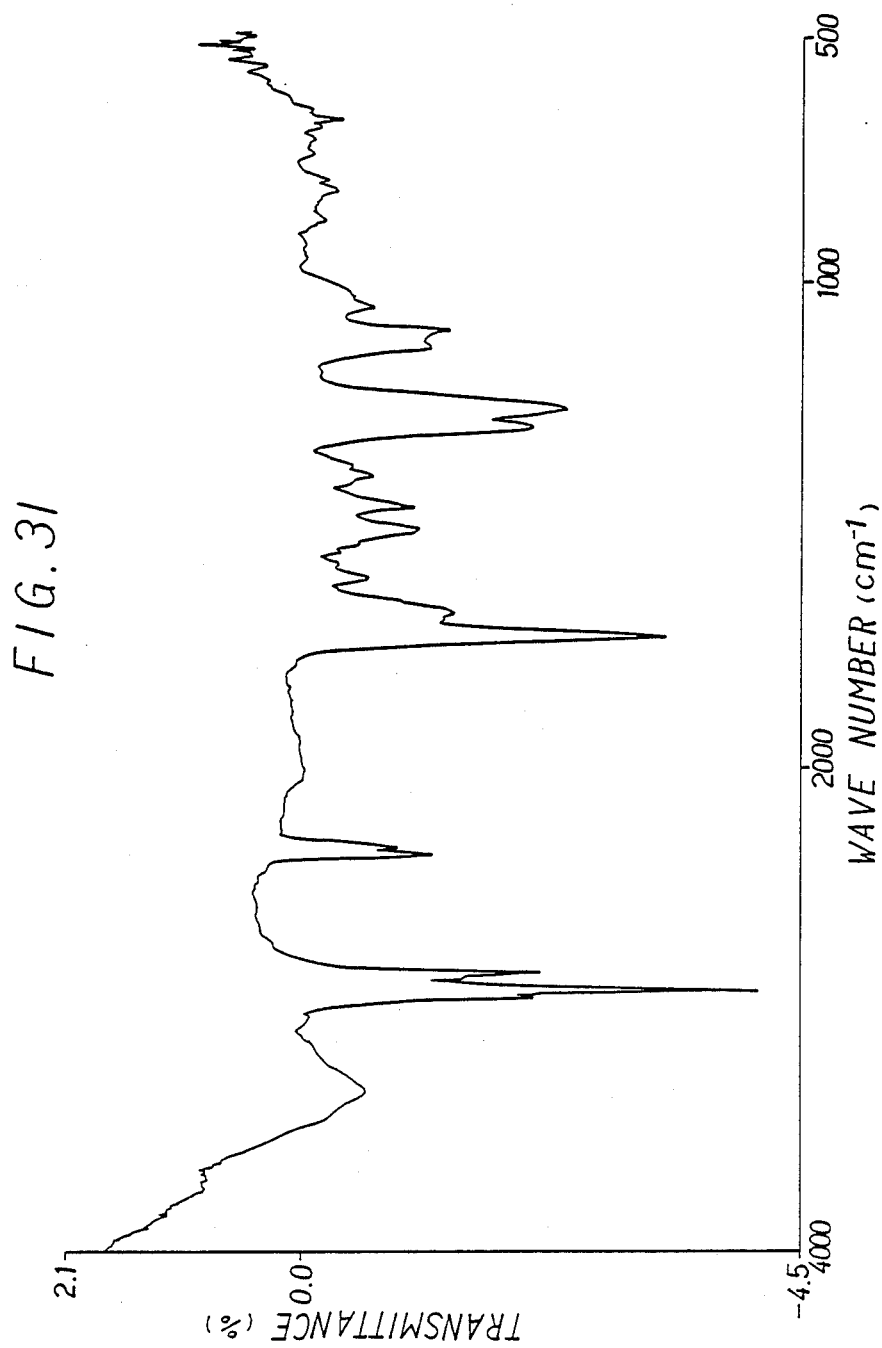
FIG. 31 and FIG. 34 are FT-IR spectra of the built-up film and the built-up film treated with heat obtained in Example 24 described after.
Figure 32:
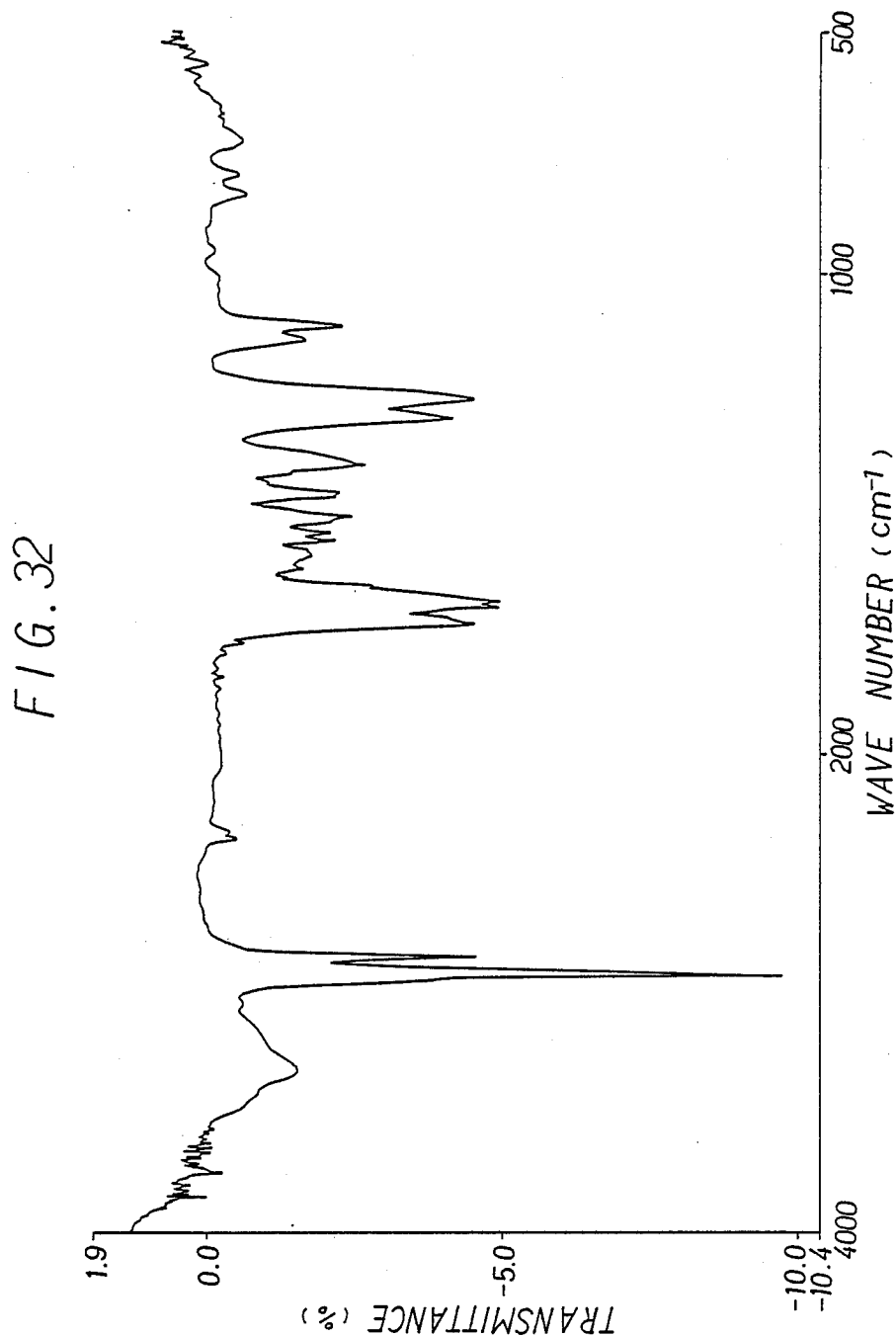
FIG. 32 and FIG. 35 are FT-IR spectra of the built-up film and the built-up film treated with heat obtained in Example 25 described after.

FT-IR spectrum of each of the obtained built-up films is shown in FIG. 30 (Example 23), FIG. 31 (Example 24) or FIG. 32 (Example 25), and the same characteristic absorption as the polymer obtained in Example 17, 19 or 20 is observed.

Figure 33:
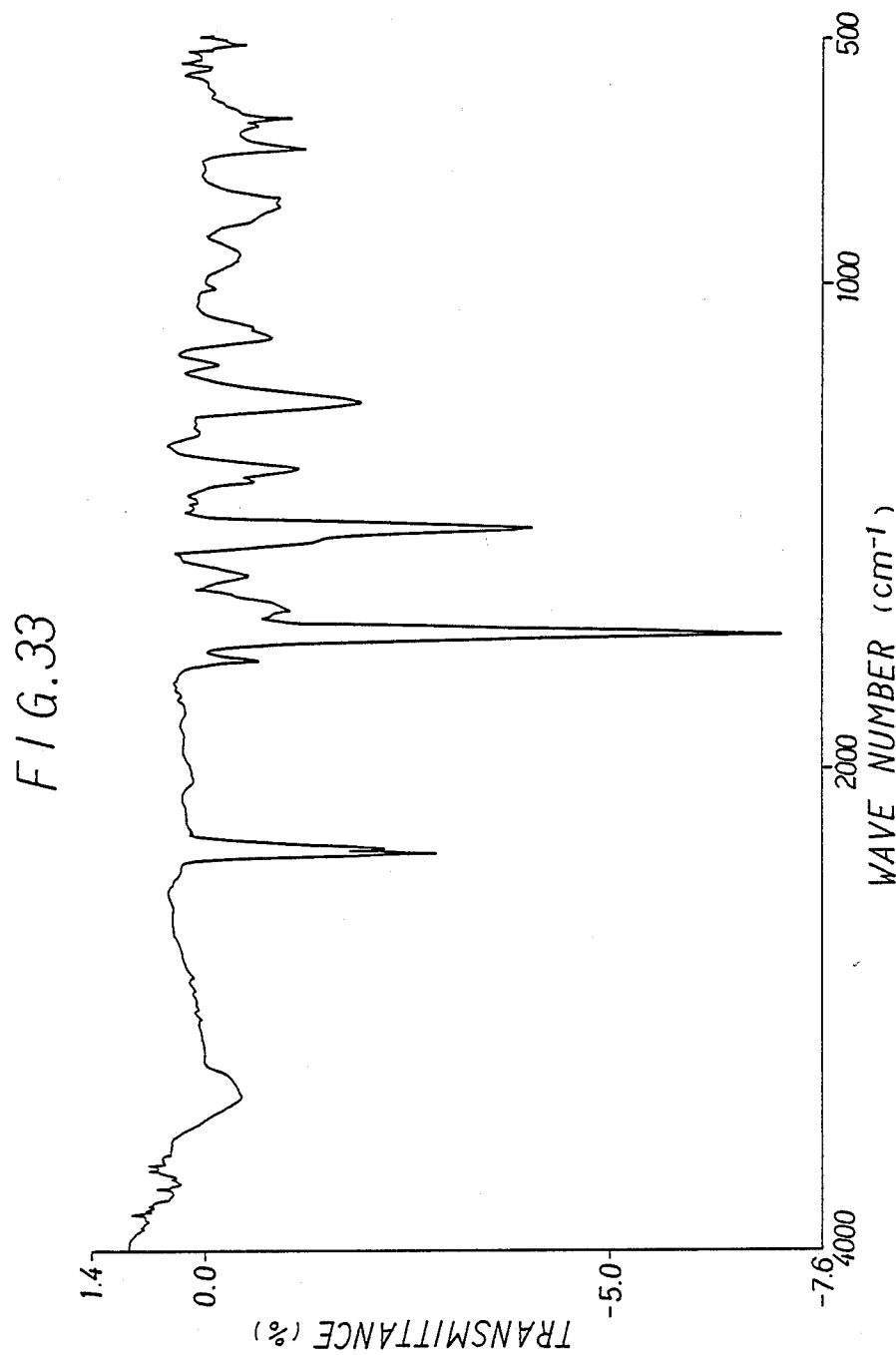

The built-up film was heated at 300° C. (Example 23), at 450° C. (Example 24) or at 400° C. (Example 25) in a nitrogen stream for 1 hour, and subjected to FT-IR analysis. The spectra are shown in FIGS. 33 (Example 23), 34 (Example 24) and 35 (Example 25), respectively.

From these spectra, it was confirmed that a ring-closure was proceeded by heating and heat resistant thin films having following structures were obtained.

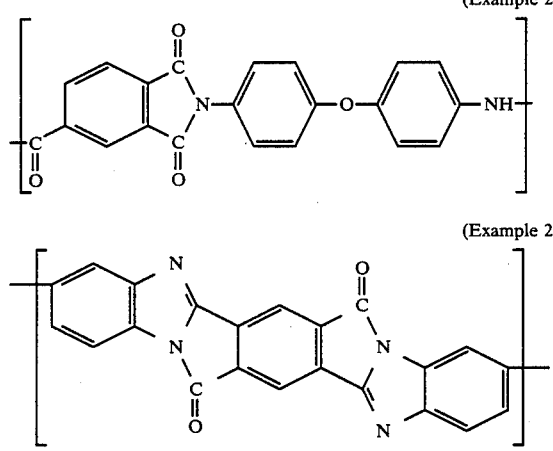

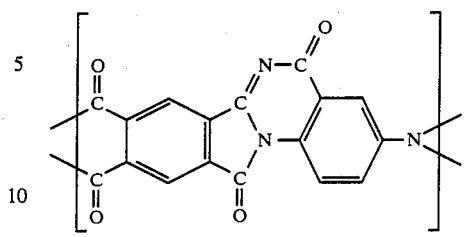

EXAMPLE 26

A polyamide acid was prepared by reacting a compound A with a compound B shown below.

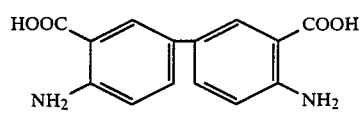

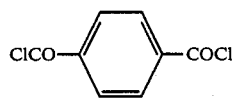

The obtained polyamide acid was converted into a lithium salt with lithium acetate and then was esterified with stearyl bromide. The structure of the obtained polymer was as follows:

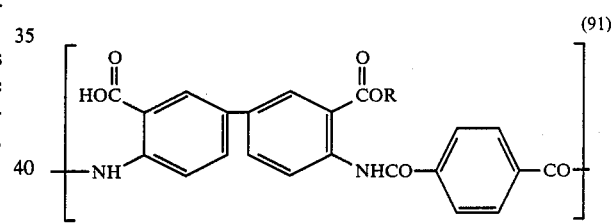

$R = CH_3(CH_2)_{17}-$

The identification of the polymer was carried out by means of IR spectrum analysis, elemental analysis and thermal analysis.

Also, it was confirmed that the polymer was converted into a polymer having a heat resistant ring structure (polybenzoxadinone) shown below by heating to 300° C. to 400° C. to ring-close.

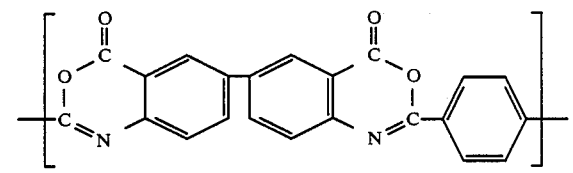

A Y-type built-up film was formed by using a mixture of the obtained polymer (91) and stearyl alcohol in a molar ratio of 1:2 according to LB method. From FT-IR spectrum analysis, it was confirmed that a polybenzoxazinone thin film was formed by heating the built-up film.

EXAMPLE 27

Figure 36A:
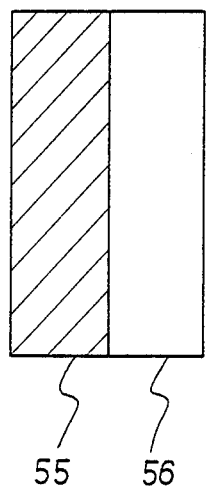
FIG. 36a and FIG. 36b are schematic illustrations of devices obtained in Example 27 described after.
Figure 36B:
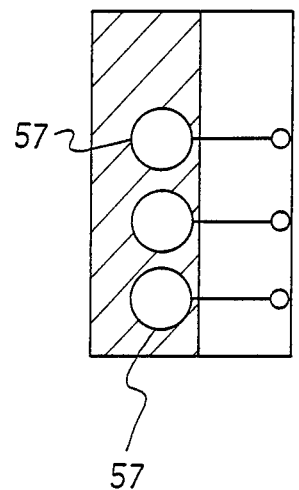
Figure 37:
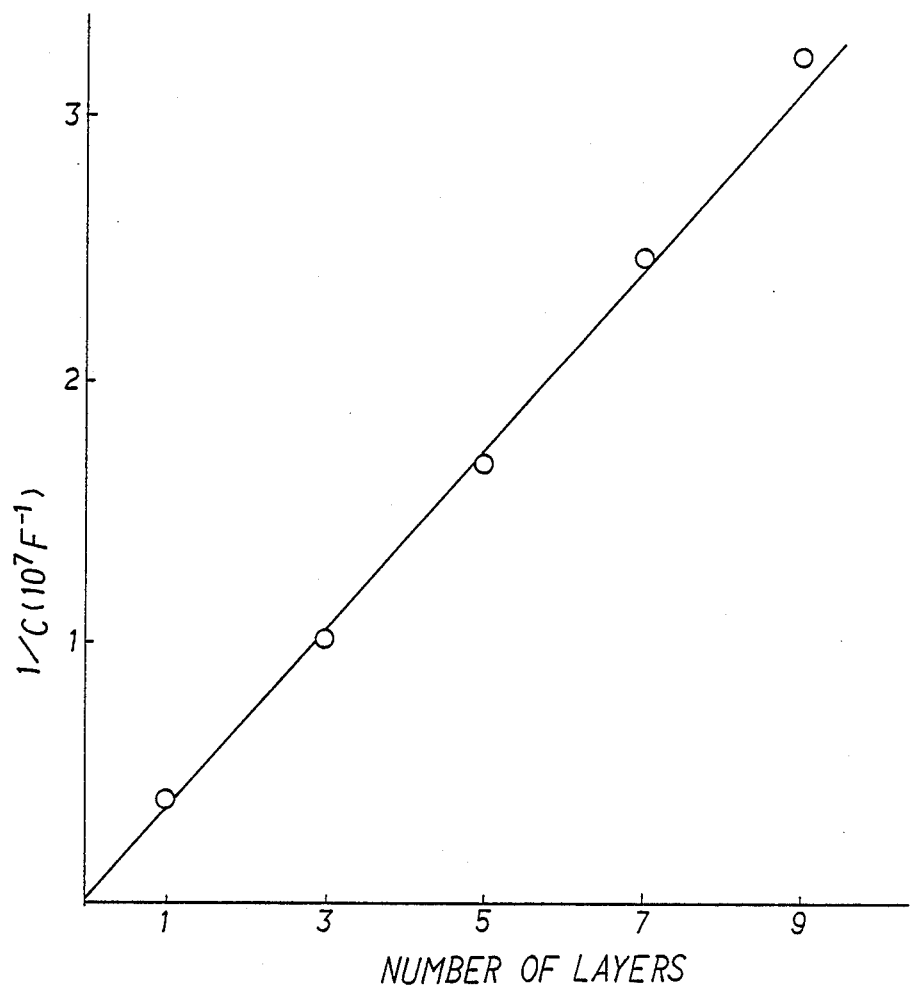
FIG. 37 is a graph showing the relationship between the inverse capacitance of the built-up film obtained in Example 27 and the number of layers in the built-up film.

Using a mixture of the polymer obtained in Example 17 and stearyl alcohol in a molar ratio of 1:1, built-up films of 1, 3, 5, 7 and 9 layers were formed on a glass substrate treated with a 2% solution of silane coupling agent A-1100, on which an aluminum was deposited as shown in FIG. 36a wherein 55 shows aluminum and 56 shows the glass substrate. After drying overnight, aluminium was deposited on the films to form an electrode having a width of 5 mm and an MIM device shown in FIG. 36b wherein 57 shows an upper electrode was obtained. The capacitance was measured at room temperature and at a frequency of 120 Hz. The inverse capacitance values were plotted with respect to the number of layers. The result is shown in FIG. 37. It shows a good linear relationship.

Figure 38:
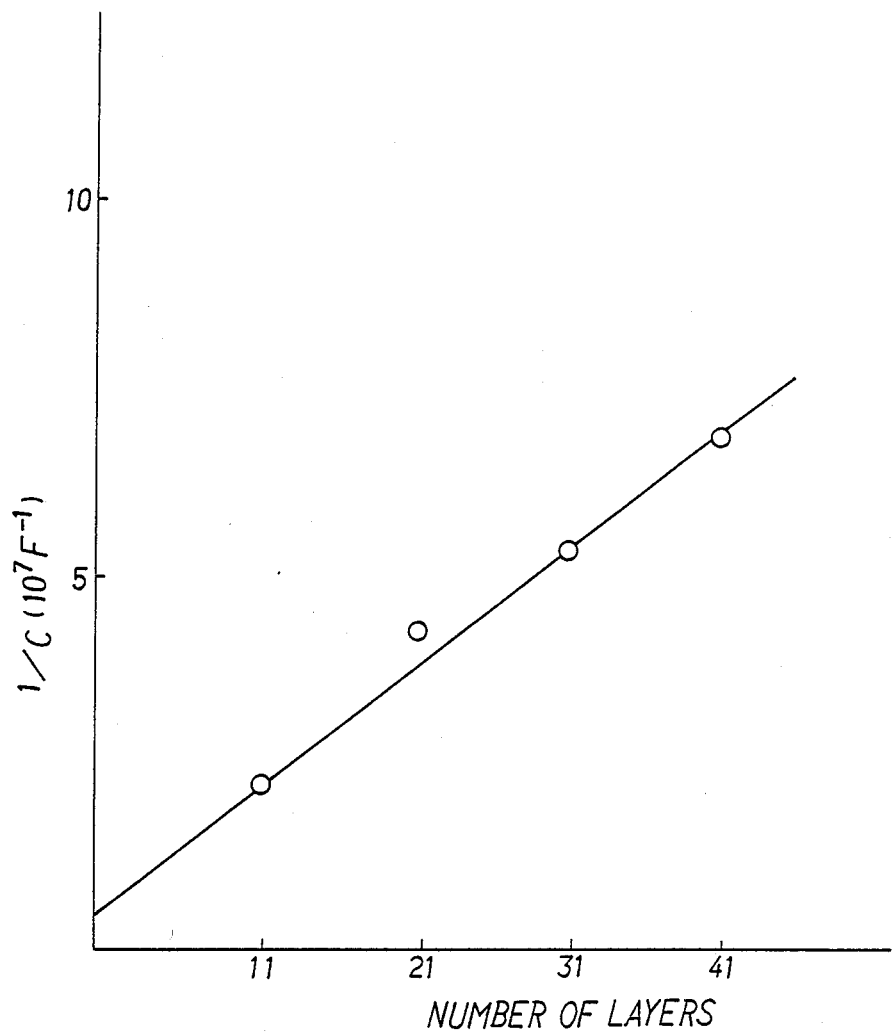
FIG. 38 is a graph showing the relationship between the inverse capacitance of the polyamide-imide film obtained in Example 27 and the number of layers in the film.

Further, built-up films of 11, 21, 31 and 41 layers were formed and the obtained films were heated in a nitrogen stream at 300° C. for 1 hour, on which aluminium was deposited to give Al/heat resistant polyamideimide/Al devices. The thicknesses of the respective heat resistant polyamide-imide films were about 50, 100, 150 and 200 angstroms. The capacitance was measured at room temperature and at a frequency of 120 Hz. The inverse capacitance values were plotted with respect to the number of layers. The result is shown in FIG. 38. It shows a good linear relationship and suggests that monomolecular layer capacitance exists even after the heat treatment.

Also, there were applied electric fields of $1 \times 10^6$ V/cm and $5 \times 10^6$ V/cm to the devices having various thickness, but no dielectric breakdown occurred. The results reveal that the polyamide imide films had dielectric strengths of not less than $1 \times 10^6$ V/cm.

On the other hand, the thin film prepared from the above mixture was heated in a nitrogen stream at 300° C. for 1 hour and was further heated in a nitrogen stream at 300° C. for 1 hour, on which aluminum was deposited on the film to form an electrode to give an Al/heat-treated heat resistant polyamide-imide thin film/Al device. The dielectric property and the insulation property of the device having the heat treated film were similar to those of the device having the thin film which was not heat treated, and accordingly, it was obvious that the heat resistant polyamide imide thin film had a heat resistance of more than 300° C.

EXAMPLE 28

Figure 39:
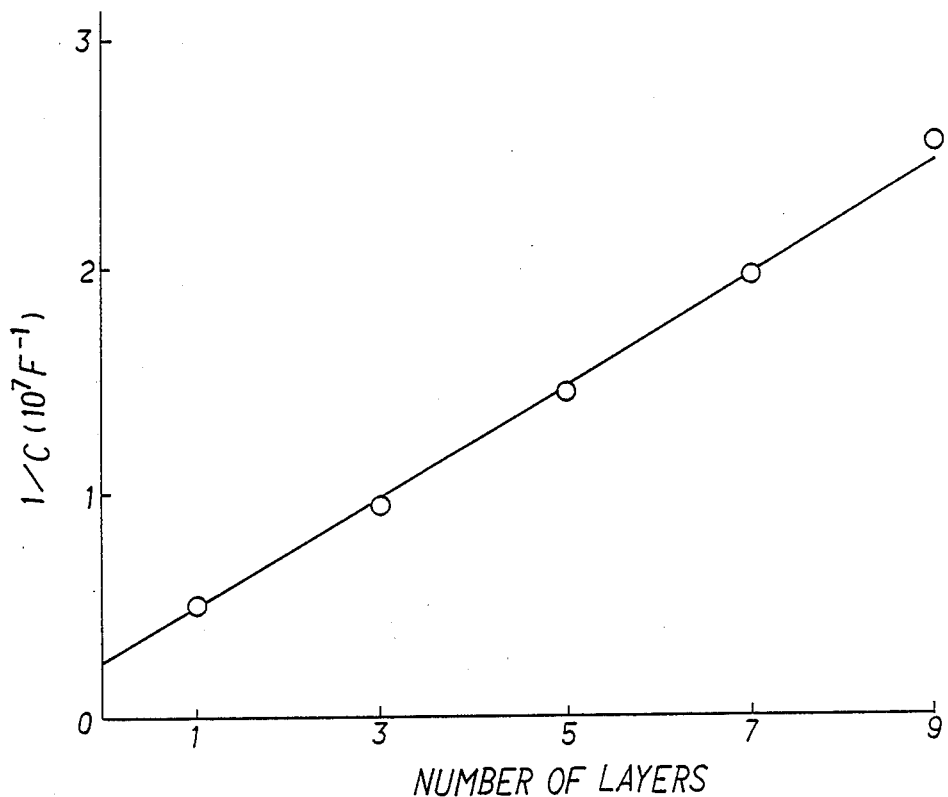
FIG. 39 is a graph showing the relationship between the inverse capacitance of the built-up film obtained in Example 28 and the number of layers in the built-up film.

MIM devices were prepared in the same manner as in Example 27 except that a mixture of the polymer obtained in EXAMPLE 20 and stearyl alcohol was used instead of the mixture of the polymer obtained in Example 17 and stearyl alcohol. The capacitance was measured at room temperature and at a fraquency of 120 Hz. The inverse capacitance values were plotted with respect to the number of layers. The result is shown in FIG. 39. It shows a good linear relationship.

Figure 40:
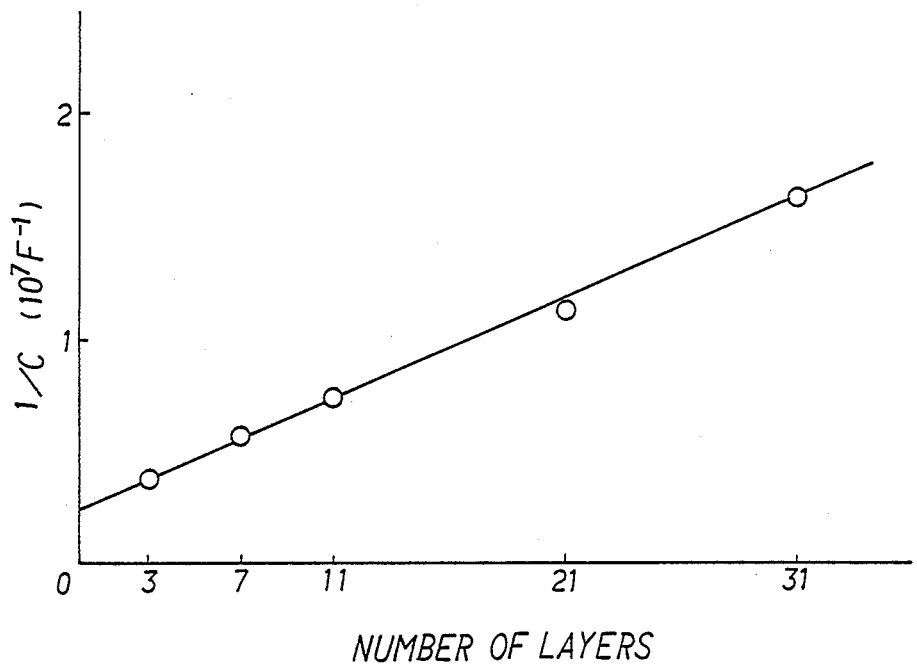
FIG. 40 is a graph showing the relationship between the inverse capacitance of the polyimideisoindroquinazolinedione film obtained in Example 28.

Further, built-up films of 3, 7, 11, 21 and 31 layers were formed and the obtained layers were heated in a nitrogen stream at 450° C. for 1 hour, on which aluminium was deposited to give an Al/heat resistant polyimideisoindroquinazolinedione/Al devices. The thickness of the respective heat resistant films were about 10, 23, 36, 70 and 100 angstroms. The capacitance was measured at room temperature and at a frequency of 120 Hz. The inverse capacitance values were plotted with respect to the number of layers. The result is shown in FIG. 40. It shows a good linear relationship and suggests that monomolecular layer capacitance exists even after the heat treatment.

Also, there were applied electric fields of $1 \times 10^6$ V/cm and $5 \times 10^6$ V/cm to the devices having various thickness, but no dielectric breakdown occurred. The results reveal that the films have dielectric strengths of not less than $1 \times 10^6$ V/cm.

On the other hand, a thin film prepared from the above mixture was heated in a nitrogen stream at 500° C. for 1 hour and was further heated at 500° C. for 1 hour, on which aluminum was deposited to give an Al/heat treated heat resistant polyimide-isoindroquinazolinedione thin film/Al device. The dielectric property and the insulation property of the device having the heat treated thin film were similar to those of the device having the thin film which was not heat treated, and accordingly, it was obvious that the heat resistant polyimideisoindroquinazolinedione thin film had a heat resistance of more than 500° C.

What we claim is:

1. A thin film which is prepared by forming a thin film from a precursor by a Langmuir-Blodgett method wherein a monolayer of the precursor is formed by spreading a solution of the precursor on the surface of a non-solvent liquid and compressing the formed monolayer at a constant surface pressure, and converting the obtained film of said precursor into a polymer having a hetero atom-containing 5-membered or 6-membered ring, said precursor having as a basic skeleton linear recurring units of a formula selected from the group consisting of formula (1), formula (2) and formula (3):

$$+A-R^{1'}-AB-R^2-B+ \quad (1)$$

$$+A-R^{1'}-BA-R^2-B+ \quad (2)$$

$$+B-R^{1'}-BA-R^2-A+ \quad (3)$$

wherein $R^{1'}$ is an organic group having a valence of at least 3 and having at least 2 carbon atoms, $R^2$ is an organic group having a valence of at least 2 and having at least 2 carbon atoms, A is an acid group having a hetero atom, B is a basic group having a hetero atom, each of AB and BA is a bivalent group produced by reacting said group A with said group B; each linear recurring unit having at least one hydrocarbon-containing group $R^3$ bonded by covalent bonding to the linear recurring unit, wherein $R^3$ has 12 to 30 carbon atoms, and each linear recurring unit has a precursor structure capable of forming a 5-membered ring having a hetero atom or a 6-membered ring having a hetero atom.

2. The thin film of claim 1, which has a thickness of not more than 1000 Å and has a dielectric strength of not less than $1 \times 10^6$ V/cm.

3. The thin film of claim 1, which has a heat resistance of not less than 300° C.

4. The thin film of claim 1, wherein said polymer is a member selected from the group consisting of polyamide-imide, polyimideisoindroquinazolinedione, polyimidazopyrolone and polyoxadinone.

5. A thin film which is prepared from a polymer having as a basic skeleton linear recurring units of a formula selected from the group consisting of formula (1), formula (2) and formula (3):

$$+A-R^1-AB-R^2-B+ \quad (1)$$

$$+A-R^1-BA-R^2-B+ \quad (2)$$

$$\{B-R^1-BA-R^2-A\} \quad (3)$$

wherein $R^1$ is an organic group having a valence of at least 2 and having at least 2 carbon atoms, $R^2$ is an organic group having a valence of at least 2 and having at least 2 carbon atoms, A is an acid group having a hetero atom, B is a basic group having a hetero atom, and each of AB and BA is a bivalent group produced by reacting said group A with said group B; each linear recurring unit having at least one hydrocarbon-containing group $R^3$ bonded by covalent bonding to the linear recurring unit, wherein $R^3$ has 12 to 30 carbon atoms, said thin film being prepared from said polymer by a Langmuir-Blodgett technique wherein a monolayer of the polymer is formed by spreading a solution of the polymer on the surface of a non-solvent liquid and compressing the formed monolayer at a constant surface pressure.

6. The thin film of claim 5, wherein said group $R^3$ has a substituent.

7. The thin film of claim 5, wherein each of said recurring units has two said group $R^3$.

8. The thin film of claim 5, wherein at least one said group $R^1$ and said group $R^2$ is a group characterized by benzenoid unsaturation having at least 6 carbon atoms.

9. The thin film of claim 5, wherein said group $R^3$ is a member selected from the group consisting of an aliphatic group, a group wherein an alicyclic group is combined with an aliphatic group, a group wherein an aromatic group is combined with an aliphatic group and substituted groups thereof.

10. The thin film of claim 5, wherein said group $R^3$ has 16 to 22 carbon atoms.

11. The thin film of claim 5, wherein each of said recurring units has a precursor structure capable of forming a 5-membered ring having a hetero atom or a 6-membered ring having a hetero atom.

12. The thin film of claim 11, wherein said precursor structure is converted into a structure having a hetero atom-containing 5-membered or 6-membered ring.

13. A thin film which is prepared from a mixture of a polymer and another substance capable of being formed into a thin film by a Langmuir-Blodgett method, wherein said polymer has as a basic skeleton linear recurring units of a formula selected from the group consisting of formula (1), formula (2) and formula (3):

$$\{A-R^1-AB-R^2-B\} \quad (1)$$

$$\{A-R^1-BA-R^2-B\} \quad (2)$$

$$\{B-R^1-BA-R^2-A\} \quad (3)$$

wherein $R^1$ is an organic group having a valence of at least 2 and having at least 2 carbon atoms, $R^2$ is an organic group having a valence of at least 2 and having at least 2 carbon atoms, A is an acid group having a hetero atom, B is a basic group having a hetero atom, and each of AB and BA is a bivalent group produced by reacting said group A with said group B; each linear recurring unit having at least one hydrocarbon-containing group $R^3$ bonded by covalent bonding to the linear recurring unit, wherein $R^3$ has 12 to 30 carbon atoms, said thin film being prepared from said mixture by said Langmuir-Blodgett method wherein a monolayer of said mixture is formed by spreading a solution of the mixture on the surface of a non-solvent liquid and compressing the formed monolayer at a constant surface pressure.

14. The thin film of claim 13, wherein said group $R^3$ has a substituent.

15. The thin film of claim 13, wherein each of said recurring units has two said group $R^3$.

16. The thin film of claim 13, wherein at least one said group $R^1$ and said group $R^2$ is a group characterized by benzenoid unsaturation having at least 6 carbon atoms.

17. The thin film of claim 13, wherein said group $R^3$ is a member selected from the group consisting of an aliphatic group, a group wherein an alicyclic group is combined with an aliphatic group, a group wherein an aromatic group is combined with an aliphatic group and substituted groups thereof.

18. The thin film of claim 13, wherein said group $R^3$ has 16 to 22 carbon atoms.

19. The thin film of claim 13, wherein said Langmuir-Blodgett compound comprises a hydrocarbon group having 16 to 22 carbon atoms and a hydrophilic group.

20. The thin film of claim 13, wherein each of said recurring units has a precursor structure capable of forming a 5-membered ring having a hetero atom or a 6-membered ring having a hetero atom.

21. The thin film of claim 20, wherein said precursor structure is converted into a structure having a hetero atom-containing 5-membered or 6-membered ring.

22. A thin film which is prepared by converting a thin film of a precursor into a polymer having a hetero atom-containing 5-membered or 6-membered ring, said precursor having as a basic skeleton linear recurring units of a formula selected from the group consisting of formula (1), formula (2) and formula (3):

$$\{A-R^{1'}-AB-R^2-B\} \quad (1)$$

$$\{A-R^{1'}-BA-R^2-B\} \quad (2)$$

$$\{B-R^{1'}-BA-R^2-A\} \quad (3)$$

wherein $R^{1'}$ is an organic group having a valence of at least 3 and having at least 2 carbon atoms, $R^2$ is an organic group having a valence of at least 2 and having at least 2 carbon atoms, A is an acid group having a hetero atom, B is a basic group having a hetero atom, each of AB and BA is a bivalent group produced by reacting said group A with said group B; each linear recurring unit having at least one hydrocarbon-containing group $R^3$ bonded by covalent bonding to the linear recurring unit, wherein $R^3$ has 12 to 30 carbon atoms, and each linear recurring unit has a precursor structure capable of forming a 5-membered ring having a hetero atom or a 6-membered ring having a hetero atom.

23. The thin film of claim 22, which has a thickness of not more than 1000 Å and having a dielectric strength of not less than $1 \times 10^6$ V/cm.

24. The thin film of claim 22, which has a heat resistance of not less than 300° C.

25. The thin film of claim 22, wherein said heat resistant polymer is a member selected from the group consisting of polyamide-imide, polyimideisoindroquinazolinedione, polyimidazopyrolone and polyoxadinone.

26. A device comprising a thin film which is prepared from a polymer having as a basic skeleton linear recurring units of a formula selected from the group consisting of formula (1), formula (2) and formula (3):

$$\text{-}\!\!\!\{A\text{—}R^1\text{—}AB\text{—}R^2\text{—}B\}\!\!\!\text{-} \quad (1)$$

$$\text{-}\!\!\!\{A\text{—}R^1\text{—}BA\text{—}R^2\text{—}B\}\!\!\!\text{-} \quad (2)$$

$$\text{-}\!\!\!\{B\text{—}R^1\text{—}BA\text{—}R^2\text{—}A\}\!\!\!\text{-} \quad (3)$$

wherein $R^1$ is an organic group having a valence of at least 2 and having at least 2 carbon atoms, $R^2$ is an organic group having a valence of at least 2 and having at least 2 carbon atoms, A is an acid group having a hetero atom, B is a basic group having a hetero atom, and each of AB and BA is a bivalent group produced by reacting said group A with said group B; each linear recurring unit having at least one hydrocarbon-containing group $R^3$ bonded by covalent bonding to the linear recurring unit, wherein $R^3$ has 12 to 30 carbon atoms, said thin film being prepared from said polymer by a Langmuir-Blodgett technique wherein a monolayer of the polymer is formed by spreading a solution of the polymer on the surface of a non-solvent liquid and compressing the formed monolayer at a constant surface pressure.

27. The device of claim 26, wherein said group $R^3$ has a substituent.

28. The device of claim 26, wherein each of said recurring units has two said group $R^3$.

29. The device of claim 26, wherein at least one said group $R_1$ and said group $R^2$ is a group characterized by a benzenoid unsaturation having at least 6 carbons atoms.

30. The device of claim 26, wherein said group $R^3$ is a member selected from the group consisting of an aliphatic group, a group wherein an alicyclic group is combined with an aliphatic group, a group wherein an aromatic group is combined with an aliphatic group and substituted groups thereof.

31. The device of claim 26, wherein said group $R^3$ has 16 to 22 carbon atoms.

32. The device of claim 26, wherein each of said recurring units has a precursor structure capable of forming a 5-membered ring having a hetero atom or a 6-membered ring having a hetero atom.

33. The device of claim 32, wherein said precursor is converted into a 5-membered ring having a hetero atom or a 6-membered ring having a hetero atom.

34. A thin film which is prepared by forming a thin film from a mixture of a precursor and another compound capable of being formed into a thin film by a Langmuir-Blodgett method wherein a monolayer of the mixture is formed by spreading a solution of the mixture on the surface of a non-solvent liquid and compressing the formed monolayer at a constant surface pressure, and converting the precursor in the obtained film of said mixture into a polymer having a hetero atom-containing 5-membered or 6-membered ring, said precursor having as a basic skeleton linear recurring units of a formula selected from the group consisting of formula (1), formula (2) and formula (3):

$$\text{-}\!\!\!\{A\text{—}R^{1'}\text{—}AB\text{—}R^2\text{—}B\}\!\!\!\text{-} \quad (1)$$

$$\text{-}\!\!\!\{A\text{—}R^{1'}\text{—}BA\text{—}R^2\text{—}B\}\!\!\!\text{-} \quad (2)$$

$$\text{-}\!\!\!\{B\text{—}R^{1'}\text{—}BA\text{—}R^2\text{—}A\}\!\!\!\text{-} \quad (3)$$

wherein $R^{1'}$ is an organic group having a valence of at least 3 and having at least 2 carbon atoms, $R^2$ is an organic group having a valence of at least 2 and having at least 2 carbon atoms, A is an acid group having a hetero atom, B is a basic group having a hetero atom, each of AB and BA is a bivalent group produced by reacting said group A with said B; each linear recurring unit having at least one hydrocarbon-containing group $R^3$ bonded by covalent bonding to the linear recurring unit, wherein $R^3$ has 12 to 30 carbon atoms, and each linear recurring unit has a precursor structure capable of forming a 5-membered ring having a hetero atom or a 6-membered ring having a hetero atom.

35. The thin film of claim 34, which has a thickness of not more than 1000 Å and has a dielectric strength of not less than $1 \times 10^6$ V/cm.

36. The thin film of claim 34, which has a heat resistance of not less than 300° C.

37. The thin film claim 34, wherein said polymer is a member selected from the group consisting of polyamide-imide, polyimide-isoindroquinazolinedione, polyimidazopyrolone and polyoxadinone.

38. A device comprising a thin film which is prepared from a mixture of a polymer and another substance capable of being formed into a thin film by a Langmuir-Blodgett method, wherein said polymer has as a basic skeleton linear recurring units of a formula selected from the group consisting of formula (1), formula (2) and formula (3):

$$\text{-}\!\!\!\{A\text{—}R^1\text{—}AB\text{—}R^2\text{—}B\}\!\!\!\text{-} \quad (1)$$

$$\text{-}\!\!\!\{A\text{—}R^1\text{—}BA\text{—}R^2\text{—}B\}\!\!\!\text{-} \quad (2)$$

$$\text{-}\!\!\!\{B\text{—}R^1\text{—}BA\text{—}R^2\text{—}A\}\!\!\!\text{-} \quad (3)$$

wherein $R^1$ is an organic group having a valence of at least 2 and having at least 2 carbon atoms, $R^2$ is an organic group having a valance of at least 2 and having at least 2 carbon atoms, A is an acid group having a hetero atom, B is a basic group having a hetero atom, and each of AB and BA is a bivalent group produced by reacting said group A with said group B; each linear recurring unit having at least one hydrocarbon-containing group $R^3$ bonded by covalent bonding to the linear recurring unit, wherein $R^3$ has 12 to 30 carbon atoms, said thin film being prepared from said mixture by said Langmuir-Blodgett method wherein a monolayer of said mixture is formed by spreading a solution of the mixture on the surface of a non-solvent liquid and compressing the formed monolayer at a constant surface pressure.

39. The device of claim 38, wherein said group $R^3$ has a substituent.

40. The device of claim 38, wherein each of said recurring units has two said group $R^3$.

41. The device of claim 38, wherein at least one said group $R^1$ and said group $R^2$ is a group characterized by a benzenoid unsaturation having at least 6 carbon atoms.

42. The device of claim 38, wherein said group $R^3$ is a member selected from the group consisting of an aliphatic group, a group wherein an alicyclic group is combined with an aliphatic group, a group wherein an aromatic group is combined with an aliphatic group and substituted groups thereof.

43. The device of claim 38, wherein said group $R^3$ has 16 to 22 carbon atoms.

44. The device of claim 38, wherein said Lanmuir-Blodgett compound comprises a hydrocarbon group having 16 to 22 carbon atoms and a hydrophilic group.

45. The device of claim 38, wherein each of said recurring units has a precursor structure capable of forming a 5-membered ring having a hetero atom or a 6-membered ring having a hetero atom.

46. The device of claim 45, wherein said precursor structure is converted into a structure having a hetero atom containing 5-membered or 6-membered ring.

47. The thin film of any one of claims 5, 13, 26 and 38, wherein said group $R^3$ is bonded to the basic skeleton of said polymer by covalent bonding by a method in which said group $R^3$ is substituted for an atom of said group AB or said group BA.

48. The thin film of any one of claims 5, 13, 26 and 38, wherein said group $R^3$ is bonded to the basic skeleton of said polymer by covalent bonding by a method in which said group $R^3$ is substituted for an atom of a substituent in said group $R^1$ and/or said group $R^2$, said substituent not being used for forming the basic skeleton of said polymer.

49. The thin film of any one of claims 5, 13, 26 and 38, wherein said group $R^3$ is bonded to the basic skeleton of said polymer by covalent bonding by a method in which said group $R^3$ is substituted for an atom of said group $R^1$ or said group $R^2$.

50. A device comprising a thin film which is prepared by converting a thin film of a precursor into a polymer having a hetero atom-containing 5-membered or 6-membered ring, said precursor having as a basic skeleton linear recurring units of a formula selected from the group consisting of formula (1), formula (2) and formula (3):

  (1)

  (2)

  (3)

wherein $R^{1'}$ is an organic group having a valence of at least 3 and having at least 2 carbon atoms, $R^2$ is an organic group having a valence of at least 2 and having at least 2 carbon atoms, A is an acid group having a hetero atom, B is a basic group having a hetero atom, each of AB and BA is a bivalent group produced by reacting said group A with said group B; each linear recurring unit having at least one hydrocarbon-containing group $R^3$ bonded by covalent bonding to the linear recurring unit, wherein $R^3$ has 12 to 30 carbon atoms, and each linear recurring unit has a precursor structure capable of forming a 5-membered ring having a hetero atom or a 6-membered ring having a hetero atom.

51. The device of claim 50, wherein said thin film has a thickness of not more than 1000 Å and has a dielectric strength of not less than $1 \times 10^6$ V/cm.

52. the device of claim 50, wherein said thin film has a heat resistance of not less than 300° C.

53. The device of claim 50, wherein said polymer is a member selected from the group consisting of polyamide-imide, polyimide-isoindroquinazolinedione, polyimidazopyrolone and polyoxadinone.

54. A device comprising a thin film which is prepared by forming a thin film from a precursor by a Langmuir-Blodgett method wherein a monolayer of the precursor is formed by spreading a solution of the precursor on the surface of a nonsolvent liquid and compressing the formed monolayer at a constant surface pressure, and converting the obtained film of said precursor into a polymer having a hetero atom-containing 5-membered or 6-membered ring, said precursor having as a basic skeleton linear recurring units of a formula selected from the group consisting of formula (1), formula (2) and formula (3):

  (1)

  (2)

  (3)

wherein $R^{1'}$ is an organic group having a valence of at least 3 and having at least 2 carbon atoms, $R^2$ is an organic group having a valence of at least 2 and having at least 2 carbon atoms, A is an acid group having a hetero atom, B is a basic group having a hetero atom, each of AB and BA is a bivalent group produced by reacting said group A with said group B; each linear recurring unit having at least one hydrocarbon-containing group $R^3$ bonded by colvalent bonding to the linear recurring unit, wherein $R^3$ has 12 to 30 carbon atoms, and each linear recurring unit has a precursor structure capable of forming a 5-membered ring having a hetero atom or a 6-membered ring having a hetero atom.

55. The device of claim 54, wherein said thin film has a thickness of not more than 1000 Å and has a dielectric strength of not less than $1 \times 10^6$ V/cm.

56. The device of claim 54, wherein said thin film has a heat resistance of not less than 300° C.

57. The device of claim 54, wherein said polymer is a member selected from the group consisting of polyamide-imide, polyimide-isoindroquinazolinedione, polyimidazopyrolone and polyoxadinone.

58. A device comprising a thin film which is prepared by forming a thin film from a mixture of a precursor and another compound capable of being formed into a thin film by a Langmuir-Blodgett method wherein a monolayer of the mixture is formed by spreading a solution of the mixture on the surface of a non-solvent liquid and compressing the formed monolayer at a constant surface pressure, and converting the precursor in the obtained film of said mixture into a polymer having a hetero atom-containing 5-membered or 6-membered ring, said precursor having as a basic skeleton linear recurring units of a formula selected from the group consisting of formula (1), formula (2) and formula (3):

  (1)

  (2)

  (3)

wherein $R^{1'}$ is an organic group having a valence of at least 3 and having at least 2 carbon atoms, $R^2$ is an organic group having a valence of at least 2 and having at least 2 carbon atoms, A is an acid group having a hetero atom, B is a basic group having a hetero atom, each of AB and BA is a bivalent group produced by reacting said group A with said group B; each linear recurring unit having at least one hydrocarbon-containing group $R^3$ bonded by covalent bonding to the linear recurring unit, wherein $R^3$ has 12 to 30 carbon atoms, and each linear recurring unit has a precursor structure capable of forming a 5-membered ring having a hetero atom or a 6-membered ring having a hetero atom.

59. The device of claim 58, wherein said thin film has a thickness of not more than 1000 Å and has a dielectric strength of not less than $1 \times 10^6$ V/cm.

60. The device of claim 58, wherein said thin film has a heat resistance of not less than 300° C.

61. The device of claim 58, wherein said polymer is a member selected from the group consisting of polyamide-imide, polyimide-isoindroquinazolinedione, polyimidazopyrolone and polyoxadinone.

62. The thin film of any one of claims 1, 5, 13, 22, 26, 34, 38, 50, 54 and 58, wherein said thin film is a monolayer film.

63. The thin film of any one of claims 1, 5, 13, 22, 26, 34, 38, 50, 54 and 58, wherein said thin film is a multilayer film.

64. A thin film of a heat resistant polymer having recurring units of a formula selected from the following formulae:

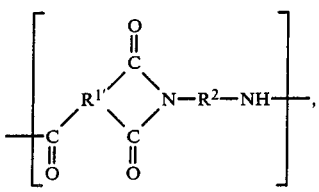

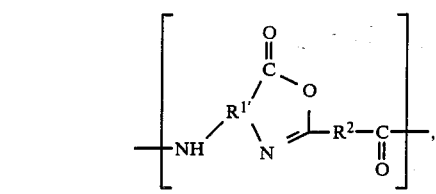

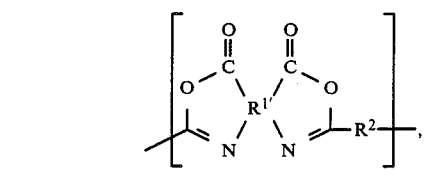

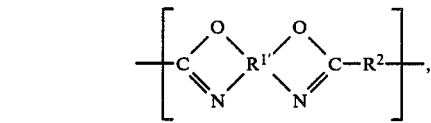

-continued

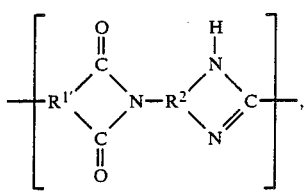

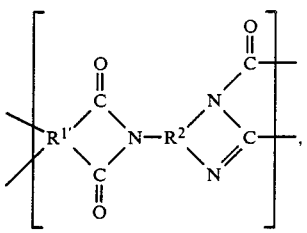

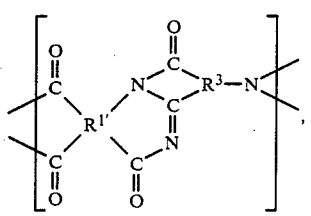

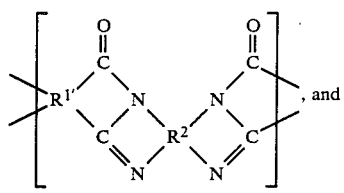, and

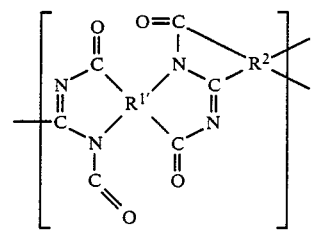, wherein $R^{1'}$ is an organic group having a valence of at least 3 and having at least 2 carbon atoms and $R^2$ is an organic group having a valence of at least 2 and having at least 2 carbon atoms.

* * * * *

UNITED STATES PATENT AND TRADEMARK OFFICE
CERTIFICATE OF CORRECTION

PATENT NO. : 4,839,219

DATED : June 13, 1989

INVENTOR(S) : UEKITA et al

It is certified that error appears in the above-identified patent and that said Letters Patent is hereby corrected as shown below:

Column 29, the formula (87') should read:

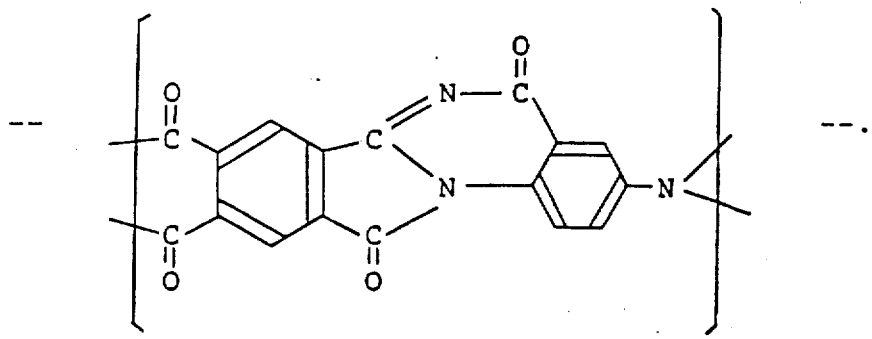

UNITED STATES PATENT AND TRADEMARK OFFICE
CERTIFICATE OF CORRECTION

PATENT NO. : 4,839,219
DATED : June 13, 1989
INVENTOR(S) : UEKITA et al

It is certified that error appears in the above-identified patent and that said Letters Patent is hereby corrected as shown below:

Column 60, lines 20 to 29, the formula should read:

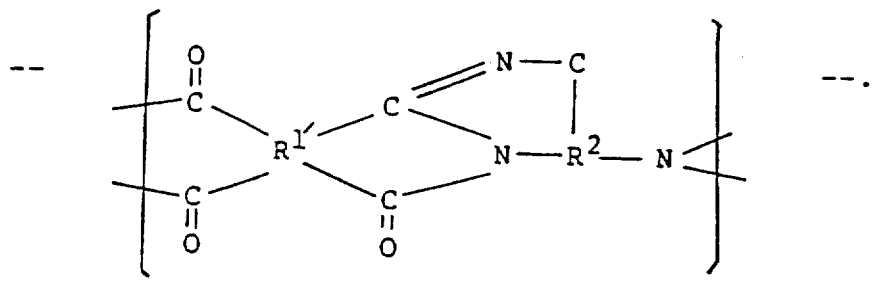

Signed and Sealed this

Twenty-fifth Day of December, 1990

Attest:

HARRY F. MANBECK, JR.

Attesting Officer

Commissioner of Patents and Trademarks